US008338700B2

(12) United States Patent
Ikeda et al.

(10) Patent No.: US 8,338,700 B2
(45) Date of Patent: Dec. 25, 2012

(54) DYE-SENSITIZED PHOTOELECTRIC CONVERSION DEVICE

(75) Inventors: Masaaki Ikeda, Tokyo (JP); Koichiro Shigaki, Tokyo (JP); Teruhisa Inoue, Tokyo (JP)

(73) Assignee: Nippon Kayaku Kabushiki Kaisha, Tokyo (JP)

( * ) Notice: Subject to any disclaimer, the term of this patent is extended or adjusted under 35 U.S.C. 154(b) by 244 days.

(21) Appl. No.: 12/908,439

(22) Filed: Oct. 20, 2010

(65) Prior Publication Data

US 2011/0030801 A1    Feb. 10, 2011

Related U.S. Application Data

(62) Division of application No. 10/482,425, filed as application No. PCT/JP02/06833 on Jul. 5, 2002, now Pat. No. 7,851,701.

(30) Foreign Application Priority Data

| Jul. 6, 2001 | (JP) | 2001-206678 |
| Jul. 10, 2001 | (JP) | 2001-208719 |
| Aug. 17, 2001 | (JP) | 2001-247963 |
| Aug. 23, 2001 | (JP) | 2001-252518 |
| Sep. 4, 2001 | (JP) | 2001-267019 |
| Oct. 4, 2001 | (JP) | 2001-308382 |

(51) Int. Cl.
*H01L 31/00* (2006.01)

(52) U.S. Cl. ............ 136/263; 136/252; 136/243; 546/2; 546/21; 546/257; 546/258; 546/272.4; 546/273.4; 546/8; 546/10; 257/40; 257/428; 257/431; 257/439; 556/136; 556/137

(58) Field of Classification Search .................. 136/263, 136/252, 243; 546/2, 21, 257, 258, 263, 546/272.4, 273.4, 8, 10; 257/40, 428, 431, 257/439; 556/136, 137

See application file for complete search history.

(56) References Cited

U.S. PATENT DOCUMENTS

| 2,803,640 | A | 8/1957 | Heckert |
| 4,927,721 | A | 5/1990 | Gratzel et al. |
| 5,084,365 | A | 1/1992 | Gratzel et al. |
| 5,670,091 | A | 9/1997 | Marder et al. |
| 6,084,176 | A | 7/2000 | Shiratsuchi et al. |
| 6,245,988 | B1 | 6/2001 | Gratzel et al. |
| 6,291,763 | B1 | 9/2001 | Nakamura |
| 6,335,481 | B1 | 1/2002 | Watanabe |
| 6,376,765 | B1 | 4/2002 | Wariishi et al. |
| 7,141,735 | B2 | 11/2006 | Ikeda et al. |
| 7,728,222 | B2 | 6/2010 | Ikeda et al. |
| 7,851,701 | B2 | 12/2010 | Ikeda et al. |
| 7,943,848 | B2 | 5/2011 | Nishimura et al. |
| 7,947,898 | B2 | 5/2011 | Itami et al. |
| 7,977,570 | B2 | 7/2011 | Shigaki et al. |
| 8,022,293 | B2 | 9/2011 | Shigaki et al. |
| 8,022,294 | B2 | 9/2011 | Shigaki et al. |
| 8,039,741 | B2 | 10/2011 | Itami et al. |
| 2002/0010969 | A1 | 1/2002 | Goettel et al. |
| 2003/0152827 | A1 | 8/2003 | Ikeda et al. |
| 2004/0074532 | A1 | 4/2004 | Ikeda et al. |
| 2004/0099306 | A1 | 5/2004 | Hara et al. |
| 2004/0187918 | A1 | 9/2004 | Ikeda et al. |
| 2006/0130249 | A1 | 6/2006 | Ikeda et al. |
| 2007/0191455 | A1 | 8/2007 | Hiyoshi et al. |
| 2008/0067476 | A1 | 3/2008 | Shigaki et al. |
| 2008/0087327 | A1 | 4/2008 | Horiuchi et al. |
| 2009/0044857 | A1 | 2/2009 | Shigaki et al. |
| 2011/0031446 | A1 | 2/2011 | Ikeda et al. |

FOREIGN PATENT DOCUMENTS

| CN | 1861740 | 11/2006 |
| EP | 0566077 A2 | 10/1993 |
| EP | 0566081 A2 | 10/1993 |
| EP | 0566082 A1 | 10/1993 |
| EP | 0692800 A2 | 1/1996 |
| EP | 0892411 A2 | 1/1999 |
| EP | 0911841 A2 | 4/1999 |
| EP | 0924724 A2 | 6/1999 |
| EP | 1075005 A2 | 2/2001 |
| EP | 1075055 A2 | 2/2001 |
| EP | 1311001 A1 | 5/2003 |
| EP | 1339129 A | 8/2003 |
| EP | 1422782 A1 | 5/2004 |
| EP | 1628356 A1 | 2/2006 |

(Continued)

OTHER PUBLICATIONS

Notice of Allowance dated Jun. 22, 2011 in co-pending U.S. Appl. No. 11/661,843.
Notice of Allowance dated Jun. 22, 2011 in co-pending U.S. Appl. No. 11/922,062.
Office Action dated Aug. 16, 2011 in co-pending U.S. Appl. No. 10/548,858.
European Search Report dated Nov. 2, 2010 in corresponding European patent application No. EP 10 17 8494.

(Continued)

*Primary Examiner* — Jonathan Johnson
*Assistant Examiner* — Golam Mowla
(74) *Attorney, Agent, or Firm* — Nields, Lemack & Frame, LLC

(57) ABSTRACT

A photoelectric conversion device using a semiconductor fine material such as a semiconductor fine particle sensitized with a dye carried thereon, characterized in that the dye is a methine type dye having a specific partial structure, for example, a methine type dye having a specific carboxyl-substituted hetero ring on one side of a methine group and an aromatic residue substituted with a dialkylamino group or an organic metal complex residue on the other side of the methine group, or a methine type dye having a carboxyl-substituted aromatic ring on one side of a methine group and a heteroaromatic ring having a dialkylamino group or an organic metal complex residue on the otherside of the methine group; and a solar cell using the photoelectric conversion element. The photoelectric conversion element exhibits a conversion efficiency comparable or superior to that of a conventionally known photoelectric conversion element sensitized with a methine type dye.

11 Claims, No Drawings

FOREIGN PATENT DOCUMENTS

| | | |
|---|---|---|
| JP | 48-3115 | 1/1973 |
| JP | 8-81222 A | 3/1996 |
| JP | 2664194 B2 | 6/1997 |
| JP | 11-67285 A | 3/1999 |
| JP | 11-158395 | 6/1999 |
| JP | 11-163378 | 6/1999 |
| JP | 11-176489 | 7/1999 |
| JP | 11-214731 A | 8/1999 |
| JP | 2000-26487 | 1/2000 |
| JP | 2000-195569 | 7/2000 |
| JP | 2000-223167 | 8/2000 |
| JP | 2000-268892 | 9/2000 |
| JP | 2000-285977 | 10/2000 |
| JP | 2000-285978 | 10/2000 |
| JP | 2001-042524 | 2/2001 |
| JP | 2001-52766 A | 2/2001 |
| JP | 2001-064529 | 3/2001 |
| JP | 2002-164089 A | 6/2002 |
| JP | 2003-59547 A | 2/2003 |
| JP | 2004-22222 A | 1/2004 |
| JP | 2004-146421 A | 5/2004 |
| JP | 2004-207224 A | 7/2004 |
| JP | 2004-227825 A | 8/2004 |
| JP | 2005-5026 A | 1/2005 |
| JP | 2005-11800 A | 1/2005 |
| JP | 2005-19251 A | 1/2005 |
| JP | 2005-123013 A | 5/2005 |
| JP | 2005-129329 A | 5/2005 |
| JP | 2005-129429 A | 5/2005 |
| JP | 2005-129430 A | 5/2005 |
| JP | 2005-209682 A | 8/2005 |
| JP | 2005-227376 | 8/2005 |
| JP | 2006-93284 A | 4/2006 |
| JP | 2006-156212 A | 6/2006 |
| JP | 2006-188582 A | 7/2006 |
| JP | 2006-190534 A | 7/2006 |
| WO | 94/05025 A1 | 3/1994 |
| WO | 98/50393 A1 | 11/1998 |
| WO | 02/11213 A | 2/2002 |
| WO | 2004/011555 A1 | 2/2004 |
| WO | 2004/082061 A1 | 9/2004 |
| WO | 2005/077956 A1 | 8/2005 |
| WO | 2006/028087 A1 | 3/2006 |

OTHER PUBLICATIONS

European Search Report dated Nov. 2, 2010 in corresponding European patent application No. EP 10 17 8386.
Journal of Photochemistry and Photobiology, A: Chemistry, vol. 126, No. 1-03, Jan. 1, 1999, pp. 111-115, XP008039037, "Nano-porous TiO2 photovoltaic cells sensitized with metallochromic triphenylmethane dyes: [n-TiO2/triphenylmethane dye/p-I-/I3-(or CuI)]", by Jayaweera, et al.
Semiconductor Science and Technology, vol. 10, No. 12, Dec. 1, 1995, pp. 1689-1693, XP000545068, "A dye-sensitized nano-porous solid-state photovoltaic cell", by Tennakone, et al.
Semiconductor Science and Technology, vol. 12, No. 1, Jan. 1, 1997, pp. 128-132, XP000638596, "The photostability of dye-sensitized solid state photovoltaic cells: factors determining the stability of the pigment in a nanoporous n-TiO2/cyanidin/p-CuI cell", by Tennakone, et al.
Journal of Photochemistry and Photobiology, A: Chemistry, vol. 117, No. 2, Jan. 1, 1998, pp. 137-142, XP000922708, "Sensitization of nano-porous films of TiO2 with santalin (red sandalwood pigment) and construction of dye-sensitized solid-state photovoltaic cells", by Tennakone, et al.
International Search Report dated Sep. 19, 2006 in co-pending U.S. Appl. No. 11/922,062, filed Dec. 12, 2007.
International Search Report dated Dec. 2, 2005 in co-pending U.S. Appl. No. 11/661,843, filed Mar. 5, 2007.
International Search Report dated Sep. 5, 2006 in co-pending U.S. Appl. No. 11/920,899, filed Nov. 21, 2007.
International Search Report dated Sep. 17, 2002 in a co-pending US Application.
International Search Report dated Jun. 4, 2002 in a co-pending foreign application.
International Search Report dated May 25, 2004.
International Search Report dated May 22, 2007 in co-pending U.S. Appl. No. 12/224,350.
Supplemental European Search Report dated Feb. 13, 2006.
Notice of Allowance mailed Apr. 11, 2012 in co-pending U.S. Appl. No. 10/548,858.
Supplemental European Search Report dated Feb. 21, 2007.
European communication dated Jun. 7, 2010.
European Communication dated Aug. 4, 2010 in co-pending foreign application (EP06757302.2).
Supplemental European Search Report dated May 25, 2009 in co-pending foreign application (EP05782209).
Nature, vol. 353, p. 737 (1991); B. O'Regan and M. Gratzel; "A low-cost, high-efficiency solar cell based on dye-sensitized colloidal TiO2 films".
J.A.Chem.Soc. 1993, vol. 115, p. 6382 (1993); M. K. Nazeenruddin et al; "Conversion of Light to Electricity by cis-X2Bis(2,2'-bipyridyl-4,4'-dicarboxylate ruthenium (II) Charge-Transfer Sensitizers (X=Cl-, Br-, I-, CN-, and SCN-) on Nanocrystalline TiO2 Electrodes".
Chemistry Letters, p. 1241 (1998) Wataru Kubo et al.; "Fabrication of Quasi-solid state Dye-sensitized TiO2 Solar Cells Using Low Molecular Weight Gelators".
Solar Energy Materials & Solar Cells 80 (2003) 47-71; K. Sayama et al.; "Efficient sensitization of nanocrystalline TiO2 films with cyanine and merocyanine organic dyes".
J. Mater. Chem, 2000, 10, 1-25; Yasuhiko Shirota, "Organic Materials for electronic and Optoelectronic Devices".
J. Am. Chem. Soc. 2006, 128, p. 16701-16707; Sanghoon Kim et al.; "Molecular Engineering of Organic Sensitizers for Solar Cell Applications".
Thin Solid Films, 438-439 (2003) p. 147-152; Keiichi Miyairi et al.; "Photovoltaic properties of double layer devices consisting of titanium dioxide and prophyrin dispersed hole transporting material layer".
Chem. Commun., 2004, p. 68-69; Sanghoon Kim et al.; "The role of borole in a fully conjugated electron-rich environment".
Office Action dated Jun. 21, 2010 in co-pending U.S. Appl. No. 11/661,843, filed Mar. 5, 2007.
Office Action dated Oct. 7, 2010 in co-pending U.S. Appl. No. 11/661,843, filed Mar. 5, 2007.
Office Action dated Jun. 21, 2010 in co-pending U.S. Appl. No. 11/920,899, filed Nov. 21, 2007.
Office Action dated Oct. 8, 2010 in co-pending U.S. Appl. No. 11/920,899, filed Nov. 21, 2007.
Office Action dated Jun. 21, 2010 in co-pending U.S. Appl. No. 11/922,062, filed Dec. 12, 2007.
Office Action dated Oct. 13, 2010 in co-pending U.S. Appl. No. 11/922,062, filed Dec. 12, 2007.
Office Action dated May 25, 2010 in co-pending U.S. Appl. No. 10/548,858, filed Sep. 9, 2005.
Office Action dated May 7, 2010 in co-pending U.S. Appl. No. 12/224,350, filed Aug. 25, 2008.
Final Rejection dated Jan. 25, 2011 in co-pending U.S. Appl. No. 12/224,350, filed Aug. 25, 2008.
Office Action dated Sep. 17, 2009 in co-pending U.S. Appl. No. 10/548,858, filed Sep. 9, 2005.
Final Rejection dated Mar. 16, 2011 in co-pending U.S. Appl. No. 11/661,843.
Notice of Allowance dated Mar. 16, 2011 in co-pending U.S. Appl. No. 11/920,899.
Final Rejection dated Mar. 15, 2011 in co-pending U.S. Appl. No. 11/992,062.
Notice of Allowance mailed Sep. 20, 2012 in corresponding U.S. Appl. No. 12/908,444.

DYE-SENSITIZED PHOTOELECTRIC CONVERSION DEVICE

This application is a divisional of U.S. patent application Ser. No. 10/482,425 filed Dec. 29, 2003, which is a 371 of PCT/JP02/06833 filed Jul. 5, 2002, the disclosures of which are incorporated herein by reference.

TECHNICAL FIELD

The present invention relates to a semiconductor fine material sensitized with an organic dye, a photoelectric conversion device and a solar cell, and in particular to an oxide semiconductor fine material sensitized with a dye having a specific structure, a photoelectric conversion device characterized by using the oxide semiconductor fine material and a solar cell using the photoelectric conversion device.

BACKGROUND OF THE INVENTION

A solar cell utilizing sunlight as an alternative energy source to a fossil fuel such as petroleum, coal or the like has been paid attention to. Efficiency-enhancement studies have been conducted enthusiastically nowadays for the development and improvement of a silicon solar cell wherein used crystalline or amorphous silicon; or a compound semiconductor solar cell wherein used gallium, arsenic or the like. However, they have not widely been accepted in the market because of the high production cost and energy-consumingness as well as the difficulties relating to the resources problem. Due to the above, the development of cost-effective solar cell has been desired. At the same time, a photoelectric conversion device comprising semiconductor fine particles sensitized with dye(s) and a solar cell comprising the said photoelectric conversion device have been known, whereupon disclosed materials and techniques for producing the same. (B. O'Regan and M. Gratzel Nature, 353, 737 (1991), M. K. Nazeeruddin, A. Kay, I. Rodicio, R. Humphry-Baker, E. Muller, P. Liska, N. Vlachopoulos, M. Gratzel, J. Am. Chem. Soc., 115, 6382 (1993) e.t.c.). This photoelectric conversion device produced by using the low-cost oxide semiconductor such as titanium oxide has attracted the public attention as there is a possibility to obtain an inexpensive photoelectric conversion device compared to the solar cell produced by using a conventional material such as silicon. However, there still lies ahead a problem relating to the material of the sensitizing-dye, for which a ruthenium-type complex, high in cost and low in supply, is used in order to pursue a high conversion efficiency in the device. Although some attempts have been made to utilize an organic dye for the sensitizing-dye, they have not yet been put into practical use at present due to the difficulties such as low conversion efficiency.

In regard to the photoelectric conversion device comprising organic dye-sensitized semiconductor, a development of a practical photoelectric conversion device having high conversion efficiency and stability by using an inexpensive organic dye is desired.

DISCLOSURE OF THE INVENTION

The present inventors have conducted an extensive study in order to solve the above-described problems and found that a photoelectric conversion device having high conversion efficiency can be obtained by sensitizing semiconductor fine materials with a dye having the specific partial structure and preparing a photoelectric conversion device. The present invention has thus been completed based on those findings.

Namely, the present invention relates to;
(1) A photoelectric conversion device, characterized by comprising oxide semiconductor fine materials sensitized with a methine type dye represented by the following general formulae (1)-(4):

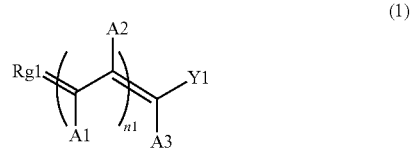

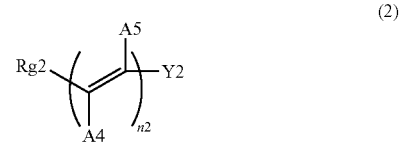

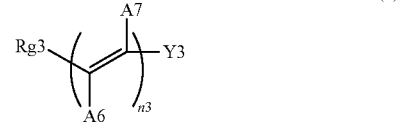

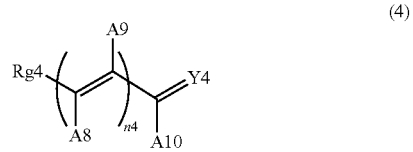

wherein,
Rg1 is a group represented by the following formula (5)-(7);
Rg2 is a group represented by the formula (8);
Rg3 and Rg4 are groups represented by the formula (9),
Each * shows the position whereto a methine group is attached;

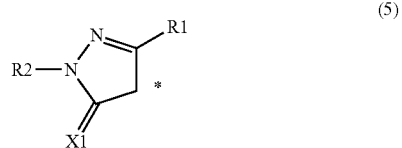

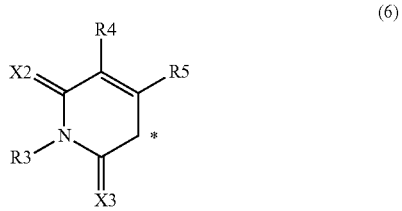

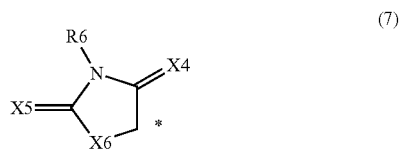

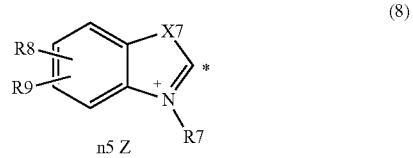

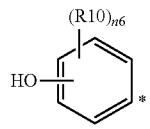

(9)

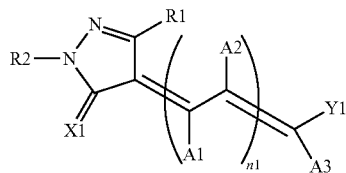

(10)

Each A1-A10 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

When n1-n4 are 2 or more and plurality of A1-A10 are present, each of them may independently be the same or different;

The groups selected from above described A1-A10, when present in the same molecular, may be bonded to form an optionally substituted ring;

Each X1-X6 independently represents an oxygen atom, a sulphur atom, a selenium atom or —NR"—;

X7 represents an oxygen atom, a sulphur atom, a selenium atom, —CRR'-group, —CR=CR'-group or —NR"-group, wherein R, R' and R" independently represent a hydrogen atom or a substituent group;

Y1 and Y2 represent an optionally substituted aromatic hydrocarbon residue or an optionally substituted organic metal complex residue;

Y3 represents a cyano group, an optionally substituted aromatic hydrocarbon residue, an optionally substituted heterocyclic residue or an optionally substituted organic metal complex residue;

Y4 represents an optionally substituted aromatic hydrocarbon residue, an optionally substituted heterocyclic residue or an optionally substituted organic metal complex residue;

R1, R4, R5 represent a hydrogen atom, a cyano group, an optionally substituted aliphatic hydrocarbon residue, an optionally substituted aromatic hydrocarbon residue, an optionally substituted heterocyclic residue or a substituted carbonyl group such as a carboxyl group, a carbonamide group, an alkoxycarbonyl group and an acyl group;

R2, R3, R6 and R7 represent a hydrogen atom, an optionally substituted aliphatic hydrocarbon residue, an optionally substituted aromatic hydrocarbon residue or an optionally substituted heterocyclic residue;

Further, in a group represented by the formula (8), R7 may be absent and a nitrogen atom may not necessarily be quaternarized;

R8 represents a carboxyl group, an alkoxycarbonyl group or an aryloxycarbonyl group;

R9 represents a hydrogen atom or a substituent;

R10 represents a carboxyl group or hydroxyl group, when present in plural, each of which may independently be the same or different;

n1 and n4 represent an integer from 0 to 4;

n2 and n3 represent an integer from 1 to 4;

n5 represents 0, ½ or 1; and n6 represents an integer from 1 to 3;

Z represents a counter ion.

(2) A photoelectric conversion device according to the above (1) characterized in that the dye is represented by the following formula (10):

wherein,

A1, A2 an A3 represent independently an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n1 is 2 or more, whereby A1 and A2 present in plural, each of which may independently be the same or different;

two among A1, A2 and A3 which present in plural in the same molecular may be bonded to form an optionally substituted ring;

X1 represents an oxygen atom, a sulphur atom, a selenium atom or —NR"— (wherein R" represents a hydrogen atom or an optionally substituted aliphatic hydrocarbon residue, an optionally substituted aromatic hydrocarbon residue, an optionally substituted heterocyclic residue);

Y1 represents an optionally substituted aromatic hydrocarbon residue or an optionally substituted organic metal complex residue;

R1 represents a hydrogen atom, a cyano group, an optionally substituted aliphatic hydrocarbon residue, an optionally substituted aromatic hydrocarbon residue, an optionally substituted heterocyclic residue or a substituted carbonyl group such as a carboxyl group, a carbonamide group, an alkoxycarbonyl group and an acyl group;

R2 represents a hydrogen atom, an optionally substituted aliphatic hydrocarbon residue, an optionally substituted aromatic hydrocarbon residue and an optionally substituted heterocyclic residue;

n1 represents an integer from 0 to 4,]

(3) The photoelectric conversion device dye according to the above (2), characterized in that a substituent group Y1 of the general formula (10) is represented by the following general formula (11):

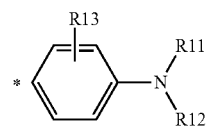

(11)

wherein,

R13 represents a substituent group which may be present in plural, wherein each R13 may be the same or different, and may be bonded each other, or combined with R11 or R12 to form an optionally substituted ring;

R11 and R12 independently represent a hydrogen atom, an optionally substituted aliphatic hydrocarbon residue, an optionally substituted aromatic hydrocarbon residue and an optionally substituted heterocyclic residue;

* indicates the position whereto a methine group is attached, (4) The photoelectric conversion device according to any one of the above (2) to (3), characterized in that R1 of formula (10) is carboxyl group, (5) A photoelectric conversion device according to any one of the above (2) to (4), characterized in that R2 of formula (10) is an aliphatic hydrocarbon residue comprising a carboxyl group, an aromatic hydrocarbon residue comprising a carboxyl group, (6) A photoelectric conversion device according to any one of the above (1) to (5), characterized in that n1 of formula (10) represents an integer from 0 to 3, (7) A photoelectric conversion device according to the above (1) characterized in that the dye is represented by the following formula (12):

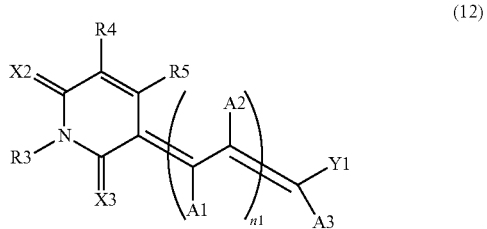

wherein,

A1, A2 and A3 represent independently an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n1 is 2 or more, whereby A1 and A2 present in plural, each of which may independently be the same or different;

two among A1, A2 and A3 which present in plural in the same molecular may be bonded to form an optionally substituted ring;

X2 and X3 represent an oxygen atom, a sulphur atom, a selenium atom or —NR"— (wherein, R" represents a hydrogen atom or an optionally substituted aliphatic hydrocarbon residue, an optionally substituted aromatic hydrocarbon residue, an optionally substituted heterocyclic residue);

Y1 represents an optionally substituted aromatic hydrocarbon residue or an optionally substituted organic metal complex residue;

R3 represents a hydrogen atom, an optionally substituted aliphatic hydrocarbon residue, an optionally substituted aromatic hydrocarbon residue, an optionally substituted heterocyclic residue.

R4 and R5 represent a hydrogen atom, a cyano group, an optionally substituted aliphatic hydrocarbon residue, an optionally substituted aromatic hydrocarbon residue, an optionally substituted heterocyclic residue or a substituted carbonyl group such as a carboxyl group, a carbonamide group, an alkoxycarbonyl group and an acyl group;

n1 represents an integer from 0 to 4.

(8) A photoelectric conversion device according to the above (7) characterized in that a substituent group Y1 of formula (12) is represented by the formula (11), (9) A photoelectric conversion device according to any one of the above (7) to (8) characterized in that R3 of formula (12) is an aliphatic hydrocarbon residue substituted with a carboxyl group, an aromatic hydrocarbon residue substituted with a carboxyl group,

(10) The photoelectric conversion device according to any one of the above (7) to (9) characterized in that R4 of formula (12) is a cyano group or a substituted carbonyl group such as a carboxyl group, a carbonamide group, an alkoxycarbonyl group and an acyl group,

(11) The photoelectric conversion device according to any one of the above (7) to (10) characterized in that n1 of formula (12) is an integer from 0 to 3,

(12) The photoelectric conversion device according to the above (1) characterized in that the dye is represented by the following formula (13):

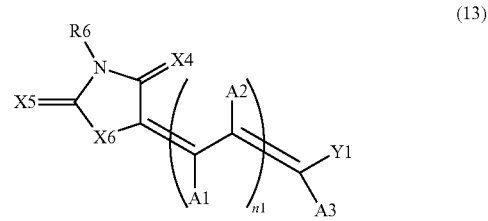

wherein,

A1, A2 and A3 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n1 is 2 or more, whereby A1 and A2 present in plural, each of which may independently be the same or different;

two among A1, A2 and A3 which present in plural in the same molecular may be bonded to form an optionally substituted ring;

X4, X5 and X6 represent an oxygen atom, a sulphur atom, a selenium atom or —NR"— (wherein R" represents a hydrogen atom or an optionally substituted aliphatic hydrocarbon residue, an optionally substituted aromatic hydrocarbon residue, an optionally substituted heterocyclic residue);

Y1 represents an optionally substituted aromatic hydrocarbon residue or an optionally substituted organic metal complex residue;

R6 represents a hydrogen atom, an optionally substituted aliphatic hydrocarbon residue, an optionally substituted aromatic hydrocarbon residue, an optionally substituted heterocyclic residue;

n1 represents an integer from 0 to 4,

(13) The photoelectric conversion device according to the above (12) characterized in that a substituent group Y1 of formula (13) is represented by the following formula (11),

(14) The photoelectric conversion device according to any one of the above (12) to (13) characterized in that R6 of formula (13) is an aliphatic hydrocarbon residue having a carboxyl group, an aromatic hydrocarbon residue having a carboxyl group,

(15) The photoelectric conversion device according to any one of the above (12) to (14) characterized in that n1 of formula (13) represents an integer from 0 to 3,

(16) The photoelectric conversion device according to the above (1) characterized in that the dye is represented by the following formula (14):

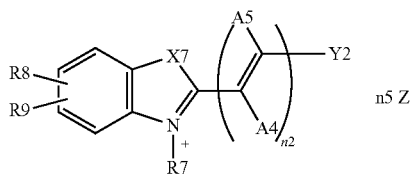
(14)

wherein,

A4 and A5 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n2 is 2 or more, whereby A4 and A5 present in plural, each of which may independently be the same or different;

A4 and A5 which are present in plural in the same molecular may independently be bonded to form an optionally substituted ring;

X7 represents an oxygen atom, a sulphur atom, a selenium atom, —CRR'-group, —CR=CR'-group or —NR"-group (wherein R and R' independently represents a hydrogen atom or a substituent group);

Y2 represents an optionally substituted aromatic hydrocarbon residue or an optionally substituted organic metal complex residue;

R7 represents a hydrogen atom, an optionally substituted aliphatic hydrocarbon residue, an optionally substituted aromatic hydrocarbon residue, an optionally substituted heterocyclic residue; or R7 may be absent and a nitrogen atom may not necessarily be quaternized;

R8 represents a hydrogen atom or a substituent group;

R9 represents a carboxyl group, an alkoxycarbonyl group or an aryloxycarbonyl group.

n2 represents an integer from 1 to 4;

n5 represents 0, ½ or 1;

Z represents a counter ion,

(17) The photoelectric conversion device according to any one of the above (1) and (16) characterized in that the dye is represented by the following formula (15):

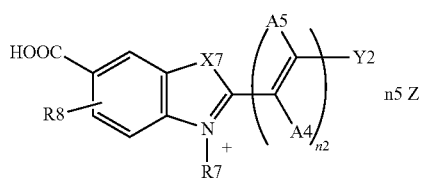
(15)

wherein A4, A5, n2, n5, X7, Y2, Z and R7, R8 represent the same as mentioned for the general formula (14),

(18) The photoelectric conversion device according to any one of the above (16) and (17) characterized in that a substituent group Y2 of formula (14) and (15) is represented by the formula (11),

(19) The photoelectric conversion device according to any one of the above (16) to (18) characterized in that n2 of formula (14) and (15) represents an integer from 1 to 3,

(20) The photoelectric conversion device according to any one of the above (16) to (19) characterized in that a counter ion Z of formula (14) and (15) represents a halogen atom,

(21) The photoelectric conversion device according to the above (1) characterized in that the dye is represented by the following formula (16):

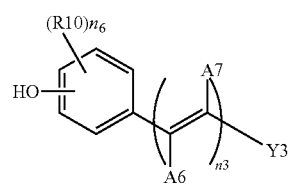
(16)

wherein,

A6 and A7 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n3 is 2 or more, whereby A6 and A7 present in plural, each of which may independently be the same or different;

A6 and A7, present in plural in the same molecular, may be bonded to form an optionally substituted ring;

Y3 represents a cyano group, an optionally substituted aromatic hydrocarbon residue, an optionally substituted heterocyclic residue or an optionally substituted organic metal complex residue;

R10 represents a carboxyl group or hydroxyl group and when R10 present in plural it may be the same or different;

n3 represents an integer from 1 to 4,

(22) The photoelectric conversion device according to the above (1) and (21) characterized in that the dye is represented by the following formula (17):

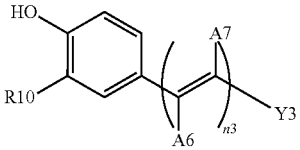
(17)

wherein, A6, A7, n3, Y3 and R10 are the same as those of the formula (16),

(23) The photoelectric conversion device according to any one of the above (21) and (22) characterized in that Y3 of formula (16) and (17) is an optionally substituted heterocyclic residue,

(24) The photoelectric conversion device according to any one of the above (21) to (23) characterized in that n3 of formula (16) and (17) represents an integer from 1 to 3,

(25) The photoelectric conversion device according to the above (1) characterized in that the dye is represented by the following formula (18):

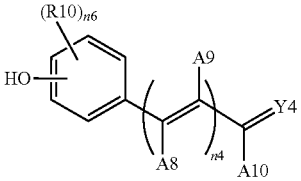
(18)

wherein,

A8-A10 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n4 is 2 or more; whereby

A8 and A9 are present in plural, each of which may independently be the same or different;

A8-A10, present in plural in the same molecular, may be bonded to form an optionally substituted ring;

Y4 represents an optionally substituted aromatic hydrocarbon residue, an optionally substituted heterocyclic residue or an optionally substituted organic metal complex residue;

n4 indicates an integer from 0 to 4,

(26) The photoelectric conversion device according to the above (1) and (25) characterized in that the dye is represented by the following formula (19):

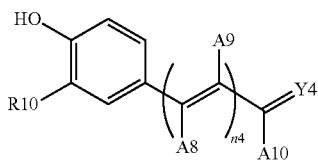
(19)

wherein A8, A9, A10, n4, Y4 and R10 are the same as those of the formula (18),

(27) The photoelectric conversion device according to any one of the above (25) and (26) characterized in that Y4 of formula (18) and (19) represents an optionally substituted heterocyclic residue,

(28) The photoelectric conversion device according to any one of the above (25) to (27), characterized in that n4 of formula (18) and (19) represents an integer from 0 to 2,

(29) The photoelectric conversion device according to any one of the above (1) to (28), characterized by using oxide semiconductor fine materials sensitized with a combination of (i) at least one of the methine-type dyes represented by the formulae (1) to (4); and (ii) at least one of the dyes selected from a group comprising the organic dye and metal complex dye except for those represented by the formulae (1) to (4).

(30) The photoelectric conversion device according to any one of the above (1) to (29), wherein the oxide semiconductor fine materials comprise titanium dioxide as an essential component.

(31) The photoelectric conversion device according to any one of the above (1) to (30), wherein the dye is adsorbed on the oxide semiconductor fine materials in the presence of an inclusion compound.

(32) A solar cell characterized by using a photoelectric conversion device according to any one of the above (1) to (31),

(33) An oxide semiconductor fine material sensitized by a methine-type dye represented by the formulae (1) to (19) according to any one of the above (1) to (28),

(34) The photoelectric conversion device according to any one of the above (1) to (33) obtained by adsorbing the dye on the thin film of the oxide semiconductor fine material.

BEST MODE FOR CARRYING OUT THE INVENTION

The present invention will be described in detail below. A photoelectric conversion device according to the present invention uses an oxide semiconductor sensitized with a dye having a specific partial structure, particularly an oxide semiconductor fine material. There is no limitation for the oxide semiconductor fine material used in the present invention, which may be the oxide semiconductor fine particle or the fine crystalline such as nanowhisker, nanotube and nanowire as far as the surface area thereof is large enough to adsorb much dye; preferably adsorb as much dye or even more dye than the oxide semiconductor fine particle. Currently, the oxide semiconductor fine particle is most commonly used. Each dye of the present invention, having a specific partial structure, is namely characterized by comprising respectively methine groups and being represented by the following general formulae (1)-(4):

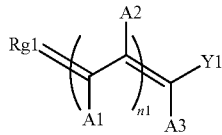
(1)

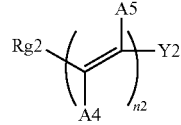
(2)

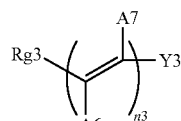
(3)

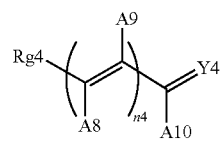
(4)

wherein,

Rg1 is a group represented by the following formula (5)-(7);

Rg2 is a group represented by the formula (8);

Rg3 and Rg4 are groups represented by the formula (9),

* shows the position whereto a methine group is attached;

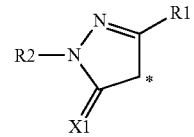
(5)

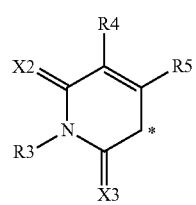
(6)

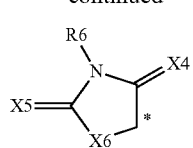

(7)

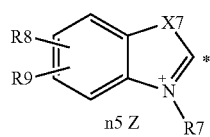

(8)

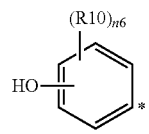

(9)

Each A1-A10 may independently be an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

When n1-n4 are 2 or more, whereby A1-A10 present in plural, each of which may independently be the same or different;

A1-A10, present in the same molecular, may be bonded to form an optionally substituted ring;

X1-X6 independently represents an oxygen atom, a sulphur atom, a selenium atom or —NR"—;

X7 represents an oxygen atom, a sulphur atom, a selenium atom, —CRR'-group, —CR=CR'-group or —NR"-group (wherein R, R' and R" independently represents a hydrogen atom or a substituent group);

Y1 and Y2 represent an optionally substituted aromatic hydrocarbon residue or an optionally substituted organic metal complex residue;

Y3 represents a cyano group, an optionally substituted aromatic hydrocarbon residue, an optionally substituted heterocyclic residue or an optionally substituted organic metal complex residue;

Y4 represents an optionally substituted aromatic hydrocarbon residue, an optionally substituted heterocyclic residue or an optionally substituted organic metal complex residue;

R1, R4, R5 represent a hydrogen atom, a cyano group, an optionally substituted aliphatic hydrocarbon residue, an optionally substituted aromatic hydrocarbon residue, an optionally substituted heterocyclic residue or a substituted carbonyl group such as a carboxyl group, a carbonamide group, an alkoxycarbonyl group and an acyl group;

R2, R3, R6 and R7 represent a hydrogen atom, an optionally substituted aliphatic hydrocarbon residue, an optionally substituted aromatic hydrocarbon residue, an optionally substituted heterocyclic residue;

Further, in a group represented by the formula (8), R7 may be absent and a nitrogen atom may not necessarily be quaternarized;

R8 represents a carboxyl group, an alkoxycarbonyl group or an aryloxycarbonyl group;

R9 represents a hydrogen atom or a substituent;

R10 represents a carboxyl group or hydroxyl group, when present in plural, each of which may independently be the same or different;

n1 and n4 indicate an integer from 0 to 4;
n2 and n3 indicate an integer from 1 to 4;
n5 indicates 0, ½ or 1; and
n6 indicates integer from 1 to 3;
Z represents a counter ion.

Among the above the dye is represented by the general formula (1), wherein Rg1 is represented by the general formula (5), is explained in detail. The compound is represented by the following formula (10):

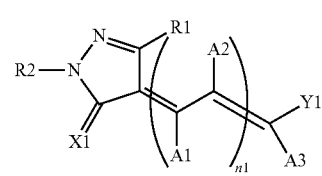

(10)

wherein,

A1, A2 an A3 independently represent an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group. When n1 is 2 or more, whereby A1 and A2 are present in plural, each of which may independently be the same or different and respectively represents one of the above groups.

The above "aliphatic hydrocarbon residue" includes a residue group obtained by removing one hydrogen atom from both straight and branched-chain or cyclic aliphatic hydrocarbon, which may be saturated and unsaturated and it generally has from 1 to 36 carbon atoms, although the number of carbon atoms are not particularly limited. Preferred is an alkyl group of straight-chain having from 1 to about 20 carbon atoms, and most commonly is an alkyl group of straight-chain having from 1 to about 6 carbon atoms. Example of a cyclic aliphatic hydrocarbon residue includes a cycloalkyl group having 3 to 8 carbons.

The above "aromatic hydrocarbon residue" means a group wherein one hydrogen atom is removed from an aromatic hydrocarbon such as benzene, naphthalene, anthracene, phenanthrene, pyrene, indene, azulene and fluoren.

The above "heterocyclic residue" means a group wherein one hydrogen atom is removed from a heterocyclic compound such as pyridine, pyrazine, piperidine, morpholine, indoline, thiophene, furan, oxazole, thiazole, indole, benzothiazole, benzoxazole and quinoline.

Examples of "optionally substituted amino group" include an unsubstituted amino group, optionally substituted mono- or dialkylamino group and mono- or diaromatic substituted amino group such as mono- or dimethylamino group, mono- or diethylamino group, mono- or dipropylamino group, mono- or dibenzylamino group, mono- or diphenylamino group, mono- or dinaphtylamino group and alkylarylamino group (examples of substituents on an alkyl group and an aryl group include, but are not limited to, a phenyl group, an alkoxyl group, a halogen atom, a hydroxyl group and a cyano group).

Examples of "alkoxyl group" include an alkoxyl group having 1 to 10 carbon atoms.

Examples of "halogen atom" include chlorine, bromine and iodine.

Examples of "alkoxycarbonyl group" include an alkoxycarbonyl group having 1 to 10 carbon(s).

Examples of "acyl group" include a $C_{1-10}$ alkylcarbonyl group and an arylcarbonyl group, preferably is a $C_{1-4}$ alkylcarbonyl group, and more specifically are an acetyl group and a propionyl group.

Examples of "substituents" on the above aliphatic hydrocarbon residue, aromatic hydrocarbon residue or heterocyclic residue include, but are not particularly limited to, an optionally substituted alkyl group, an aryl group, a cyano group, an isocyano group, a thiocyanato group, an isothiocyanato group, a nitro group, a halogen atom, a hydroxyl group, a sulfo group, a phosphoric acid group, an esterified phosphoric acid group (hereinafter referred to as a phosphoric acid ester group), a substituted or unsubstituted mercapto group, a substituted or unsubstituted amino group, a substituted or unsubstituted amide group, an alkoxyl group, an alkoxyalkyl group or a substituted carbonyl group such as a carboxyl group, a carbonamide group, an alkoxycarbonyl group and an acyl group.

The above "optionally substituted alkyl group" generally include both straight and branched-chain or cyclic alkyl group being optionally substituted, having from 1 to 36 carbon atoms, and preferably an alkyl group having from 1 to about 20 carbon atoms. Most commonly is an optionally substituted alkyl group having from 1 to about 6 carbon atoms. The alkyl group may further be substituted with the substituents excluding the above alkyl group.

Examples of "aryl group" include a group wherein a hydrogen atom is removed from an aromatic ring of the above mentioned aromatic hydrocarbon residue. The aryl groups may further be substituted with the above-described groups.

Examples of "halogen atom" include an atom such as fluorine, chlorine, bromine and iodine.

Examples of "phosphoric acid ester group" include an $(C_1-C_4)$alkyl phosphoric acid ester group.

Examples of "unsubstituted or substituted mercapto group" include such as a mercapto group and an alkylmercapto group.

Examples of "unsubstituted or substituted amino group" include such as an amino group, mono- or dialkylamino group, mono- or diaromatic group, mono- or dimethylamino group, mono- or diethylamino group, mono- or dipropylamino group, mono- or diphenyl amino group or a benzylamino group.

Examples of "substituted or unsubstituted amide group" include such as an amide group, an alkylamide group and an aromatic amide group. "Amide group" referred in the specification may be either a sulfone amide group or a carbonamide group, but generally means a carbonamide group.

Examples of "alkoxyl group" include such as an alkoxyl group having from 1 to 10 carbon atoms.

Examples of "alkoxyalkyl group" include such as a $(C_1-C_{10})$alkoxy$(C_1-C_{10})$alkyl group.

Examples of "alkoxycarbonyl group" include such as an alkoxycarbonyl group having from 1 to 10 carbon atoms.

Examples of "acyl group" include such as an alkyl carbonyl group having from 1 to 10 carbon atoms, an aryl carbonyl group, preferably is an alkyl carbonyl group having from 1 to 4 carbon atoms, and specifically are such as an acetyl group and a propionyl group, etc.

"Acid group" such as carboxyl group, sulfo group and phospholic acid group, and "hydroxyl group" may form salts. Examples of salts include the salts formed with alkaline metals or alkaline earth metals such as lithium, sodium, potassium, magnesium and calcium; or the salts such as quaternary ammonium salts, e.g. tetramethylammonium, tetrabutylammonium, pyridinium and imidazolium, formed with organic base.

The terms mentioned above in detail, unless otherwise stated to the contrary, will be referred to as the same meaning as stated above hereinafter in the specification.

Preferred A1, A2 and A3 include a hydrogen atom, a halogen atom, a cyano group, an amino group which may be optionally substituted by alkyl group having 1-4 carbon atoms or phenyl group, an optionally substituted alkyl group and an optionally substituted phenyl group, and more preferably are a hydrogen atom or an optionally substituted $(C_1-C_4)$ alkyl group alkyl group.

Any two among A1, A2 and A3 may be bonded to form an optionally substituted ring. In particular, when n is 2 or more and A1 or A2, or both A1 and A2 present in plural, any A1 and any A2 may be combined to form a ring. When the ring has substituents, the substituents include those mentioned for the aliphatic hydrocarbon residue, aromatic hydrocarbon residue or heterocycle residue described above. The formed-rings are unsaturated hydrocarbon rings and heterocycle rings. Examples of unsaturated hydrocarbon rings include such as benzene ring, naphthalene ring, anthracene ring, phenanthrene ring, pyrene ring, indene ring, azulene ring, fluorene ring, cyclobutene ring, cyclohexene ring, cyclopentene ring, cyclohexadiene ring and cyclopentadiene ring. Examples of heterocycle rings include such as pyridine ring, pyrazine ring, indoline ring, thiophene ring, furan ring, pyran ring, oxazole ring, thiazole ring, indole ring, benzothiazole ring, benzoxazole ring, pyrazine ring, quinoline ring, carbazole ring and benzopyran ring. Preferred are generally 5 to 6 membered rings which may include one hetero atom selected from the group consisting of an oxygen atom, nitrogen atom and sulphur atom.

The ring may also be a condensed ring such as benzothiasole. Examples of those include such as a cyclobutene ring, cyclopentene ring, cyclohexene ring and pyran ring. Those may have substituents such as carbonyl group and thiocarbonyl group, and in such a case may form a cyclic ketone or a cyclic thioketone.

X1 represents an oxygen atom, a sulphur atom, a selenium atom or —NR"— (wherein R" represents a hydrogen atom or an optionally substituted aliphatic hydrocarbon residue, an optionally substituted aromatic hydrocarbon residue, an optionally substituted heterocyclic residue), preferably are an oxygen atom and a sulphur atom, and more preferably is an oxygen atom. Examples of an optionally substituted aliphatic hydrocarbon residue, an optionally substituted aromatic hydrocarbon residue or an optionally substituted heterocyclic residue include the same groups as mentioned for A1-A3.

Y1 represents an optionally substituted aromatic hydrocarbon residue and an optionally substituted organic metal complex residue. The examples of an optionally substituted aromatic hydrocarbon residue are the same as mentioned for A1, A2 and A3. The organic metal complex residue includes a group wherein one hydrogen atom is removed from the organic metal complex. Examples of the compounds of organic metal complex include such as ferrocene, ruthenocene, titanocene, zirconocene, porphyrin, phthalocyanine and bipyridyl complex. The substituents that the organic metal complex may optionally be substituted with includes, but are not limited to, the same substituents on an aliphatic hydrocarbon residue, an aromatic hydrocarbon residue and a heterocycle residue as mentioned for A1, A2 and A3.

Preferred rings for Y1 may include such as a benzene ring, a naphthalene ring, an indene ring, a phthalocyanine ring, a porphyrin ring and a ferrocene, more preferably are a benzene ring and a naphthalene ring.

The substituents that Y1 may have include the same substituents on an aliphatic hydrocarbon residue, an aromatic hydrocarbon residue or a heterocyclic residue as mentioned for A1, A2 and A3. Preferred examples include an optionally substituted amino group, an optionally substituted alkyl group, an alkoxyl group, an acyl group, an amide group, a hydroxyl group, a halogen atom, and more preferably are an optionally substituted amino group, an optionally substituted alkyl group and an alkoxyl group. Examples of an optionally substituted amino group preferably include such as mono- or dialkyl-substituted amino group, a monoalkylmonoaryl-substituted amino group, mono or diaryl-substituted amino group, mono or dialkylene substituted amino group, and more preferably are a dialkyl-substituted amino group and a diaryl-substituted amino group. Preferred substituents for an optionally substituted alkyl group include an aryl group, a halogen atom, an alkoxyl group, a cyano group, a hydroxyl group and a carboxyl group. Examples of an optionally substituted alkoxyl group include such as an unsubstituted alkoxyl group, an alkoxy-substituted alkoxyl group, a halogeno-substituted alkoxyl group, an aryl-substituted alkoxyl group.

The alkyl group and the alkoxyl group referred herein are the same as those mentioned for A1, A2 and A3.

Examples of substituents that Y1 may have, include an optionally substituted aromatic azo group, and preferably mono or di($C_1$-$C_4$)alkylamino-substituted phenyl azo group.

Moreover, preferred example of Y1 is represented by the following general formula (11):

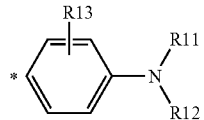

(11)

wherein,

R13 represents a substituent group which may be present in plural, each of which may independently be the same or different and may be bonded or combined with R11 or R12 to form an optionally substituted ring. Preferable substituents include the same as mentioned for Y1, such as an alkyl group, an aryl group, a cyano group, a nitro group, an acyl group, a halogen atom, a hydroxyl group, a substituted or unsubstituted amino group, a substituted or unsubstituted amide group, an alkoxyl group, an alkoxylalkyl group, an alkoxylalkyl group, a carboxyl group, alkoxycarbonyl group, a sulfo group. The substituents may be present in plural, each of which may independently be the same or different and may be bonded or combined with R11 or R12 to form an optionally substituted ring as shown below.

R11 and R12 independently represents a hydrogen atom, an optionally substituted aliphatic hydrocarbon residue, an optionally substituted aromatic hydrocarbon residue and an optionally substituted heterocyclic residue. The above mentioned optionally substituted aliphatic hydrocarbon residue, the optionally substituted aromatic hydrocarbon residue and the optionally substituted heterocyclic residue are the same as those mentioned for A1, A2 and A3. Preferred are an optionally substituted aliphatic hydrocarbon residue and an optionally substituted aromatic hydrocarbon residue, wherein the substituents may be the same as those mentioned for Y1. Preferred include such as an alkyl group, an aryl group, a cyano group, a nitro group, an acyl group, a halogen atom, a hydroxyl group, a substituted or unsubstituted amino group, a substituted or unsubstituted amide group, an alkoxyl group, an alkoxyalkyl group, an alkoxyalkyl group, a carboxyl group, alkoxycarbonyl group, a sulfo group. Those substituents may be present in plural, and when present in plural, they may be the same or different.

An alkyl group and alkoxyl group herein referred are the same as those mentioned for A1, A2 and A3.

R11 and R12 may be bonded to form an optionally substituted ring, R11 and R12 may independently be combined with R13 to form a julolidine ring, tetramethyljulolidine ring, a quinoline ring and a carbazole ring.

Preferred groups in R11 and R12 include an unsubstituted alkyl group having from 1 to 8 carbon atoms, more preferably having from 1 to 5 carbon atoms; or said alkyl group having a substituent selected from the group consisting of a cyano group, a hydroxy group, a halogen atom, a phenyl group, a ($C_1$-$C_4$) alkyl substituted phenyl group, an ($C_1$-$C_4$) alkoxyl group, an ($C_1$-$C_4$)acyl group and phenoxy group.

R1 represents a hydrogen atom, a cyano group, an optionally substituted aliphatic hydrocarbon residue, an optionally substituted aromatic hydrocarbon residue, an optionally substituted heterocyclic residue or a substituted-carbonyl group such as carboxyl group, a carbon amide group, an alkoxyl carbonyl group and acyl group. The optionally substituted aliphatic hydrocarbon residue, the optionally substituted aromatic hydrocarbon residue and the optionally substituted heterocyclic residue are the same as those mentioned for A1, A2 and A3. Preferred groups for R1 may include a cyano group, an optionally substituted aliphatic hydrocarbon residue; more preferably are ($C_1$-$C_4$)alkyl group or a substituted-carbonyl group such as a carboxyl group, a carbonamide group, an alkoxycarbonyl group and an acyl group; and further preferably are a carboxyl group, ($C_1$-$C_4$)alkoxycalbonyl group, a carboxyamide group optionally substituted with N—($C_1$-$C_4$) alkyl group, $C_1$-$C_6$ acyl group and cyano group; most preferably is a carboxyl group.

R2 represents a hydrogen atom, an optionally substituted aliphatic hydrocarbon residue, an optionally substituted aromatic hydrocarbon residue or optionally substituted heterocyclic residue. Examples of those are the same as mentioned for A1, A2 and A3. Preferred substituents for those groups include the groups having an alkyl group, an aryl group, a cyano group, a nitro group, a halogen atom, a hydroxyl group, a sulfo group, a phosphoric acid group, a phosphoric acid ester group, a substituted or unsubstituted amino group, an alkoxyl group, an alkoxyalkyl group, a group having a carbonyl group such as a substituted or unsubstituted amide group, a carboxyl group, an alkoxycarbonyl group and an acyl group, and more preferably are a cyano group, a halogen atom, a carboxyl group, a ($C_1$-$C_4$) alkoxycarbonyl group.

Preferred R2 represents an unsubstituted phenyl group; a phenyl group having from 1 to 3 substituents selected from the group consisting of ($C_1$-$C_4$) alkyl group, a sulfo group and a halogen atom; an unsubstituted ($C_1$-$C_4$) alkyl group; a ($C_1$-$C_4$) alkyl group having substituents selected from the group consisting of carboxyl group, halogen atom and hydroxyl group; a 5-membered aliphatic hydrocarbon residue optionally having from 1 to 2 oxygen atoms or sulphur atoms.

Anyhow, at least one of R1, R2 and X1 is preferred to have a carbonyl group such as caroxyl group, a carbonamide group, alkoxycarbonyl group and acyl group in order to form an adsorption bond with the oxide semiconductor.

n1 represents an integer from 0 to 4. Preferably, n1 is an integer from 0 to 3, and more preferably from 0 to 2.

The preferred compound represented by the formula (10) is a compound having a combination of the above preferred groups. More preferably is a compound wherein R1 is carboxyl group, R2 is an unsubstituted phenyl group and X1 is an oxygen atom, A1, A2 and A3 are hydrogen atoms, n1 is an integer from 0 to 2, Y1 is a group represented by the formula (11). Further preferably, in the general formula (11), R11 and R12 are ($C_1$-$C_4$) alkyl groups, and R13 is an hydrogen atom.

The compound represented by the general formula (10) may include the structural isomers such as cis form and trans form, and either of them may be used as a photosensitizing dye without any limitation.

The compound represented by the general formula (10) can be synthesized by condensing a pyrazoron derivative represented by the general formula (20) with a carbonyl derivative represented by the general formula (21) in the aprotic polor solvents such as alcohol (methanol, ethanol and isopropanol, etc.) and dimethylfolmamide, or acetic anhydride at 20° C. to 120° C., preferably at about 50° C. to 80° C., if necessary, in the presence of a basic catalyst such as sodium ethoxide, piperidine and piperazine.

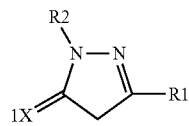
(20)

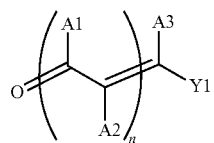
(21)

Examples of the compound are shown below. Examples of the compound represented by the general formula (22) wherein each of A1, A2 and A3 in the general formula (10) is a hydrogen atom and Y1 is 4-aminobenzen derivative are shown in Table 1, wherein 4-sulfonbenzen group, pheny group and naphthalene are respectively abbreviated as 4-SB, Ph and Np. The same abbreviation is applied to Table 2 unless otherwise stated.

TABLE 1

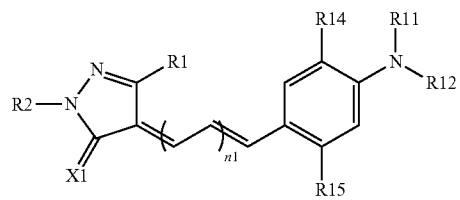
(22)

| Compound | n1 | X1 | R1 | R2 | R11 | R12 | R14 | R15 |
|---|---|---|---|---|---|---|---|---|
| 1 | 0 | O | COOH | Ph | CH3 | CH3 | H | H |
| 2 | 0 | O | COOH | Ph | C2H5 | C2H5 | H | H |
| 3 | 0 | OCOON | (CH3)4 | Ph | Ph | Ph | H | H |
| 4 | 0 | O | COON(C4H9)4 | CH3 | CH3 | CH3 | H | H |
| 5 | 0 | O | COOH | CF3 | Ph | CH3 | H | H |
| 6 | 0 | O | COONHCOCH3 | CH3 | 4-CH3Oph | CH3 | H | H |
| 7 | 0 | O | COOH | Ph | CH3 | CH3 | NHCOCH3 | OCH3 |
| 8 | 0 | O | COONa | H | CH3 | CH3 | OH | H |
| 9 | 0 | O | COOH | Np | C2H5 | C2H5 | Cl | H |
| 10 | 0 | O | COOH | CH3 | CH3 | CH3 | CH3 | H |
| 11 | 0 | O | COOH | Ph | H | CH3 | H | H |
| 12 | 0 | O | COOH | Ph | C2H4OCOCH3 | C2H4CN | OC2H5 | CH3 |
| 13 | 0 | O | COOH | Ph | CH2Ph | C2H4Ph | H | H |
| 14 | 0 | O | COONa | 4-tolyl | C2H4OH | C2H4OH | H | H |
| 15 | 0 | O | COOH | Ph | C18H37 | CH3 | H | H |
| 16 | 0 | O | COOH | CH3 | C5H11 | C5H11 | H | H |
| 17 | 0 | O | CH3 | Ph | C2H5 | C2H5 | H | H |
| 18 | 0 | O | CN | CH2COOH | C2H5 | C2H5 | H | H |
| 19 | 0 | O | CH3 | CH2COOH | C4H9 | C4H9 | H | H |
| 20 | 0 | O | CH3 | 4-SB | C5H11 | C5H11 | H | H |
| 21 | 0 | O | C3H7 | C2H4COOH | C2H5 | C2H5 | H | H |
| 22 | 0 | O | CH3 | H | CH3 | CH3 | H | H |
| 23 | 0 | O | CH3 | 2-ClPh | C8H17 | C8H17 | H | H |
| 24 | 0 | O | CH3 | CH3 | CH3 | CH3 | H | H |
| 25 | 0 | O | COOC2H5 | Ph | CH3 | CH3 | H | H |
| 26 | 0 | O | COONH2 | thiophene | CH3 | C8H17 | H | H |
| 27 | 0 | O | COONHCH3 | CH3 | CH3 | CH3 | H | H |
| 28 | 0 | NH | CH3 | Ph | CH3 | CH3 | H | H |
| 29 | 0 | NH | COOH | Ph | C2H5 | C2H5 | H | H |
| 30 | 0 | NH | CH3 | CH2COOH | CH2Cl | CH2Cl | H | H |
| 31 | 0 | NCH3 | COOH | Ph | CH3 | CH3 | H | H |
| 32 | 0 | S | COOH | Ph | C2H5 | C2H5 | OCH3 | H |
| 33 | 0 | Se | COCH3 | CH3 | CH3 | CH3 | H | H |
| 34 | 0 | NH | CN | H | C2H4OH | C2H4OH | H | OH |
| 35 | 1 | O | COOH | Ph | CH3 | CH3 | H | H |
| 36 | 1 | O | COOH | Ph | Ph | Ph | H | H |
| 37 | 1 | O | COOH | CH3 | Ph | Ph | H | H |
| 38 | 1 | O | CH3 | CH2COOH | CH3 | CH3 | H | H |
| 39 | 1 | NH | CN | H | CH3 | CH3 | H | H |
| 40 | 1 | S | COOH | Ph | CH3 | CH3 | H | H |
| 41 | 1 | O | COOCH3 | 4-SB | Ph | Ph | H | CH3 |
| 42 | 2 | O | COONa | Ph | C2H5 | C2H5 | H | H |
| 43 | 2 | O | CH3 | CH3 | Ph | Ph | H | H |

TABLE 1-continued
(22)
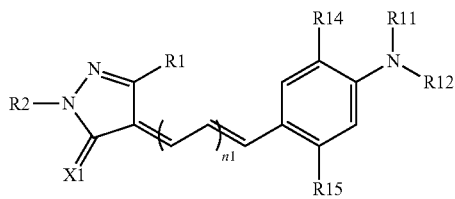
| Compound | n1 | X1 | R1 | R2 | R11 | R12 | R14 | R15 |
|---|---|---|---|---|---|---|---|---|
| 44 | 2 | O | COOH | C2H4COOH | Ph | Ph | H | H |
| 45 | 2 | O | COOH | CH2OH | CH3 | CH3 | H | H |
| 46 | 2 | NH | COOH | H | CH3 | CH3 | H | H |
| 47 | 3 | OCOON | (CH3)4 | CH2Cl | CH2Cl | CH2Cl | H | H |
| 48 | 3 | O | COOH | Ph | CH3 | CH3 | H | H |
| 49 | 3 | NH | CH3 | 4-SB | C2H5 | C2H5 | H | H |
| 50 | 3 | O | COOCH3 | CH3 | CH2CN | CH2CN | CH3 | CH3 |
| 51 | 4 | O | COOH | Ph | CH3 | CH3 | H | H |
| 52 | 4 | O | COOH | CH3 | C8H17 | C8H17 | H | H |
| 53 | 4 | NH | COOH | Ph | CH3 | CH3 | H | H |
| 54 | 4 | O | CH3 | CH2COOH | 4-tolyl | 4-tolyl | H | H |
| 55 | 4 | O | CH3 | Ph | CH2COOH | CH2COOH | H | H |
Other examples are shown below.
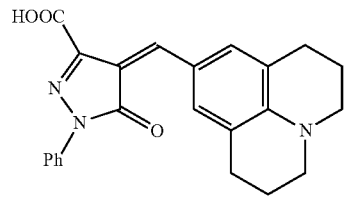
(56)
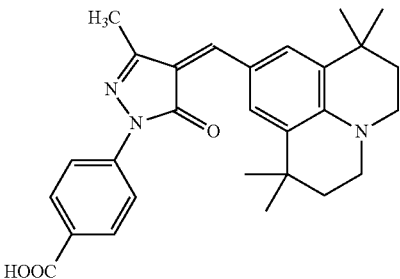
(60)
(57)
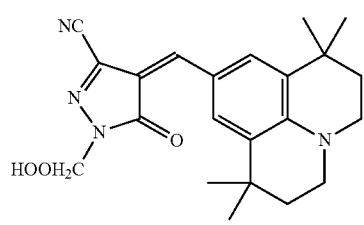
(61)
(58)
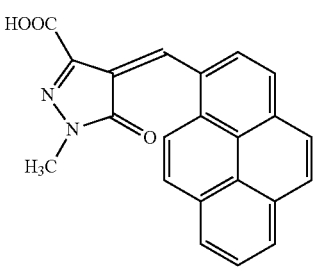
(62)
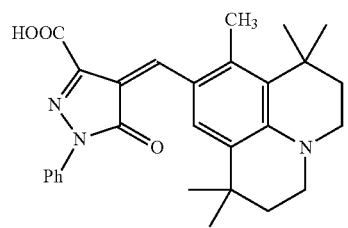
(59)
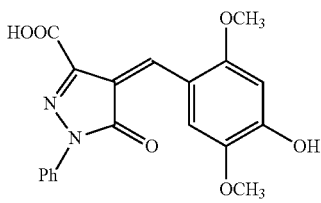
(63)

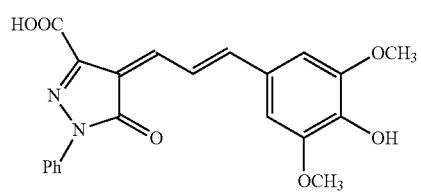
(64)
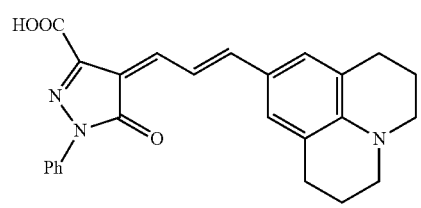
(65)
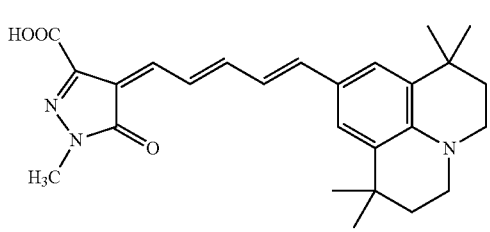
(66)
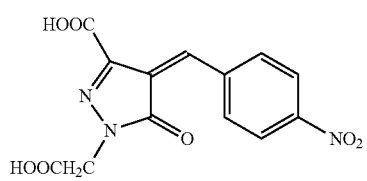
(67)
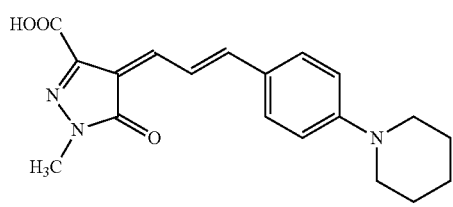
(68)
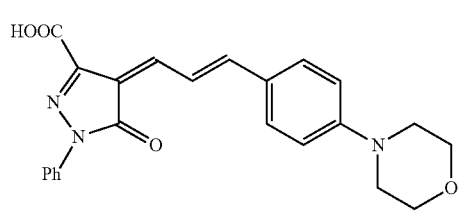
(69)
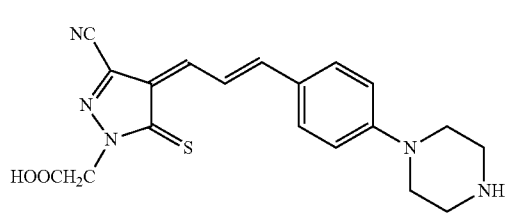
(70)
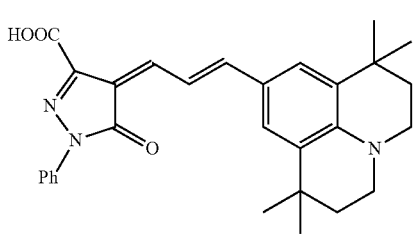
(71)
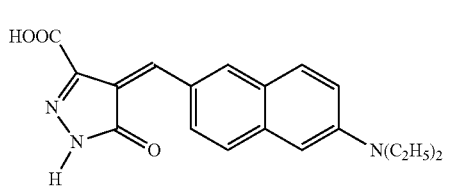
(72)
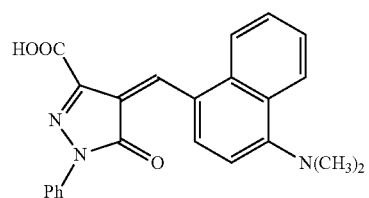
(73)
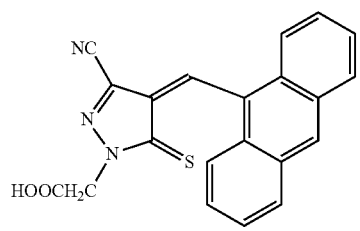
(74)
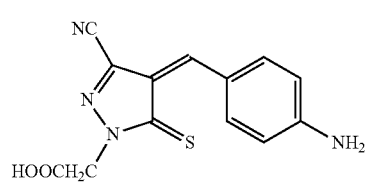
(75)
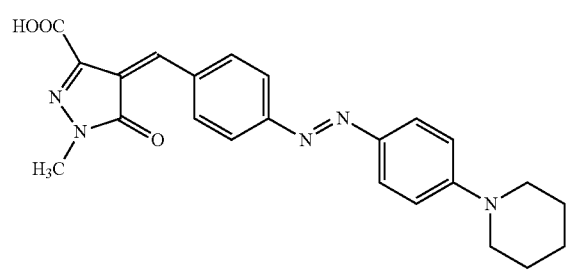
(76)
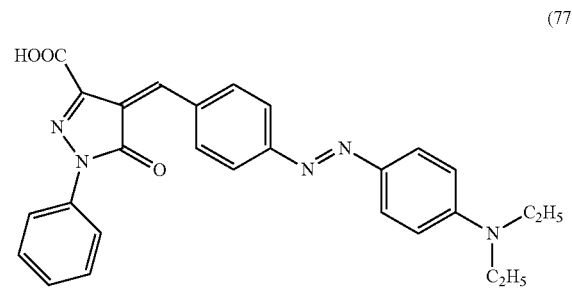
(77)

(78) 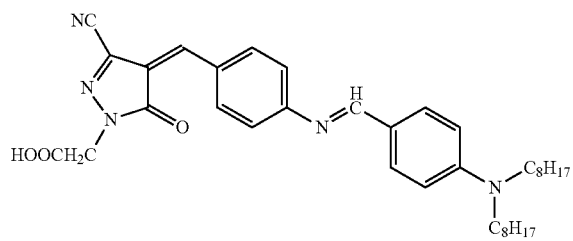
(79) 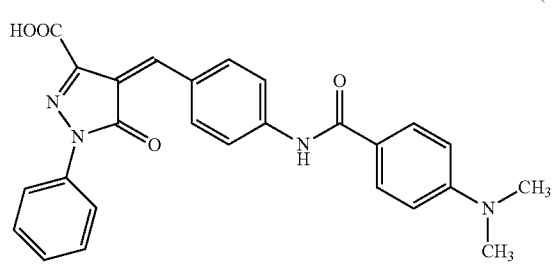
(80) 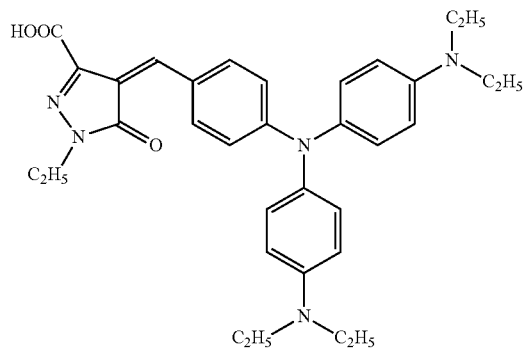
(81) 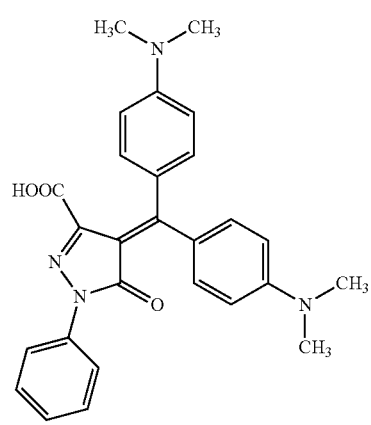
(82) 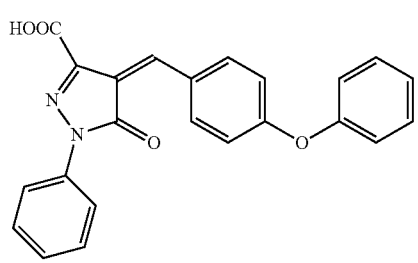
(83) 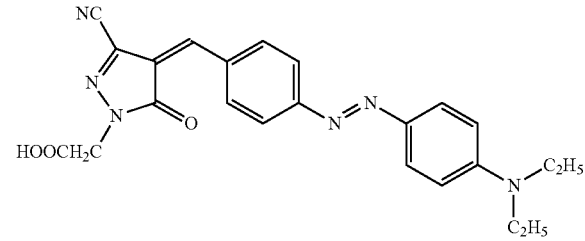
(84) 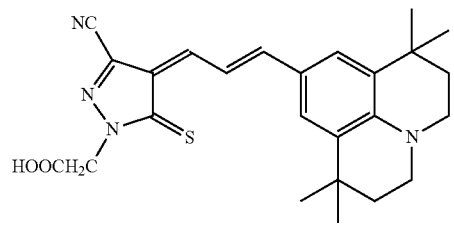
(85) 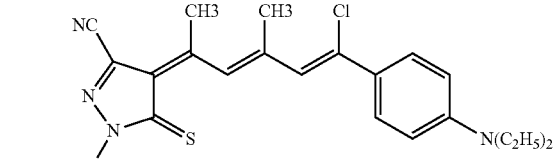
(86) 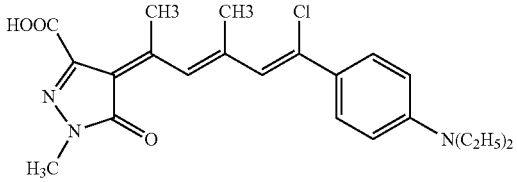
(87) 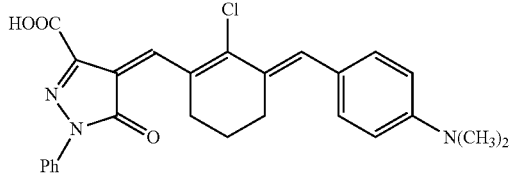
(88) 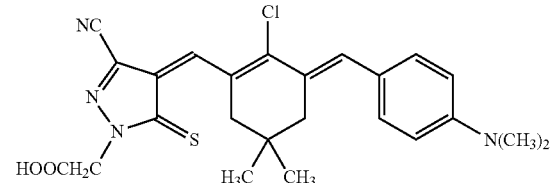
(89) 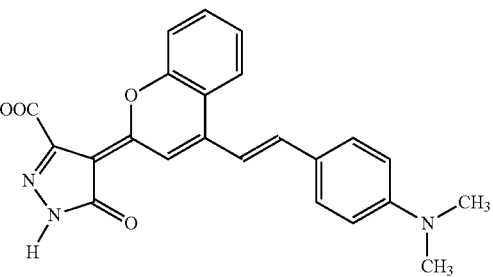

-continued

(90)
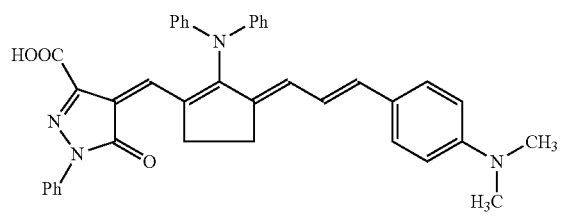

(91)
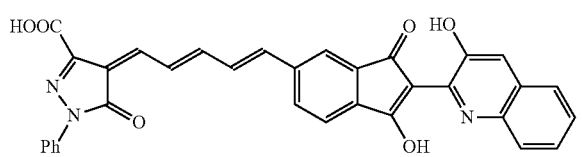

(92)
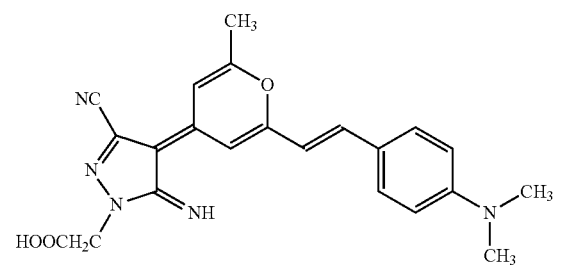

(93)
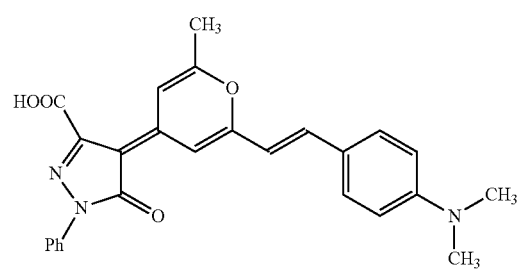

(94)
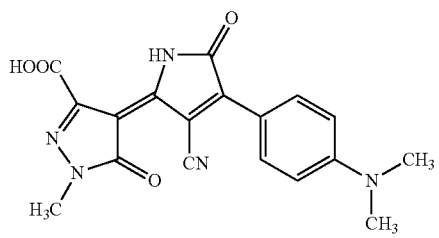

(95)
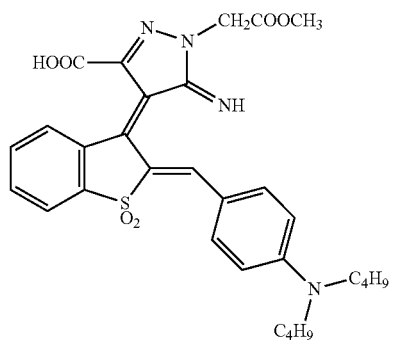

-continued

(96)
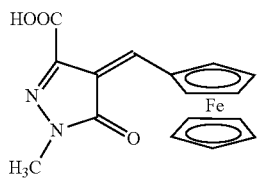

(97)
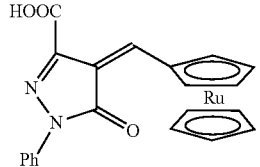

The compound, wherein Rg1 of the general formula (1) is represented by the formula (6), will be explained in detail below. The compound is represented by the formula (12):

(12)
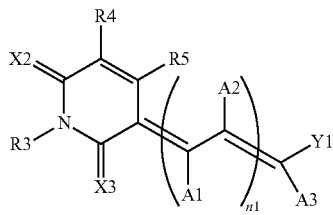

In the general formula (12), A1, A2 and A3 are the same as those of the general formula (10). Preferred examples include the same as those of the general formula (10), which are partially confirmed as follows: i.e. a hydrogen atom, a halogen atom, an optionally substituted alkyl group, an optionally substituted phenyl, more preferably a hydrogen atom or an optionally substituted alkyl group.

Any two selected from A1, A2 and A3 may be bonded to form an optionally substituted ring. In particular, when n is an integer of 2 or more; A1 and A2 independently present in plural; any two selected from A1s and A2s may be combined to form a ring. When the ring has substituents the substituents are the same as those mentioned for the general formula (10).

X2 and X3 represent an oxygen atom, a sulphur atom, a selenium atom or —NR"— (wherein R" represents a hydrogen atom or an optionally substituted aliphatic hydrocarbon residue, an optionally substituted aromatic hydrocarbon residue, an optionally substituted heterocyclic residue). Examples of an optionally substituted aliphatic hydrocarbon residue, an optionally substituted aromatic hydrocarbon residue or an optionally substituted heterocycle residue are the same as those which mentioned for X1 of the general formula (10), preferably are an oxygen atom, a sulphur atom, and more preferably is an oxygen atom.

Y1 represents an optionally substituted aromatic hydrocarbon residue and an optionally substituted organic metal complex residue, which are the same as mentioned for Y1 of the general formula (10), and partially confirmed as follows.

Preferred Y1 includes a group formed by removing a hydrogen atom from a ring such a benzene ring, a naphthalene ring, an indene ring, a phthalocyanine ring, a porphyrin ring, a ferrocene, more preferably a benzene ring and a naphthalene ring and most preferably a phenyl group. Further, the preferred structure of Y1 is represented by the general formula (11) and the details therefor are the same as mentioned for the general formula (10).

R3 represents a halogen atom, an optionally substituted aliphatic hydrocarbon residue, an optionally substituted aromatic hydrocarbon residue or an optionally substituted heterocyclic residue. Examples of an optionally substituted aliphatic hydrocarbon residue, an optionally substituted aromatic hydrocarbon residue and an optionally substituted heterocyclic residue are the same as those mentioned for A1, A2 and A3. The substituents including the preferable ones are the same as those mentioned for A1, A2 and A3. Preferred substituents are confirmed as follows, other ones than shown below are the same as those mentioned for A1, A2 and A3.

Preferred substituents include an alkyl group, an aryl group, a cyano group, a nitro group, a halogen atom, a hydroxyl group, a sulfo group, a phosphoric acid group, a phosphoric acid ester group, a substituted or unsubstituted amino group, an alkoxyl group, an alkoxyalkyl group, or a carbonyl group such as a substituted or unsubstituted amide group, a carboxyl group, an alkoxycarbonyl group and an acyl group, and more preferably are cyano group, a halogen atom, a carboxyl group and an alkoxycarbonyl group. Preferred R3 is an optionally substituted aliphatic hydrocarbon residue, the optionally substituted aromatic hydrocarbon residue, further an unsubstituted or a carbonyl-substituted alkyl group and an unsubstituted or a carbonyl-substituted phenyl group, more preferably is an $C_1$-$C_3$ alkyl group having carboxyl group.

R4 and R5 represent a hydrogen atom, a cyano group, an optionally substituted aliphatic hydrocarbon residue, the optionally substituted aromatic hydrocarbon residue, the optionally substituted heterocyclic residue or a substituted carbonyl group such as a carboxyl group, a carbonamide group, an alkoxycarbonyl group, and an acyl group. The above mentioned optionally substituted aliphatic hydrocarbon residue, the optionally substituted aromatic hydrocarbon residue and the optionally substituted heterocyclic residue are the same as those mentioned for A1, A2 and A3. Preferred R4 represents a cyano group, an optionally substituted aliphatic hydrocarbon residue or a substituted carbonyl group such as a carboxyl group, a carbonamide group, an alkoxycarbonyl group, and an acyl group, more preferably represents a carboxyl group, an alkoxycarbonyl group, a carbonamide group, an acyl group and cyano group, and most preferably represents a carboxyl group and cyano group. Preferred R5 represents an optionally substituted aliphatic hydrocarbon residue and the optionally substituted aromatic hydrocarbon residue.

Any how, it is preferable for adsorption bond with oxide semiconuctor that at least one selected from R3, R4 and R5 has a carbony group such as caroxyl group, a carbonamide group, alkoxycarbonyl group and acyl group.

n represents an integer from 1 to 4. Preferably, n is from 0 to 3, more preferably is from 0 to 2.

Preferred compound represented by the general formula (12) includes the compound comprising a combination of the preferred groups shown above.

The compound represented by the general formula (12) may include the structural isomers such as cis form and trans form, either of which may be used as a photosensitizing dye without any limitation.

The compound represented by the general formula (12) can be synthesized by condensing a pyridon derivative represented by the general formula (23) with a carbonyl derivative represented by the general formula (21) in the aprotic polar solvents such as alcohol (methanol, ethanol and isopropanol, etc.) and dimethylfolmamide, or acetic anhydride, if necessary in the presence of a basic catalyst such as sodium ethoxido, piperidine and piperazine, at 20° C. to 120° C., preferably at about 50° C. to 80° C.

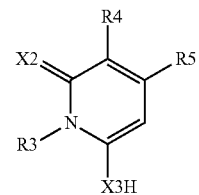

(23)

Examples of the compound are shown below. The examples of the compound represented by the general formula (24), wherein A1, A2 and A3 of the general formula (12) independently represents a hydrogen atom and Y1 represents 4-aminobenzen derivative, are shown in Table 2. In the table Me stands for a methyl group.

TABLE 2

(24)

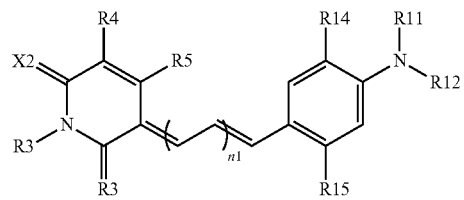

| Compound | n1 | X2 | X3 | R3 | R5 | R4 | R11 | R12 | R14 | R15 |
|---|---|---|---|---|---|---|---|---|---|---|
| 98 | 0 | O | O | CH2COOH | CH3 | CN | H | H | H | H |
| 99 | 0 | O | O | CH2COOH | CH3 | CN | CH3 | CH3 | H | H |
| 100 | 0 | O | O | CH2COOH | CH3 | CN | C2H5 | C2H5 | H | H |
| 101 | 0 | O | O | CH2COOH | CH3 | CN | Ph | Ph | H | H |
| 102 | 0 | O | O | CH2COOH | CH3 | CN | C2H5 | C2H5 | OCH3 | NHCOCH3 |
| 103 | 1 | O | O | CH2COOH | CH3 | CN | CH3 | CH3 | H | H |
| 104 | 1 | O | O | CH2COOH | CH3 | CN | C2H5 | C2H5 | H | OH |
| 105 | 1 | O | O | CH2COOCH3 | CH3 | CN | C2H5 | C2H5 | H | OH |
| 106 | 1 | O | O | CH2COOC2H5 | CH3 | CN | C2H5 | C2H5 | H | OH |
| 107 | 1 | O | O | CH2CONH2 | CH3 | CN | C2H5 | C2H5 | H | OH |
| 108 | 1 | O | O | CH2COOH | H | CN | C2H5 | C2H5 | H | H |
| 109 | 1 | O | O | CH3 | H | COOH | C2H5 | C2H5 | H | H |
| 110 | 1 | O | O | C2H5 | CH3 | COOH | C2H5 | C2H5 | H | H |

TABLE 2-continued (24)

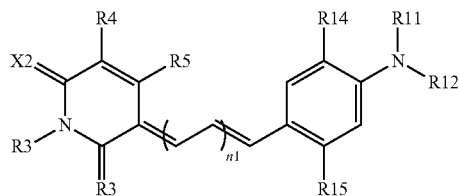

| Compound | n1 | X2 | X3 | R3 | R5 | R4 | R11 | R12 | R14 | R15 |
|---|---|---|---|---|---|---|---|---|---|---|
| 111 | 1 | O | O | Ph | CH3 | COOH | C2H5 | C2H5 | H | H |
| 112 | 1 | O | O | CH3 | CH3 | COOC2H5 | C2H5 | C2H5 | H | H |
| 113 | 1 | NH | NH | CH2COOH | CH3 | CN | C2H5 | C2H5 | H | H |
| 114 | 1 | NCH3 | NCH3 | CH2COOH | CH3 | CN | C2H5 | C2H5 | H | H |
| 115 | 1 | NPh | NPh | CH2COOH | CH3 | CN | C2H5 | C2H5 | H | H |
| 116 | 1 | S | S | CH2COOH | CH3 | CN | C2H5 | C2H5 | H | H |
| 117 | 1 | Se | Se | CH2COOH | CH3 | CN | C2H5 | C2H5 | H | H |
| 118 | 1 | O | O | CH2COOH | CH3 | CN | C2H5 | C2H5 | H | H |
| 119 | 1 | O | O | CH2COOH | CH3 | CN | C2H5 | C2H5 | Cl | H |
| 120 | 1 | O | O | CH2COOH | CH3 | CN | C2H5 | C2H5 | Br | H |
| 121 | 1 | O | O | CH2COOH | CH3 | CN | C2H5 | C2H5 | CH3 | H |
| 122 | 1 | O | O | CH2COOH | CN | CN | C2H5 | C2H5 | CH3 | H |
| 123 | 1 | O | O | CH2COOH | CH3 | Ph | C2H5 | C2H5 | CH3 | H |
| 124 | 1 | O | O | CH2COOH | Ph | CN | C2H5 | C2H5 | CH3 | H |
| 125 | 1 | O | O | CH2COOLi | CH3 | CN | C2H5 | C2H5 | H | H |
| 126 | 1 | O | O | CH2COONa | CH3 | CN | C2H5 | C2H5 | H | H |
| 127 | 1 | O | O | CH2COOK | CH3 | CN | C2H5 | C2H5 | H | H |
| 128 | 1 | O | O | CH2COON(CH3)4 | CH3 | CN | C2H5 | C2H5 | H | H |
| 129 | 1 | O | O | CH2COON(n-C4H9)4 | CH3 | CN | C2H5 | C2H5 | H | H |
| 130 | 1 | O | O | CH2COON(n-C6H13)4 | CH3 | CN | C2H5 | C2H5 | H | H |
| 131 | 1 | O | O | CH2CH2COOH | CH3 | CN | C2H5 | C2H5 | H | H |
| 132 | 1 | O | O | CH2OH | CH3 | CN | C2H5 | C2H5 | H | H |
| 133 | 1 | O | O | CH2CN | CH3 | COOH | C2H5 | C2H5 | H | H |
| 134 | 1 | O | O | CH2SO3H | CH3 | CN | C2H5 | C2H5 | H | H |
| 135 | 1 | O | O | CH2PO3H | CH3 | CN | C2H5 | C2H5 | H | H |
| 136 | 1 | O | O | CH2OC2H4 | OCH3CH3 | COOH | C2H5 | C2H5 | H | H |
| 137 | 1 | O | O | CH2OCH3 | CH3 | COOH | C2H5 | C2H5 | H | H |
| 138 | 1 | O | O | n-C4H9 | CH3 | COOH | C2H5 | C2H5 | H | H |
| 139 | 1 | O | O | n-C18H37 | CH3 | COOH | C2H5 | C2H5 | H | H |
| 140 | 1 | O | O | i-C3H7 | CH3 | COONa | C2H5 | C2H5 | H | OH |
| 141 | 1 | O | O | CH2COOH | CH3 | CN | CH2OH | CH2OH | H | H |
| 142 | 1 | O | O | CH2COOH | CH3 | CN | CH2CN | CH2CN | H | H |
| 143 | 1 | O | O | CH2COOH | CH3 | CN | CH2OCH3 | CH2OCH3 | H | H |
| 144 | 1 | O | O | CH2COOH | CH3 | CN | CH2COOH | CH2COOH | H | H |
| 145 | 1 | O | O | CH2COOH | C2H5 | CN | C2H5 | C2H5 | H | H |
| 146 | 1 | O | O | CH2COOH | n-C4H9 | CN | C2H5 | C2H5 | H | H |
| 147 | 1 | O | O | CH2COOH | n-C18H37 | CN | C2H5 | C2H5 | H | H |
| 148 | 1 | O | O | C2H5 | COOH | CN | C2H5 | C2H5 | H | H |
| 149 | 1 | O | O | CH2COOH | CH3 | CN | Me | H | H | H |
| 150 | 1 | O | O | CH2COOH | CH3 | CN | C2H5 | H | H | H |
| 151 | 1 | O | O | CH2COOH | CH3 | CN | C2H5 | Me | H | H |
| 152 | 1 | O | O | CH2COOH | CH3 | CN | C2H5 | Ph | H | H |
| 153 | 1 | O | O | CH2COOH | CH3 | CN | n-C4H9 | n-C4H9 | H | H |
| 154 | 1 | O | O | CH2COOH | CH3 | CN | n-C8H17 | n-C8H17 | H | H |
| 155 | 1 | O | O | CH2COOH | CH3 | CN | n-C18H37 | n-C18H37 | H | H |

Other examples are shown below.

(156)

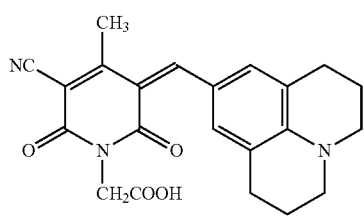

(157)

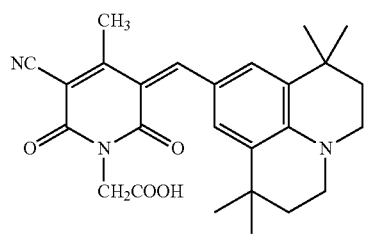

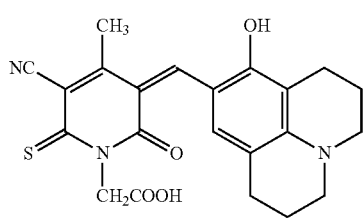
(158)
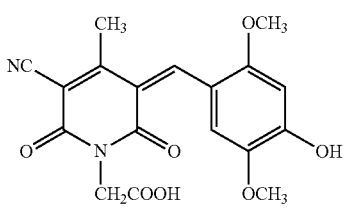
(164)
(159)
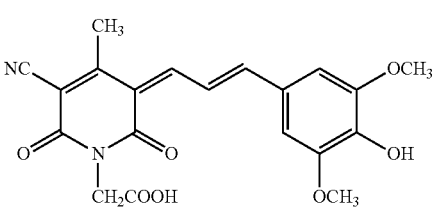
(165)
(160)
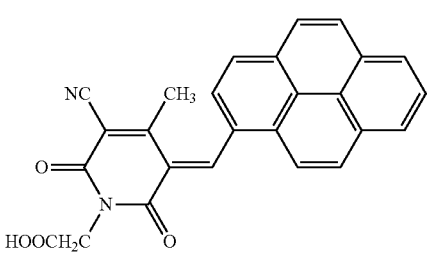
(166)
(161)
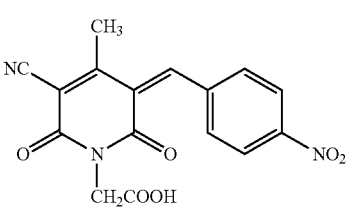
(167)
(162)
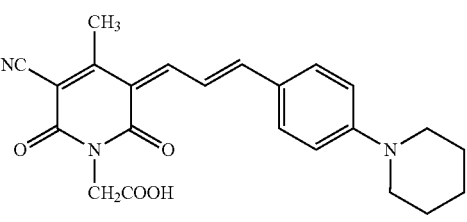
(168)
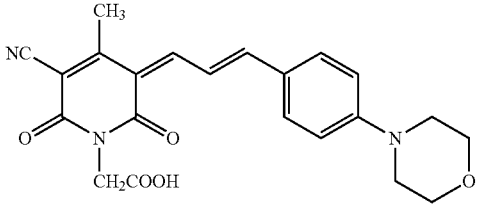
(169)
(163)
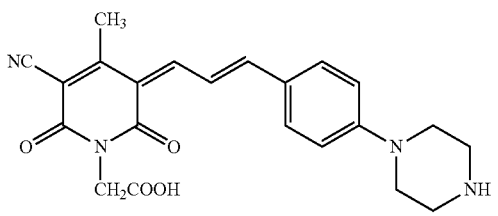
(170)

(171) 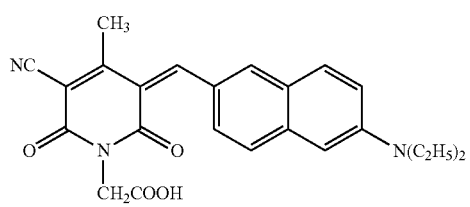
(172) 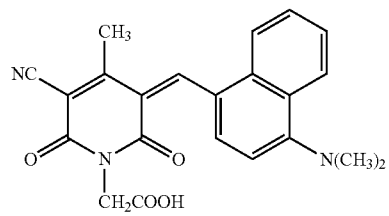
(173) 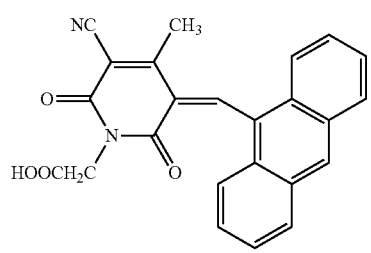
(174) 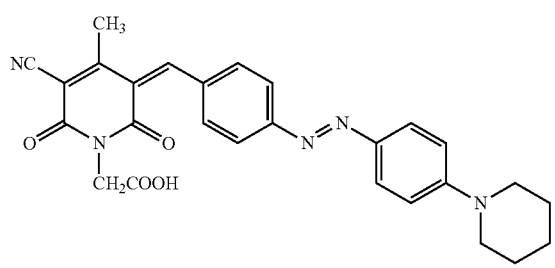
(175) 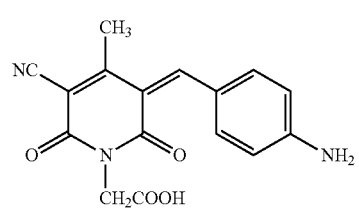
(176) 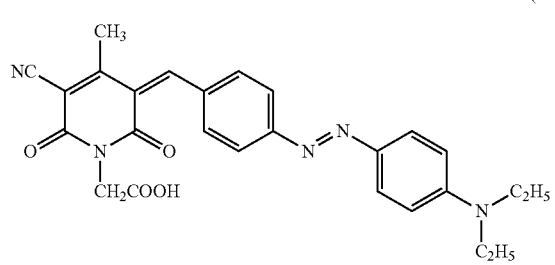
(177) 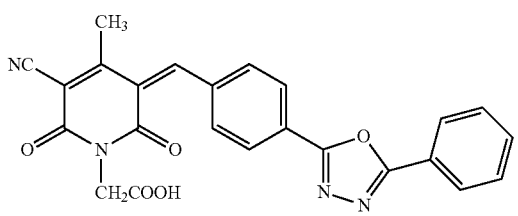
(178) 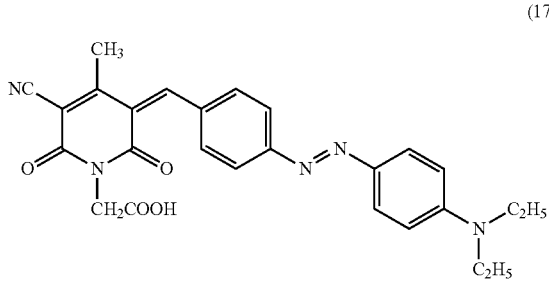
(179) 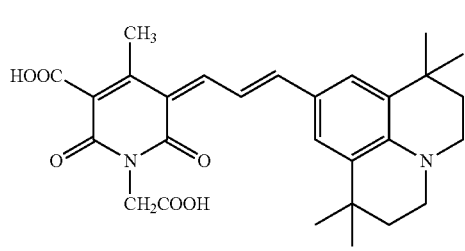
(180) 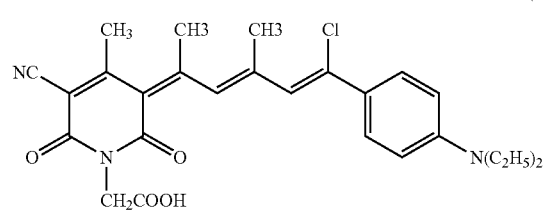
(181) 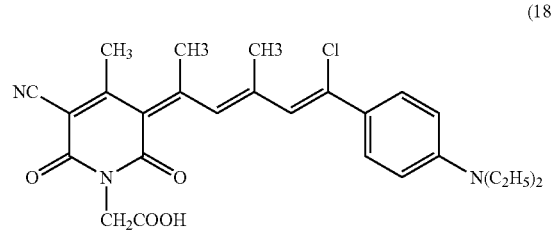
(182) 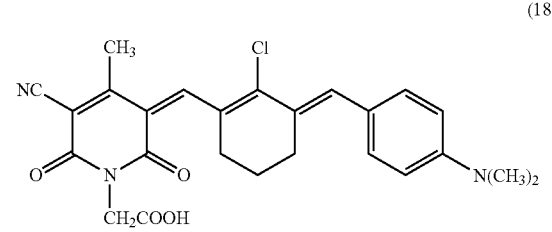

(183)
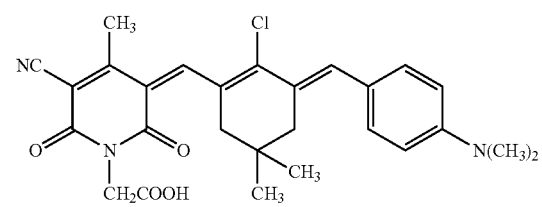
(184)
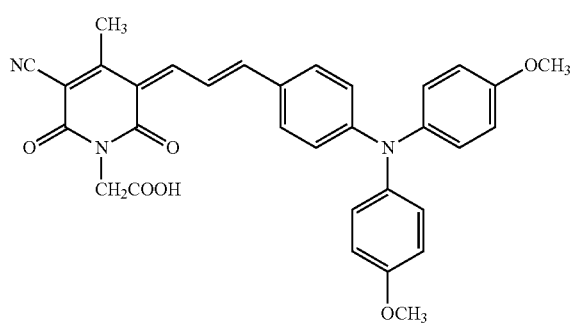
(185)
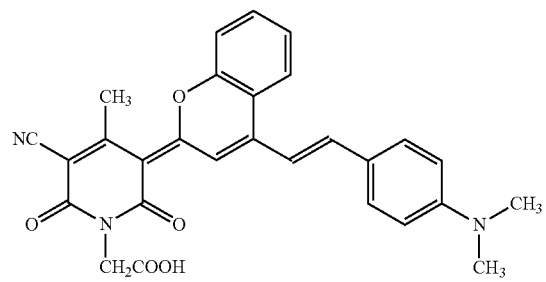
(186)
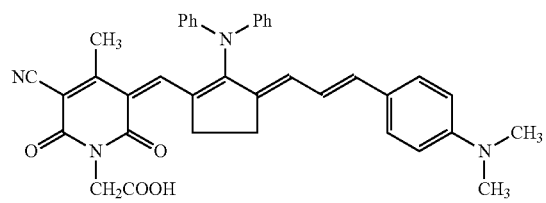
(187)
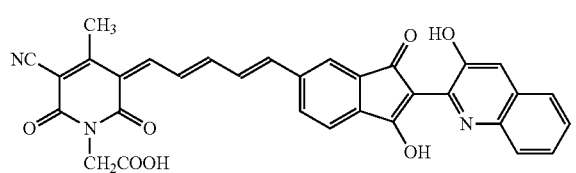
(188)
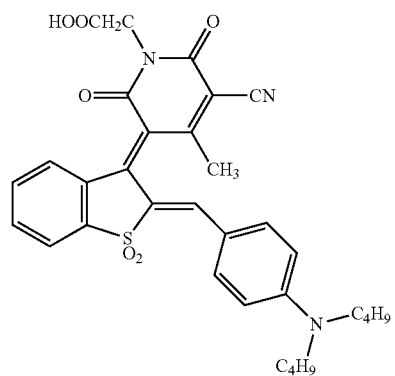
(189)
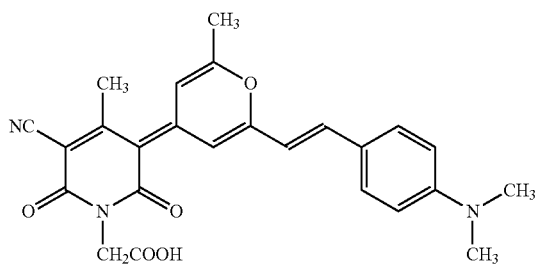
(190)
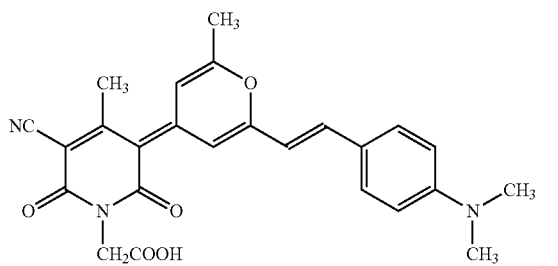
(191)
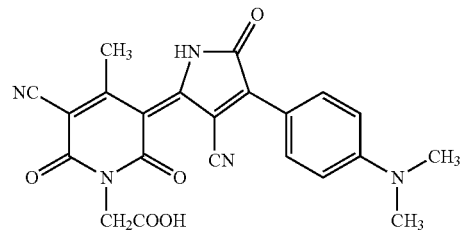
(192)
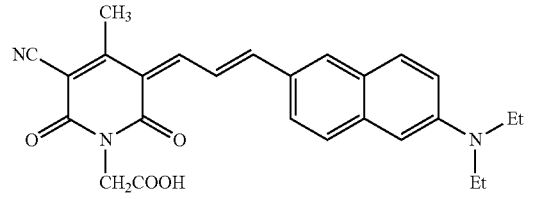
(193)
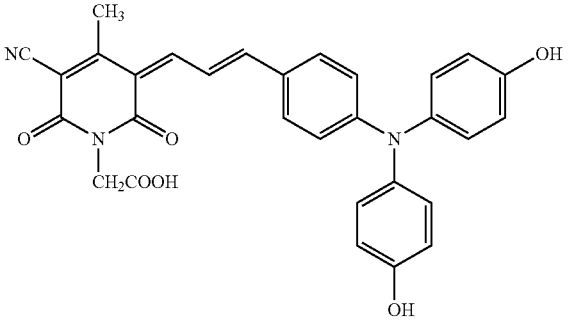
(194)
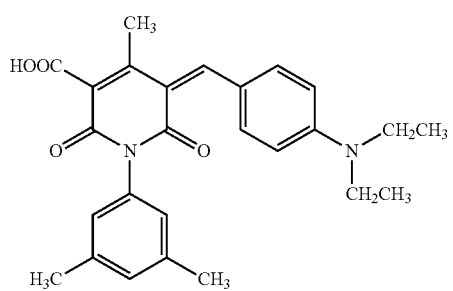

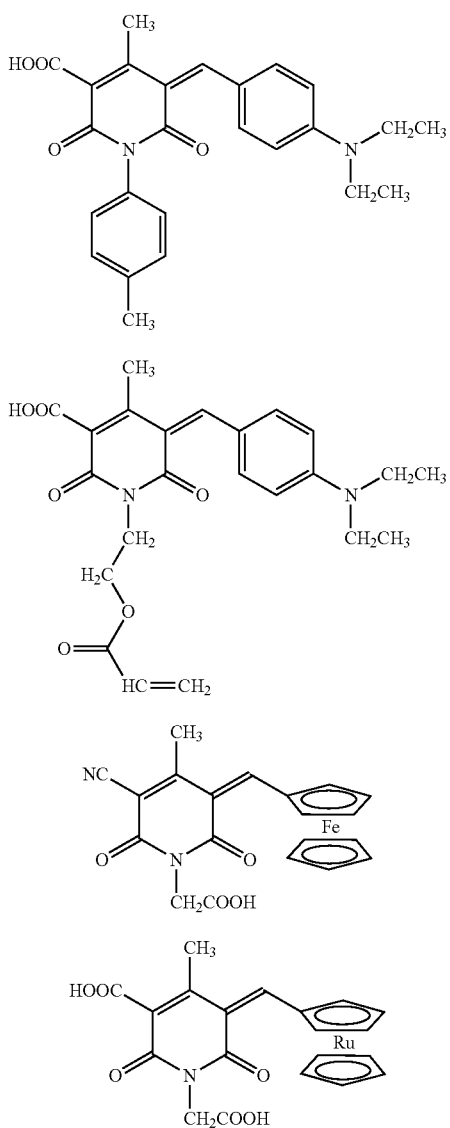

The compound, wherein Rg1 in the general formula (1) is represented by the formula (7), will be described in detail below. The compound is represented by the formula (13):

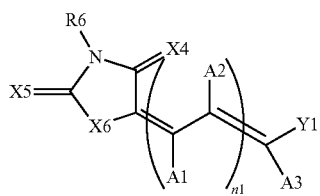

wherein, A1, A2 and A3 are the same as those of the general formula (10). Those preferred are partially confirmed as follows without having any limitation.

Preferred examples of A1, A2 and A3 in the general formula (13) include a hydrogen atom, a halogen atom, an optionally substituted alkyl group, an optionally substituted phenyl, and more preferably include a hydrogen atom and an optionally substituted alkyl group.

Any two selected from A1, A2 and A3 may be bonded to form an optionally substituted ring. In particular, when n is 2 or more; A1 and A2 both present in plural; any two selected from A1s and A2s may be combined to form a ring. When the ring has substituents, examples of the substituents are the same as those mentioned for the general formula (10).

X4, X5 and X6 represent an oxygen atom, a sulphur atom, a selenium atom or —NR"— (wherein R" represents a hydrogen atom or an optionally substituted aliphatic hydrocarbon residue, an optionally substituted aromatic hydrocarbon residue, an optionally substituted heterocyclic residue). The examples of an optionally substituted aliphatic hydrocarbon residue, an optionally substituted aromatic hydrocarbon residue or an optionally substituted heterocycle residue are the same as those mentioned for X1 of the general formula (10), and preferably are an oxygen atom and a sulphur atom. The combination of X4, X5 and X6 is not particularly limited, but the preferable combination is when X4 is an oxygen atom, X5 is a sulphur atom and X6 is a sulphur atom.

Y1 represents an optionally substituted aromatic hydrocarbon residue and an optionally substituted organic metal complex residue which, including the preferable groups, are the same as those mentioned for Y1 in the general formula (10).

Preferred examples of a ring in Y1 are a benzene ring, a naphthalene ring, an anthracene ring, an indene ring, a phthalocyanine ring, a porphyrin ring, a ferrocene, more preferably are a benzene ring and a naphthalene ring, and most preferably is a benzene ring. Further, the preferred example of Y1 includes a group represented by the general formula (11). With respect to the general formula (11), the same as general formula (10) is mentioned.

R6 represents a hydrogen atom, an optionally substituted aliphatic hydrocarbon residue, an optionally substituted aromatic hydrocarbon residue and an optionally substituted heterocyclic residue. Examples of an optionally substituted aliphatic hydrocarbon residue, an optionally substituted aromatic hydrocarbon residue or an optionally substituted heterocyclic residue are the same as those mentioned for A1, A2 and A3. Preferred substituents are also the same as those mentioned for A1, A2 and A3, e.g. an alkyl group, an aryl group, a cyano group, a nitro group, a halogen atom, a hydroxyl group, a sulfo group, a phosphoric acid group, a phosphoric acid ester group, a substituted or unsubstituted amino group, an alkoxyl group, an alkoxyalkyl group, or a group having a carbonyl group such as a substituted or unsubstituted amide group, a carboxyl group, an alkoxycarbonyl group and an acyl group, more preferably are substituents such as a cyano group, a halogen atom, a carboxyl group and an alkoxycarbonyl group. Preferred R6 represents an optionally substituted aliphatic hydrocarbon residue, an optionally substituted aromatic hydrocarbon residue, more preferably are an unsubstituted or a carbonyl-substituted alkyl group and an unsubstituted or a carbonyl-substituted phenyl group, and most preferably is a ($C_1$-$C_3$) alkyl group having carboxyl group.

n1 represents an integer from 0 to 4, preferably is from 0 to 4, and more preferably is from 0 to 2.

Preferred compound represented by the formula (13) includes a compound comprising a combination of the preferred groups shown above.

The example of the said combination is as follows:

n1 represents an integer from 0 to 4, preferably is from 0 to 2;

Each A1, A2 and A3 independently represents any group selected from the group consisting of a hydrogen atom, a halogen atom, a hydroxyl group and an amino group optionally substituted with a ($C_1$-$C_4$) alkyl group or a pheny group;

when A1 and/or A2, present in plural (2 or more), any two independently selected from A1, A2 and A3 may be combined to form a 6-membered ring which may include 1 to 2 oxygen atoms or nitrogen atoms; and more preferably A1, A2 and A3 are a hydrogen atom;

X4 represents an oxygen atom, a sulphur atom or —NH—, and preferably represents an oxygen atom;

X5 represents an oxygen atom, a sulphur atom or —NH—, and preferably represents a sulphur atom;

X6 represents an oxygen atom, a sulphur atom, a selenium atom or an imino group optionally substituted with a group selected from a ($C_1$-$C_4$) alkyl group, a carboxyl-substituted ($C_1$-$C_4$) alkyl group, a phenyl group, a hydroxy-substituted phenyl group, a carboxyl-substituted phenyl group, and preferably is a sulphur atom;

R6 represents a hydrogen atom, an unsubstituted ($C_1$-$C_4$) alkyl group, a carboxyl-substituted or hydroxy-substituted ($C_1$-$C_4$) alkyl group, a carboxyl-substituted or hydroxy-substituted phenyl group, and preferably is a carboxyl-substituted ($C_1$-$C_4$) alkyl group;

Y1 represents an unsubstituted phenyl group; a substituted phenyl group substituted with 1 to 3 groups selected from the group consisting of a halogen atom, a cyano group, an amino group, mono- or disubstituted amino group, a hydroxy group, a ($C_1$-$C_4$) alkoxyl group, a ($C_1$-$C_4$) alkyl group, a phenyl group and a phenyl group substituted with a ($C_1$-$C_4$) alkyl group, or mono- or di ($C_1$-$C_4$) alkylamino group; mono- or di ($C_1$-$C_4$)alkylamino group; a naphtyl group or an anthryl group (a group formed by removing a hydrogen atom from an anthracene ring);

More preferably, Y1 is a group represented by the general formula (11) wherein R13 is a hydrogen, R11 and R12 are independently a ($C_1$-$C_{10}$) alkyl group; or wherein a group represented by the general formula (11) is a julolidino group or a tetramethyl-substituted julolidino group. Said preferred compound comprises the combination of the group mentioned above.

Further preferred is the compound represented by the general formula (13) wherein n1 is 0, A3 is a hydrogen atom, X4 is an oxygen atom, each of X5 and X6 is a sulphur atom and R6 is a carboxylmethyl group.

The compound represented by the general formula (13) may include the structural isomers such as cis form and trans form, either of which may be used as a photosensitizing dye without any limitation.

The compound represented by the general formula (13) can be obtained by condensing the compound represented by the general formula (25) and a carbonyl derivative represented by the general formula (21) in the aprotic polar solvents such as alcohol (methanol, ethanol, isopropanol, etc.) or dimethylfolmamide, or acetic anhydride, if necessary in the presence of a basic catalyst such as sodium ethoxide, piperidine or piperazine, at 20° C. to 120° C., preferably 50° C. to 80° C.

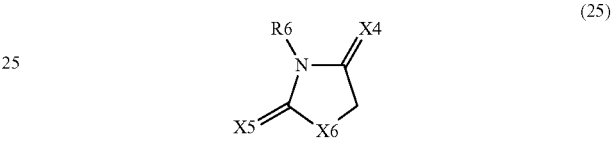

(25)

Examples of the compound are shown below. The examples of the compound represented by the general formula (26) (R14 and R15 are the same as R13), wherein each of A1, A2 and A3 in the general formula (13) represents a hydrogen atom and Y1 represents a 4-aminophenyl group, are shown in Table 3. Tol stands for 4-tolyl group.

TABLE 3

(26)

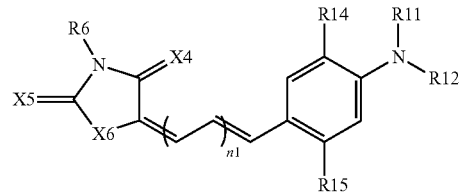

| Compound | n1 | X4 | X6 | X5 | R6 | R11 | R12 | R14 | R15 |
|---|---|---|---|---|---|---|---|---|---|
| 199 | 0 | O | S | S | CH2COOH | CH3 | CH3 | H | H |
| 200 | 0 | O | S | S | CH2COOH | C2H5 | C2H5 | H | H |
| 201 | 0 | O | S | S | CH2COOH | Ph | Ph | H | H |
| 202 | 0 | O | S | S | CH2COOH | Tol | Tol | H | H |
| 203 | 0 | O | S | S | CH2COOH | C8H17 | C8H17 | H | H |
| 204 | 0 | O | S | S | C2H4COOH | CH3 | CH3 | H | H |
| 205 | 0 | O | S | S | CH2COONa | CH3 | CH3 | NHCOCH3 | OCH3 |
| 206 | 0 | O | S | S | CH2COOH | C2H4Cl | CH3 | H | H |
| 207 | 0 | O | S | S | CH2COOH | C2H5 | C2H5 | OH | H |
| 208 | 0 | O | S | S | CH2COOH | C2H5 | C2H5 | Cl | H |
| 209 | 0 | O | S | S | CH2COOH | CH3 | CH3 | CH3 | H |
| 210 | 0 | O | S | S | CH2COOH | C4H9 | C4H9 | H | H |
| 211 | 0 | O | S | S | CH2COOH | H | H | H | H |
| 212 | 0 | O | S | S | C6H4COOH | C8H17 | C8H17 | H | H |
| 213 | 0 | O | S | S | H | CH3 | CH3 | H | H |
| 214 | 0 | O | S | S | CH2COOH | C18H37 | CH3 | H | H |
| 215 | 0 | O | NH | S | CH2COOH | C2H5 | C2H5 | H | H |
| 216 | 0 | O | NC2H5 | S | CH2COOH | C2H5 | C2H5 | H | H |
| 217 | 0 | O | NC2H4COOH | S | C2H4COOH | CH3 | CH3 | H | H |
| 218 | 0 | O | NCH3 | S | C6H4COOH | C2H5 | C8H17 | H | H |
| 219 | 0 | O | NCH3 | S | CH3 | C2H5 | C2H5 | H | H |

TABLE 3-continued

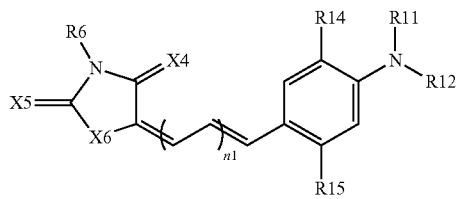

(26)

| Compound | n1 | X4 | X6 | X5 | R6 | R11 | R12 | R14 | R15 |
|---|---|---|---|---|---|---|---|---|---|
| 220 | 0 | O | NCH2COOH | S | CH3 | CH3 | CH3 | H | H |
| 221 | 0 | S | NCH3 | S | CH2COOH | C8H17 | C8H17 | H | H |
| 222 | 0 | O | O | S | CH2COOH | C2H5 | C2H5 | H | H |
| 223 | 0 | O | O | O | C6H4COOK | C2H5 | C2H5 | CH3 | H |
| 224 | 0 | O | NC6H4COOH | S | C6H4COOH | C2H5 | C2H5 | H | H |
| 225 | 1 | O | S | S | CH2COOH | CH3 | CH3 | H | H |
| 226 | 1 | O | S | S | CH2COOH | C2H5 | C2H5 | H | H |
| 227 | 1 | O | S | S | CH2COOH | Ph | Ph | H | H |
| 228 | 1 | O | S | S | CH2COOH | C18H37 | C18H37 | H | H |
| 229 | 1 | O | S | S | CH2COOH | CH3 | CH3 | H | H |
| 230 | 1 | O | NC2H5 | S | CH2COOH | C2H5 | C2H5 | H | H |
| 231 | 1 | O | NC6H4OH | S | C6H4OH | C2H4COOH | C2H4COOH | H | H |
| 232 | 1 | O | S | S | CH2COOH | C2H4OH | C2H4OH | H | H |
| 233 | 1 | O | O | S | CH2COOH | CH2CH=CH2 | CH2CH=CH2 | H | H |
| 234 | 1 | O | S | S | H | CH3 | CH3 | H | H |
| 235 | 1 | O | S | S | C3H6COOH | CH3 | CH3 | H | CH3 |
| 236 | 1 | S | S | S | CH2COOH | CH3 | CH3 | CN | H |
| 237 | 1 | O | Se | S | CH2COOH | C2H4OCH3 | C2H4OCH3 | H | H |
| 238 | 1 | NH | NH | NH | CH2COOH | CH3 | CH3 | H | H |
| 239 | 2 | O | S | S | CH2COOH | H | H | H | H |
| 240 | 2 | O | S | S | CH2COOH | H | CH3 | H | H |
| 241 | 2 | O | S | S | CH2COOH | CH3 | CH3 | H | H |
| 242 | 2 | O | S | S | CH2COOH | Ph | Ph | H | H |
| 243 | 2 | O | NCH3 | S | CH2COOH | CH3 | CH3 | H | H |
| 244 | 2 | O | O | S | C2H4COONa | CH3 | CH3 | H | CH3 |
| 245 | 3 | O | S | S | CH2COOH | CH3 | CH3 | H | H |
| 246 | 3 | O | S | S | CH2COOH | Ph | Ph | H | H |
| 247 | 3 | O | O | S | CH2OH | CH3 | CH3 | H | H |
| 248 | 3 | O | S | S | H | CH3 | CH3 | H | H |
| 249 | 4 | O | S | S | CH2COOH | CH3 | CH3 | H | H |
| 250 | 4 | O | S | S | CH2COOH | Ph | Np | H | H |
| 251 | 4 | O | NCH3 | S | H | CH3 | CH3 | H | H |
| 252 | 4 | O | O | S | CH2COOH | CH3 | CH3 | H | H |

Other examples are shown below.

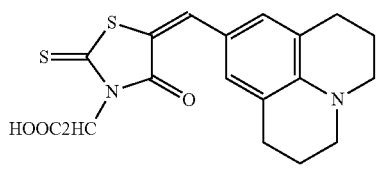

(253)

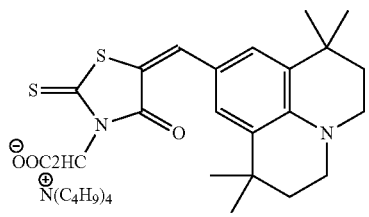

(254)

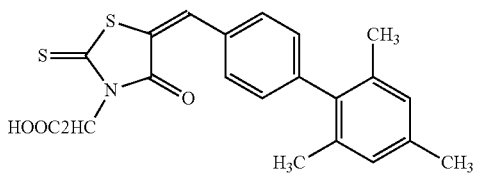

(255)

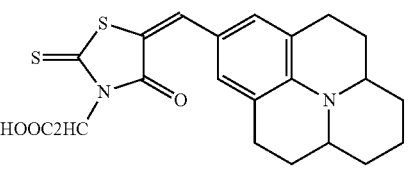

(256)

(257) (258) (259) (260) (261) (262) (263) (264) (265) (266) (267) (268) (269) (270) (271)

-continued
(272) 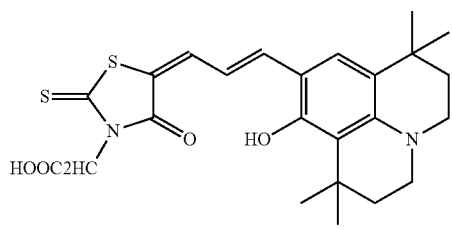
(273) 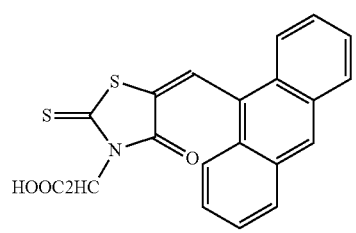
(274) 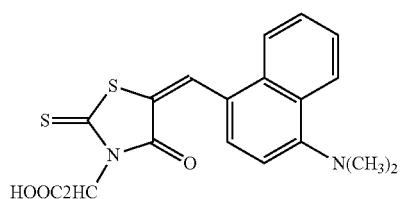
(275) 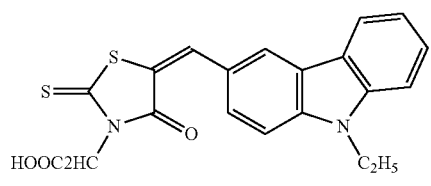
(276) 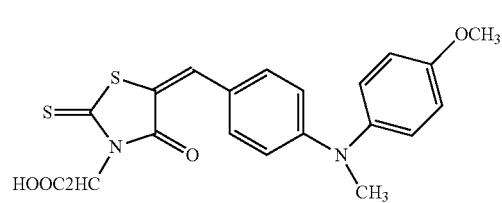
(275) 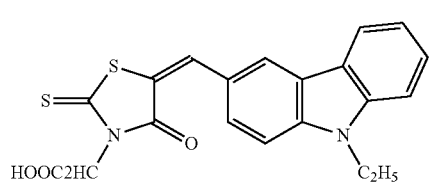
(276) 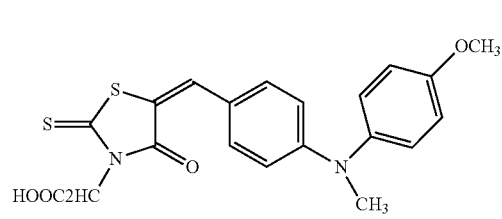
-continued
(277) 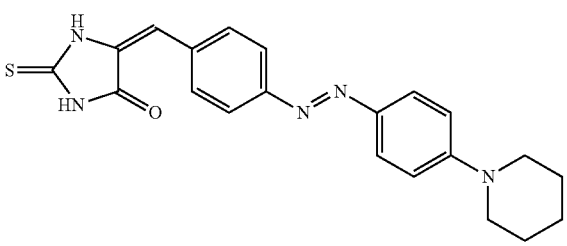
(278) 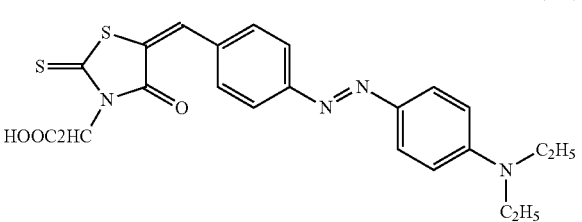
(279) 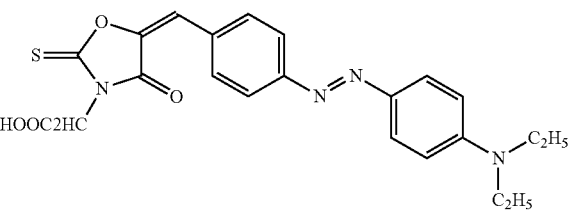
(280) 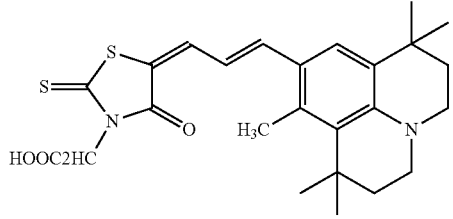
(281) 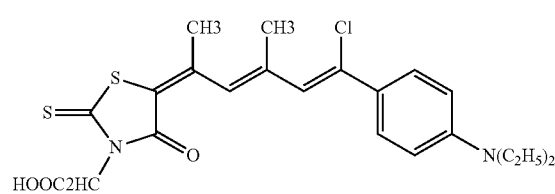
(282) 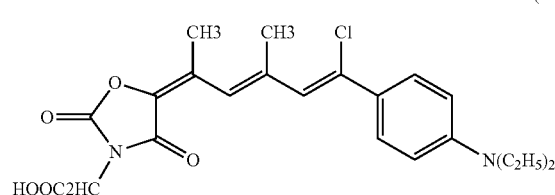
(283) 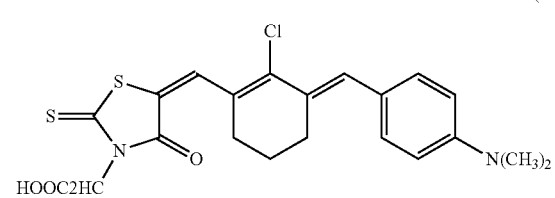

(284)
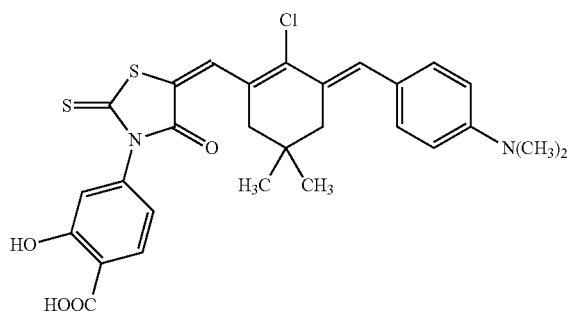
(285)
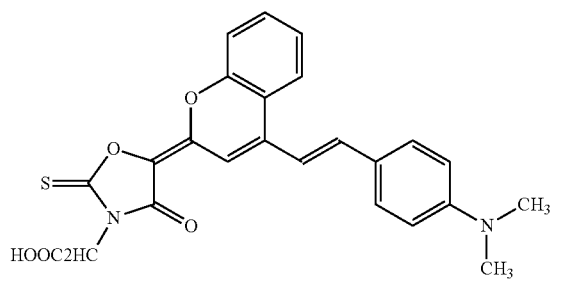
(286)
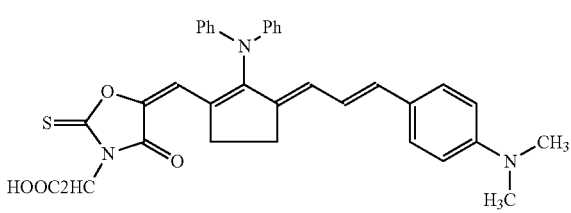
(287)
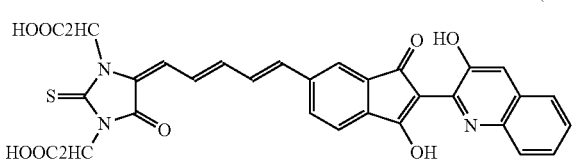
(288)
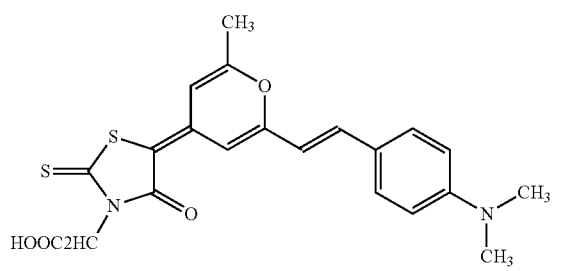
(289)
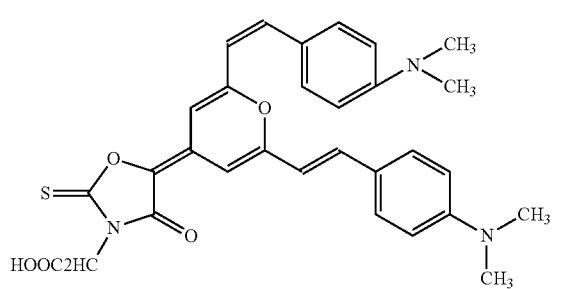
(290)
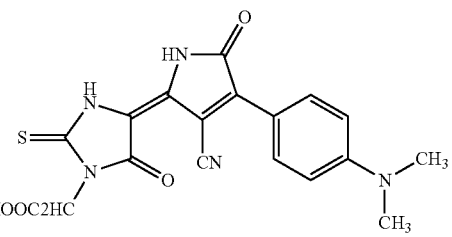
(291)
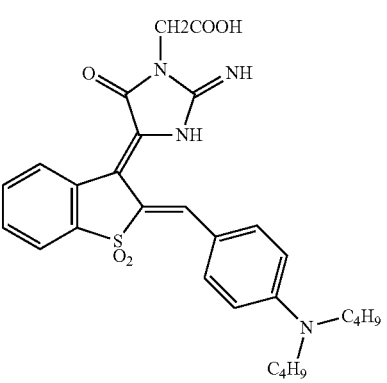
(292)
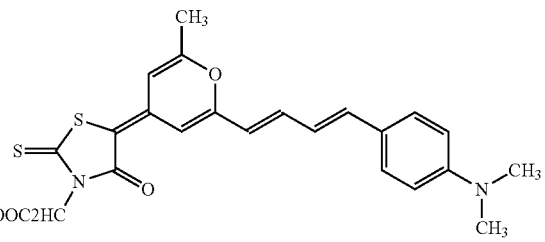
(293)
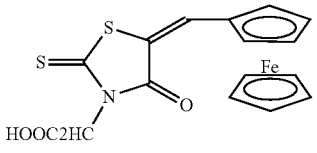
(294)
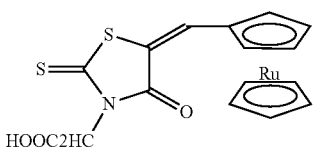
The compound, wherein Rg2 in the general formula (2) is represented by the formula (8), will be described in detail below. The compound is represented by the formula (14):
(14)
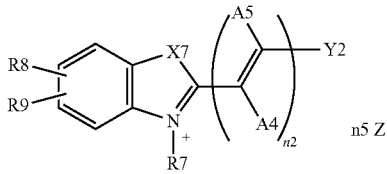
A4 and A5 of the general formula (14) independently represents the same group as mentioned for A1, A2 and A3 in the general formula (10).

Preferred examples are a hydrogen atom; a halogen atom; a cyano group; an optionally substituted alkyl group, preferably a ($C_1$-$C_4$)alkyl group; mono- or di ($C_1$-$C_4$) alkyl-substituted or a mono- or di-substituted amino group and an optionally substituted phenyl group, and more preferably is a hydrogen atom or an optionally substituted alkyl group.

Two of any A4 and A5 may be bonded to form an optionally substituted ring. In particular, when n is 2 or more; A4 and A5 are present in plural; two of any A4 and any A5 may be combined to form a ring. When the ring has substituents, the substituents are the same as those mentioned for A1, A2 and A3 of the general formula (10).

X7 represents an oxygen atom, a sulphur atom, a selenium atom, —CRR'-group, —CR=CR'-group or —NR"-group, and preferably is an oxygen atom, a sulphur atom, —CRR'-group or —CR=CR'-group.

R and R' shown in the formula independently represents a hydrogen atom or a substituent. R and R' include, but are not limited to, a hydrogen atom, an optionally substituted aliphatic hydrocarbon residue, an optionally substituted aromatic hydrocarbon residue, an optionally substituted heterocyclic residue, a cyano group, an isocyano group, a thiocyanate group, an isothiocyanate group, a nitro group, a halogen atom, a hydroxyl group, a sulfo group, a phosphoric acid group, a phosphoric acid ester group, a substituted or unsubstituted mercapto group, a substituted or unsubstituted amino group, a substituted or unsubstituted amide group, an alkoxyl group, an alkoxyalkyl group, or a substituted-carbonyl group such as a carboxyl group, a carbonamide group, an alkoxycarbonyl group and an acyl group, preferably are an hydrogen atom, an optionally substituted aliphatic hydrocarbon residue, a hydroxyl group, a sulfo group, a phosphoric acid group, an alkoxyl group, an alkoxyalkyl group, or a substituted-carbonyl group such as a carboxyl group, a carbonamide group, an alkoxycarbonyl group and an acyl group, and more preferably are a hydrogen atom, a hydroxyl group, a carboxyl group and a ($C_1$-$C_4$)alkyl group.

R" represents a hydrogen atom or an optionally substituted aliphatic hydrocarbon residue, an optionally substituted aromatic hydrocarbon residue or an optionally substituted heterocyclic residue. The above mentioned optionally substituted aliphatic hydrocarbon residue, the optionally substituted aromatic hydrocarbon residue and the optionally substituted heterocyclic residue are the same groups as mentioned for A1, A2 and A3 in the general formula (10).

The more preferred X7 is a di ($C_1$-$C_4$) alkyl-substituted methylene group or 1-carboxy-2-hydroxy-substituted vinylene group.

Y2 represents an optionally substituted aromatic hydrocarbon residue or an optionally substituted organic metal complex residue. The examples of these rings are the same groups as mentioned for Y1 in the general formula (10).

The preferred rings in Y2 are a benzene ring, a naphthalene ring, an indene ring, a phthalocyanine ring, a porphyrin ring, a ferrocene, more preferably are a benzene ring and naphthalene ring, and the most preferably a benzene ring. Further, the preferred examples of Y2 are the groups represented by the general formula (11), which are the same as mentioned above.

R7 represents a hydrogen atom, an optionally substituted aliphatic hydrocarbon residue, an optionally substituted aromatic hydrocarbon residue or an optionally substituted heterocyclic residue. R7 may be absent and a nitrogen atom may not necessarily be quaternized. The optionally substituted aliphatic hydrocarbon residue, the optionally substituted aromatic hydrocarbon residue or the optionally substituted heterocyclic residue are the same groups as mentioned for A1, A2 and A3 mentioned above. The preferable substituents are an alkyl group, an aryl group, a cyano group, a nitro group, a halogen atom, a hydroxyl group, a sulfo group, a phosphoric acid group, a phosphoric acid ester group, a substituted or unsubstituted amino group, an alkoxyl group, an alkoxyalkyl group, or a group having a carbonyl group such as a substituted or unsubstituted amide group, a carboxyl group, an alkoxycarbonyl group and an acyl group. More preferred substituents are cyano group, a halogen atom, a carboxyl group and an alkoxycarbonyl group. Preferred R7 is an optionally substituted aliphatic hydrocarbon residue, the optionally substituted aromatic hydrocarbon residue, and more preferably is an hydrogen atom, an unsubstituted ($C_1$-$C_{20}$) alkyl group and a ($C_1$-$C_{20}$) alkyl group having substituents selected from the group consisting of a hydroxy group, a carboxy group, a ($C_1$-$C_4$)alkoxy group and a sulfonic acid group, and still more preferably is a ($C_1$-$C_4$) alkyl group.

R8 represents a hydrogen atom and a substituent. The substituents include, but are not limited to, an optionally substituted aliphatic hydrocarbon residue, the optionally substituted aromatic hydrocarbon residue, the optionally substituted heterocyclic residue, a cyano group, an isocyano group, a thiocyanate group, isothiocyanate group, a nitro group, a halogen atom, a hydroxyl group, a sulfo group, a phosphoric acid group, a phosphoric acid ester group, a substituted or unsubstituted mercapto group, a substituted or unsubstituted amino group, a substituted or unsubstituted amide group, an alkoxyl group, an alkoxyalkyl group, or a substituted-carbonyl group such as a carboxyl group, a carbonamide group, an alkoxycarbonyl group and an acyl group, preferably are an optionally substituted aliphatic hydrocarbon residue, a hydroxyl group, an alkoxyl group, a halogen group, a phosphoric acid group, a phosphoric acid ester group, or a carbonyl group such as a carbonamide group, an acyl group, a carboxyl group and an alkoxycarbonyl group, and more preferably are a hydrogen atom, a hydroxyl group, a carboxyl group and an alkyl group. An optionally substituted aliphatic hydrocarbon residue, an optionally substituted aromatic hydrocarbon residue and an optionally substituted heterocyclic residue are the same groups as mentioned for A1, A2 and A3 in the general formula (10). Preferred R8 is a hydrogen atom and a hydroxy group, and generally is a hydrogen atom.

R9 represents a carboxyl group, an alkoxycarbonyl group such as a ($C_1$-$C_4$) alkoxycarbonyl group or an aryloxycarbonyl group such as a phenyloxycarbonyl group, and preferably is a carboxyl group. The compound is preferably substituted with a carboxyl group at the position shown in the general formula (15):

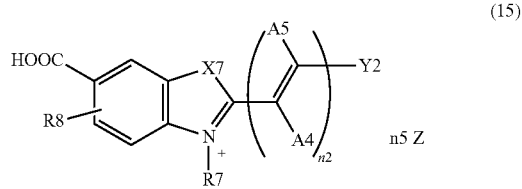

(15)

An acidic group such as a carboxyl group shown above may be form a salt such as a metallic salt with an alkaline metal such as lithium, sodium, potassium, magnesium and calcium, or an alkaline earth metal, or tetra($C_1$-$C_6$alkyl)ammonium (i.e. tetramethylammonium and tetrabutylammonium, etc.), a quaternary ($C_1$-$C_6$alkyl)ammonium salt of a nitrogen atom in 5 to 6-membered ring, such as pyridinium and imidazolinium.

n2 represents an integer from 1 to 4, preferably is from 1 to 3, and more preferably is from 1 to 2.

Further, Z represents a counter ion of which electric charge depends on that of a whole molecular. The ordinary anions are permissible for such counter ions. Specific examples thereof include, but are not limited to, $F^-$, $Cl^-$, $Br^-$, $I^-$, $ClO_4^-$, $BF_4^-$, $PF_6^-$, $SbF_6^-$, $OH^-$, $SO_4^{2-}$, $CH_3SO_4^-$, toluene sulfonic acid ion and the like, preferably are $Br^-$, $I^-$, $ClO_4^-$, $BF_4^-$, $PF_6^-$, $CH_3SO_4^-$, a toluene sulfonic acid ion, and more preferably are halogen atoms such as $Br^-$ and $I^-$. Further, instead of the counter ion, it may be neutralized by an intramolecular or intermolecular acidic group such as a carboxyl group.

n5 represents 0, ½ and 1 depending on valence of Z and the electric charge of a whole molecular.

The preferable compound represented by the formula (14) include a compound having a combination of preferable groups in groups mentioned above.

More specifically the compound is a compound having a combination of the following groups in the formula (14);

Each A4 and A5 independently represents a hydrogen atom, a $(C_1-C_4)$alkyl group, a halogen atom, a cyano group, mono- or dialkyl-substituted or phenyl-substituted amino group; when A4 or/and A5 are present in plural, and any two of those may be bonded to form a ring, the example of the ring is 5 to 6-membered aliphatic ring optionally having a $(C_1-C_4)$ alkyl group or A4 and A5 which do not form a ring, or 5 to 6-membered ring comprising a nitrogen atom; and preferably is a hydrogen atom;

X7 represents an oxygen atom, a sulphur atom, a selenium atom, —NH—, —N$(C_1-C_4)$alkyl-, —N (carboxyl-substituted $(C_1-C_4)$ alkyl)-, —C$(C_1-C_4$ alkyl$)_2$—, a vinylene group substituted with a hydroxy group and a carboxy group, preferably is —C$(C_1-C_4$ alkyl$)_2$—, and more preferably is a dimethylmethylene group or a vinylene group substituted with a hydroxy group and carboxylgroup;

Y2 is a substituted phenyl group, a substituted naphtyl group or a substituted anthranyl group, and basically the preferred groups are the same as those mentioned for Y1 in the preferred compound in the general formula (13);

examples of a substituted phenyl group include groups represented by the above general formula (11); and the examples of a substituted naphtyl group or a substituted anthranyl group include mono- or di$(C_1-C_4)$alkylamino-substituted naphtyl group or mono- or di $(C_1-C_4)$ alkylamino-substituted anthranyl group, and preferably include; the groups represented by the above general formula (11), wherein the substituent R13 on the phenyl group may be absent or present in 1 to 3, comprising 1 to 3 groups selected from the group consisting of a halogen atom, a hydroxy group, a $(C_1-C_4)$ alkyl group and a $(C_1-C_4)$ alkoxy group; or the group represented by above general formula (11), wherein R13 is combined with R11 or/and R12 to form an optionally substituted 6-membered ring, as a result, the group represented by the general formula (11), being an optionally substituted julolidino group, wherein the substituent on the julolidine ring is a $(C_1-C_4)$ alkyl group or a hydroxy group;

The more preferable Y2 is a di $(C_1-C_4)$ alkyl-substituted or diphenylamino-substituted phenyl group, a molpholinophenyl group, a julolidino group optionally substituted with a hydroxy group or a $(C_1-C_4)$ alkyl group;

R7 is a hydrogen atom, an unsubstituted $(C_1-C_{20})$ alkyl group, a $(C_1-C_{20})$ alkyl group having a substituent selected from the group consisting of a hydroxy group, a carboxy group, a $(C_1-C_4)$ alkoxy group and a sulfonic acid group, and more preferably is a $(C_1-C_4)$ alkyl group;

R8 is a hydrogen atom or a hydroxy group;

R9 is a hydrogen atom or a carboxyl group;

n2 is an integer from 1 to 4, and preferably is from 1 to 2;

Z is $Br^-$, $I^-$, $ClO_4^-$, $BF_4^-$, $PF_6^-$, $CH_3SO_4^-$, toluene sulfonic acid ion, and preferably is halogen ion such as $Br^-$ or $I^-$.

n5 is 0, ½ or 1.

The compound represented by the general formula (14) may include the structural isomers such as cis form and trans form, either of which may be used as a photosensitizing dye without any limitation.

The compound represented by the general formula (14) can be obtained by condensing the compound represented by the general formula (27) with a carbonyl derivative represented by the general formula (21) in the aprotic polor solvents such as alcohol (methanol, ethanol, isopropanol) or dimethylfolmamide, or acetic anhydride, if necessary in the presence of a basic catalyst such as sodium ethoxide, piperidine, piperazine, at 20° C. to 120° C., preferably 50° C. to 80° C.

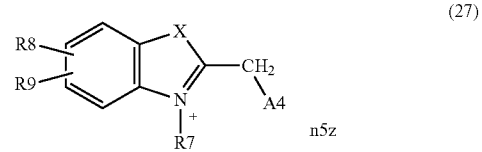

(27)

Examples of the compound are shown below. Examples of the compound represented by the general formula (28), wherein each A4 and A5 in the general formula (14) is a hydrogen atom and Y2 is 4-aminobenzen derivative, are shown in Table 4. TS in the table stands for a toluene sulfonic acid.

TABLE 4

(28)

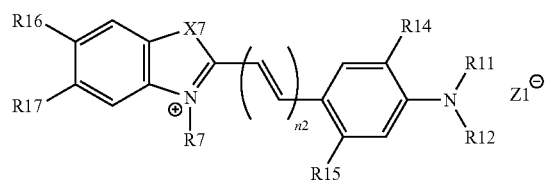

| Compound | n2 | X7 | R7 | R11 | R12 | R16 | R17 | R14 | R15 | Z1 |
|---|---|---|---|---|---|---|---|---|---|---|
| 295 | 1 | C(CH3)2 | CH3 | C2H5 | C2H5 | COOH | H | H | H | I |
| 296 | 1 | C(CH3)2 | CH3 | CH3 | CH3 | COOH | H | H | H | I |
| 297 | 1 | C(CH3)2 | C2H5 | C8H17 | C8H17 | COOH | H | H | H | I |
| 298 | 1 | C(C4H9)2 | CH3 | C2H5 | C2H5 | COOH | H | H | H | BF4 |

TABLE 4-continued (28)

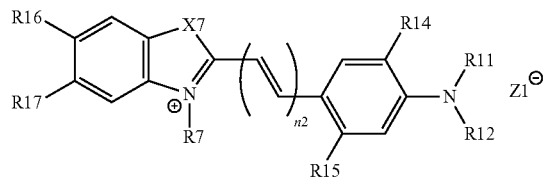

| Compound | n2 | X7 | R7 | R11 | R12 | R16 | R17 | R14 | R15 | Z1 |
|---|---|---|---|---|---|---|---|---|---|---|
| 299 | 1 | C(CH3)2 | C12H25 | C2H5 | C2H5 | COOH | OH | H | H | I |
| 300 | 1 | C(CH3)2 | — | C2H5 | C2H5 | COOH | H | H | H | — |
| 301 | 1 | S | CH3 | C2H5 | C2H5 | COOH | H | H | H | TS |
| 302 | 1 | O | C12H25 | C2H5 | C2H5 | COOC2H5 | H | H | H | I |
| 303 | 1 | NH | CH3 | C2H5 | C2H5 | COOH | H | H | H | I |
| 304 | 1 | NC2H5 | CH3 | C2H5 | C2H5 | COOPh | H | H | H | I |
| 305 | 1 | NCH3 | — | C2H5 | C2H5 | COOH | H | H | H | — |
| 306 | 1 | CH=CH | CH3 | C2H5 | C2H5 | COOH | H | H | H | I |
| 307 | 1 | CH=CH | — | C2H5 | C2H5 | COOH | H | H | H | — |
| 308 | 1 | N-Ph | CH3 | C2H5 | C2H5 | COOCH3 | OH | H | H | I |
| 309 | 1 | Se | C8H17 | C2H5 | C2H5 | COONa | H | H | H | I |
| 310 | 1 | C(CH3)2 | CH3 | Ph | Ph | COOH | H | H | H | I |
| 311 | 1 | C(CH3)2 | CH3 | C2H5 | C2H5 | COO— | H | H | H | — |
| 312 | 1 | C(CH3)2 | CH3 | C2H5 | C2H5 | COOH | H | H | OH | I |
| 313 | 1 | C(CH3)2 | C2H4OH | H | H | COOH | COOH | H | H | I |
| 314 | 1 | C(CH3)2 | C2H4COOH | Tol | Tol | COOH | H | H | H | I |
| 315 | 1 | C(CH3)2 | CH3 | C4H9 | C4H9 | COOH | H | H | H | I |
| 316 | 1 | C(CH3)2 | CH3 | CH3 | C2H4Cl | COOH | H | H | H | I |
| 317 | 1 | C(CH3)2 | CH3 | C2H5 | C2H5 | COOH | H | H | Cl | I |
| 318 | 1 | C(CH3)2 | CH3 | CH3 | CH3 | COOH | H | H | CH3 | I |
| 319 | 1 | C(CH3)2 | CH3 | C2H5 | C2H5 | COOH | H | OCH3 | NHCOCH3 | I |
| 320 | 1 | C(CH3)2 | CH3 | C2H5 | Tol | COOH | H | H | CH3 | I |
| 321 | 1 | S | CH3 | C2H5 | Tol | COOH | H | H | OCH3 | I |
| 322 | 1 | C(CH3)2 | CH3 | C2H5 | C2H5 | COOH | H | CH3 | CH3 | I |
| 323 | 1 | C(CH3)2 | CH3 | C2H5 | C2H5 | COOH | H | F | F | I |
| 324 | 1 | C(CH3)2 | CH3 | C2H5 | C2H5 | COOH | H | Cl | Cl | I |
| 325 | 1 | C(CH3)2 | CH3 | C2H5 | C2H5 | COOH | H | Br | Br | I |
| 326 | 1 | C(CH3)2 | CH3 | C2H5 | C2H5 | COOH | H | I | I | I |
| 327 | 1 | C(CH3)2 | CH3 | C2H4CN | C2H4CN | COOH | H | H | H | I |
| 328 | 1 | C(CH3)2 | CH3 | C2H4OH | C2H4OH | COOH | H | H | H | $1/2SO_4^{2}$ |
| 329 | 1 | C(CH3)2 | CH3 | CH2Ph | CH2Ph | COOH | H | H | H | I |
| 330 | 2 | C(CH3)2 | C18H37 | C2H5 | C2H5 | COOH | H | H | H | PF4 |
| 331 | 2 | C(CH3)2 | CH3 | Ph | Ph | COOH | H | H | H | I |
| 332 | 2 | O | CH3 | Tol | Tol | COOLi | H | H | H | I |
| 333 | 2 | C(CH3)2 | CH3 | CH3 | CH3 | COOH | H | H | H | I |
| 334 | 2 | C(CH3)2 | CH3 | C2H5 | C2H5 | COOH | Cl | H | H | I |
| 335 | 2 | Se | CH3 | C2H5 | C2H5 | COO— | H | CH3 | H | — |
| 336 | 2 | C(CH3)2 | CH3 | C2H4COOH | C2H4COOH | COOH | H | H | H | I |
| 337 | 2 | C(CH3)2 | CH3 | C2H5 | C2H4COOCH3 | COOH | H | H | H | I |
| 338 | 2 | C(CH3)2 | CH3 | C2H4COO | C2H5CH3 | COOH | H | H | H | I |
| 339 | 2 | S | CH3 | C2H5 | C2H5 | COOH | H | H | H | I |
| 340 | 2 | NH | CH3 | C2H5 | C2H5 | COOH | H | H | H | I |
| 341 | 2 | CH=CH | CH3 | C2H5 | C2H5 | COOH | H | H | H | I |
| 342 | 3 | C(CH3)2 | CH3 | CH3 | CH3 | COOH | H | H | H | I |
| 343 | 3 | C(CH3)2 | CH2OCH3 | Ph | Ph | COOH | H | H | H | ClO4 |
| 344 | 3 | C(CH3)2 | C3H7 | C2H5 | C2H5 | COOH | H | H | H | I |
| 345 | 3 | S | CH3 | C2H5 | C2H5 | COOH | H | H | H | I |
| 346 | 3 | OO | C4H9 | CH3 | CH3 | COOK | H | OCH3 | H | I |
| 347 | 4 | C(CH3)2 | CH3 | CH3 | CH3 | COOH | H | H | H | I |
| 348 | 4 | C(CH3)2 | CH3 | C2H5 | C2H5 | COOH | H | H | H | ClO4 |
| 349 | 4 | S | C12H25 | C2H5 | C2H5 | COOH | OH | H | H | TS |
| 350 | 4 | O | CH3 | C2H5 | C2H5 | COOH | H | CH3 | H | I |

Other examples are shown below.
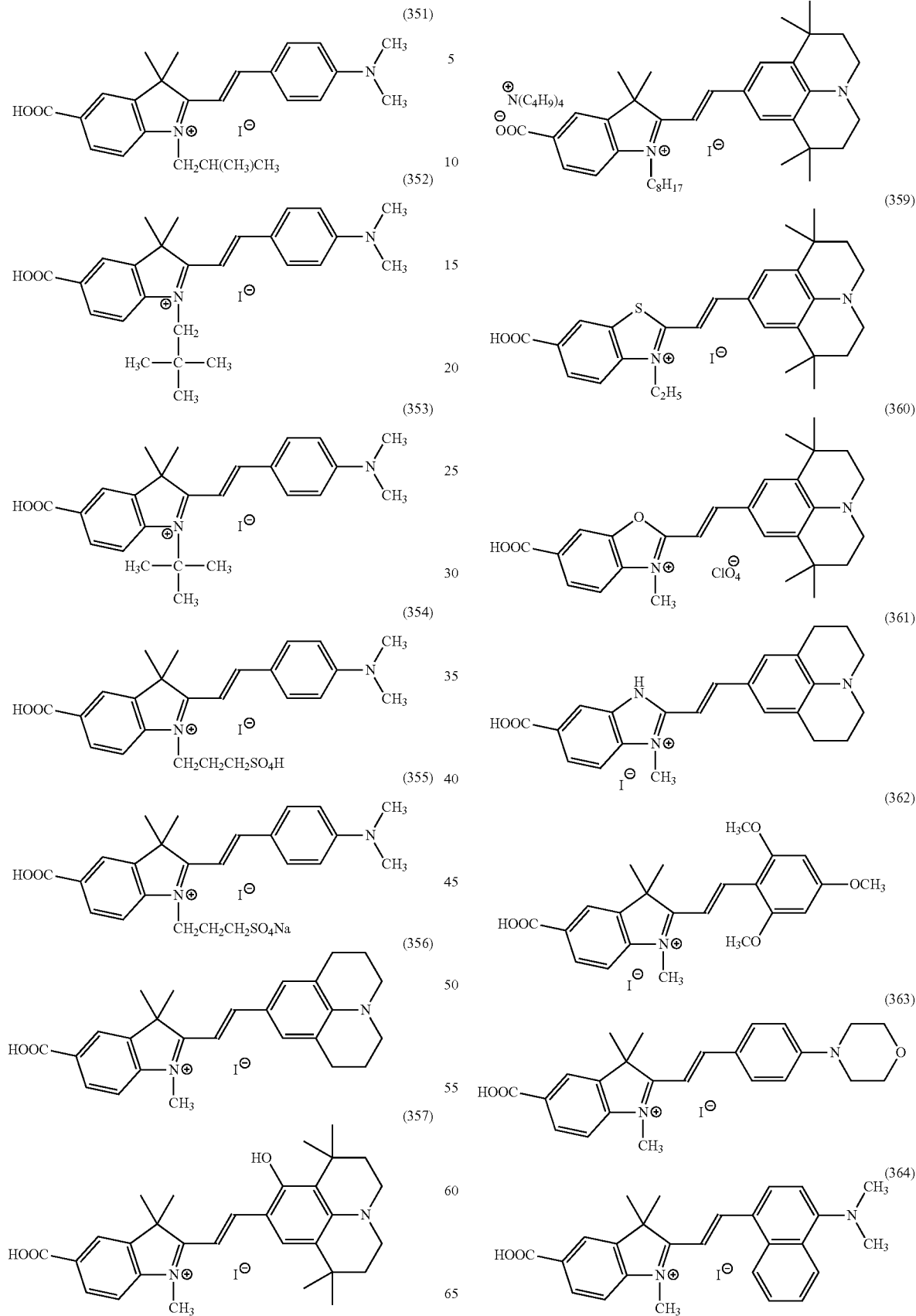

-continued
(365) 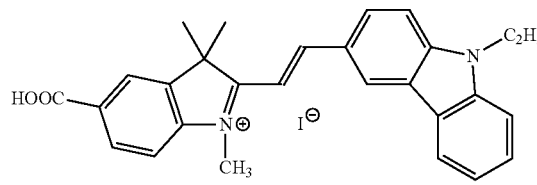
(366) 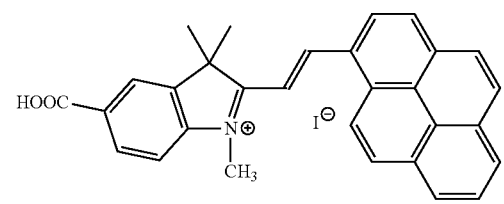
(367) 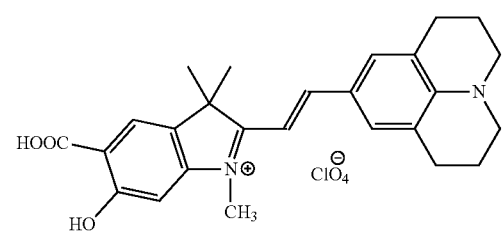
(368) 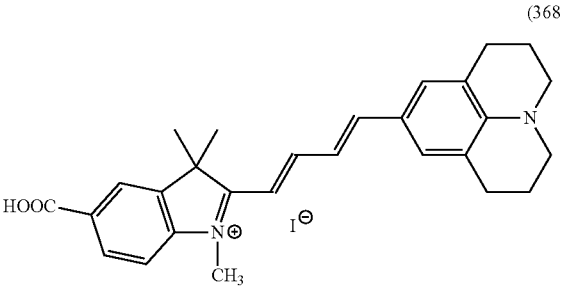
(369) 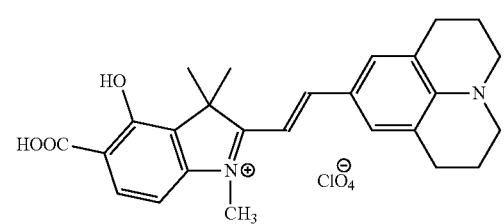
(370) 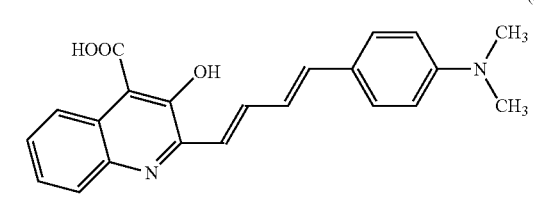
(371) 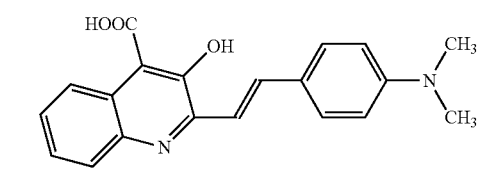
-continued
(372) 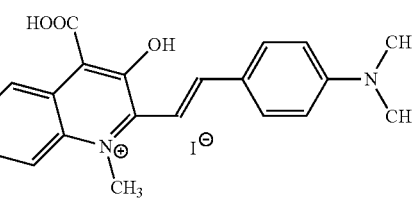
(373) 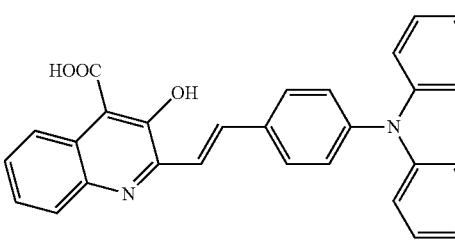
(374) 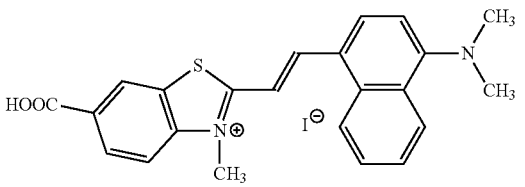
(375) 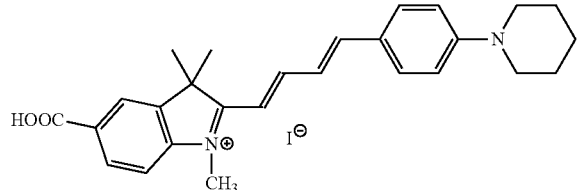
(376) 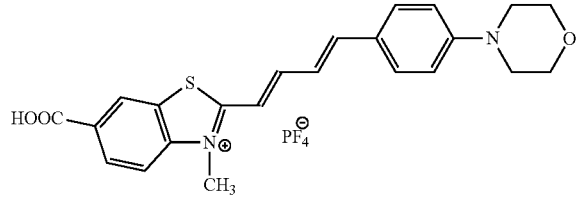
(377) 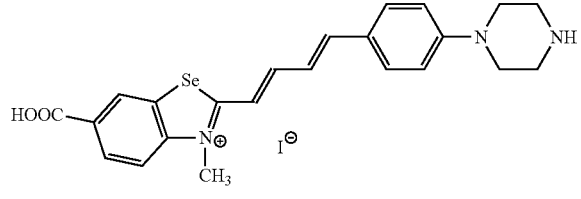
(378)

-continued
(379) 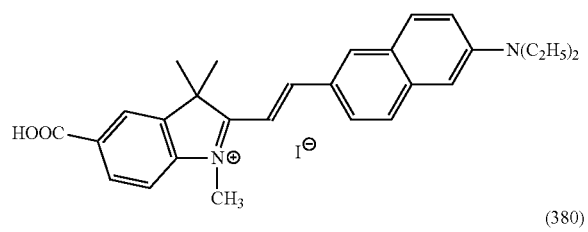
(380) 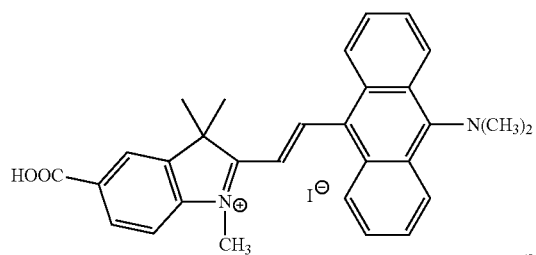
(381) 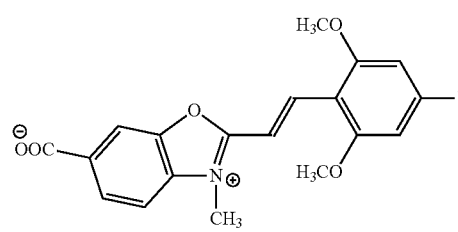
(382) 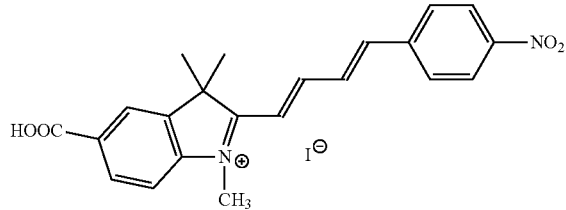
(383) 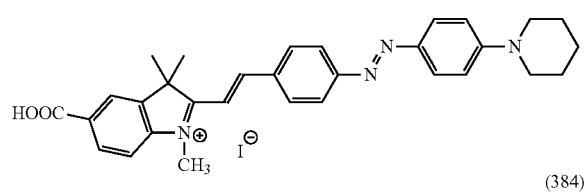
(384) 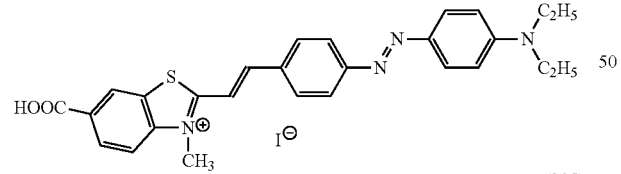
(385) 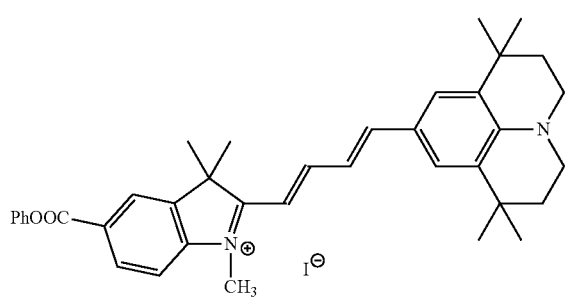
-continued
(386) 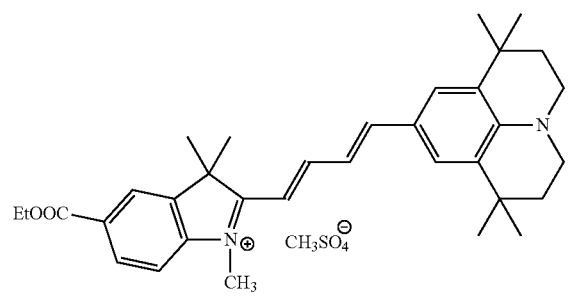
(387) 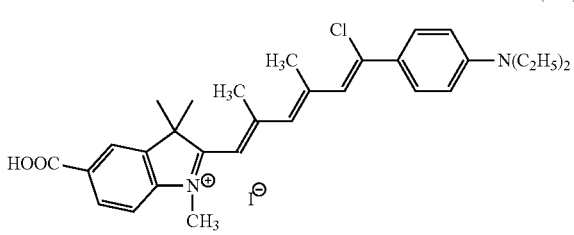
(388) 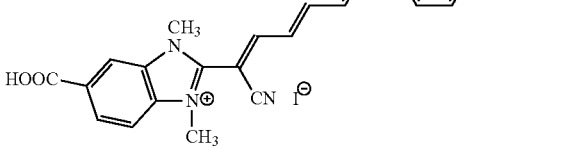
(389) 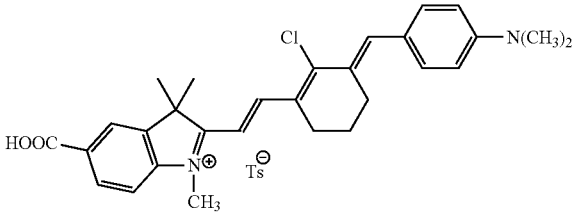
(390) 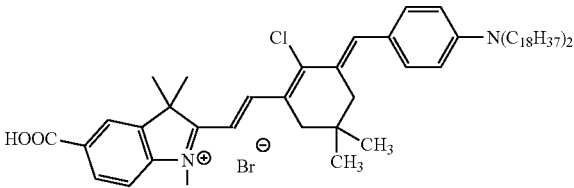
(391) 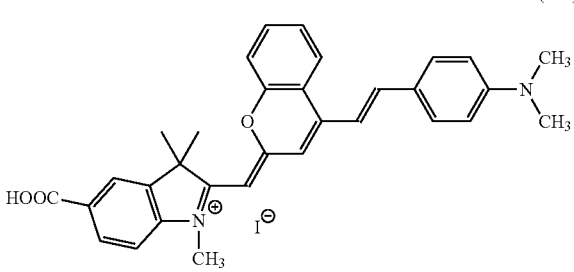

-continued (392)
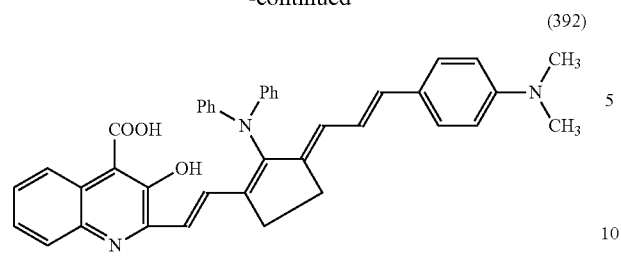

(393)
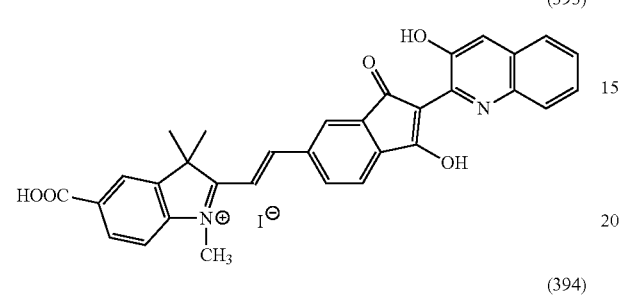

(394)
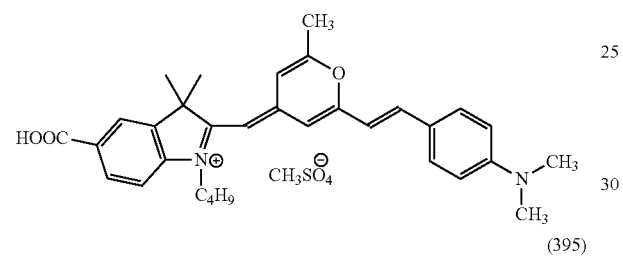

(395)
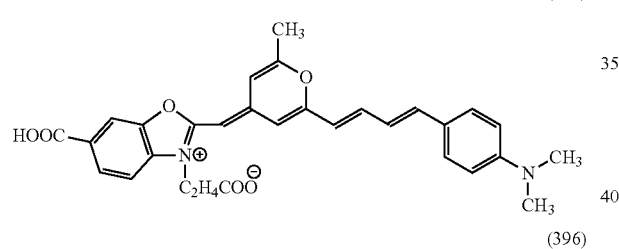

(396)
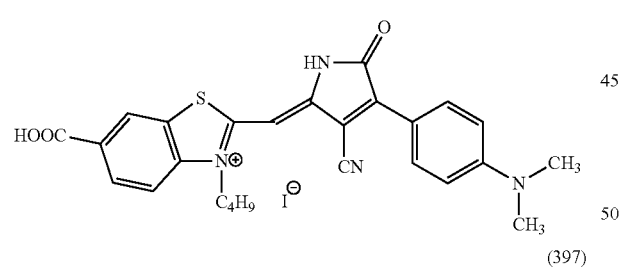

(397)
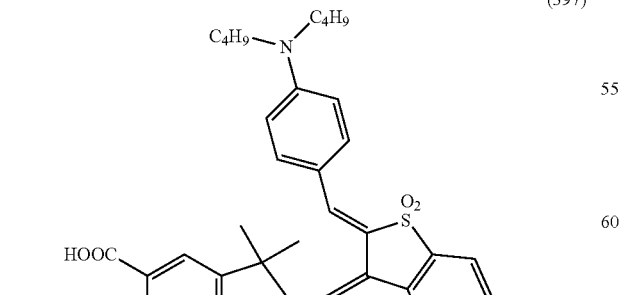

-continued (398)
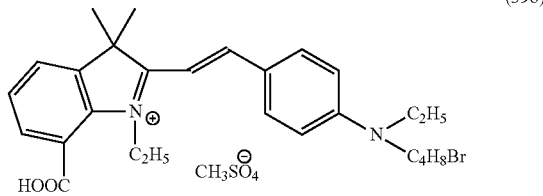

(399)
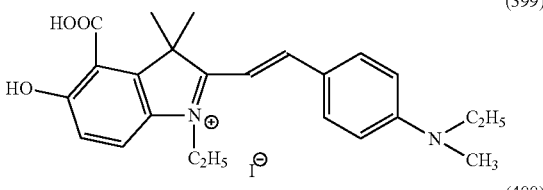

(400)
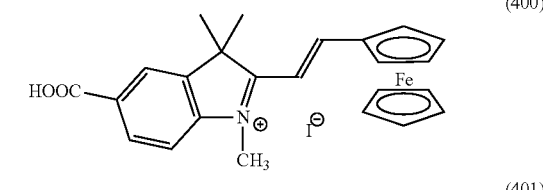

(401)
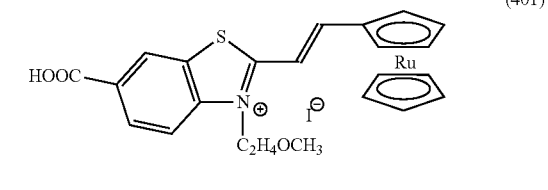

The compound, wherein Rg3 in the general formula (3) is represented by the formula (9), will be described in detail below. The compound is represented by the formula (16):

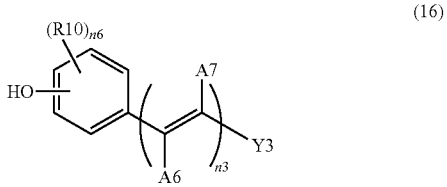
(16)

In the general formula (16), A6 and A7 each includes the same group as mentioned for A1, A2 and A3 in the general formula (10). The preferred examples thereof are also basically the same. The preferred examples include a hydrogen atom, a halogen atom, an optionally substituted alkyl group, an optionally substituted phenyl group, a cyano group, and more preferably are a hydrogen atom, an optionally substituted alkyl group or a cyano group. Any two of A6 and A7 may be bonded to form an optionally substituted ring. Particularly, when n3 is 2 or more; A6 and A7 are present in plural; two of any A6 and any A7 may be combined to form a ring. When the ring has substituents, examples are the same as those mentioned for A1, A2 and A3 in the general formula (10).

Y3 represents a cyano group, an optionally substituted aromatic hydrocarbon residue, an optionally substituted heterocyclic residue (excluding the groups as shown in the above formulae (5) to (8)) or an optionally substituted organic metal complex residue. Examples of an optionally substituted aromatic hydrocarbon and an optionally substituted organic metal complex residue are the same as those mentioned for Y1 in the general formula (10). The heterocyclic residue in an optionally substituted heterocyclic residue means a group formed by removing one hydrogen atom from a heterocyclic compound. Examples of the groups (excluding the groups in the formulae (5) to (8)) are the same as those mentioned for A1, A2 and A3 in the general formula (10). Those include the groups formed by removing one hydrogen atom from a heterocyclic compounds such as pyridine, pyrazine, piperidine, morpholine, indoline, thiophene, furan, oxazole, thiazole, indole, benzothiazole, benzoxazole, quinoline, pyrimidine, pyrazole, pyrazolidine, thiazolidine, oxazolidine, pyran, chromen(e), coumarin, pyrrole, benzimidazole, imidazoline, imidazolidine, imidazole, pyrazole, triazole, triazine, diazole, triazine, naphthothiazole, naphthoxazole, quinazoline and carbazole. Those groups may optionally be polycyclic rings (condensed-ring) or hydrogenated.

The preferred rings in Y3 include a benzene ring, a naphthalene ring, an indene ring, a pyridine ring, a pyrazine ring, a pyrimidine ring, a quinoline ring, a thiophene ring, an indolenine ring, a benzoindolenine ring, a pyrazole ring, a pyrazolidine ring, a thiazole ring, thiazolidine ring, a benzothiazole ring, an oxazole ring, an oxazolidine ring, a benzoxazole ring, a pyran ring, a chromen(e) ring, a pyrrole ring, an imidazole ring, a benzimidazole ring, an imidazoline ring, an imidazolidine ring, an indole ring, a carbazole ring, a phthalocyanine ring, a porphyrin ring, a ferrocene, each of those may be hydrogenated. More preferred are a benzene ring, a naphthalene ring, an indene ring, an indolenine ring, a benzoindolenine ring, an imidazole ring, a benzimidazole ring, an oxazole ring, a benzoxazole ring, a thiazole ring, a benzothiazole ring, a coumarine ring, a pyridine ring, a quinoline ring and each of those may optionally have a substituent on a ring. The substituents that Y3 may have are the same as those which mentioned for the substituents on an aliphatic hydrocarbon residue, an aromatic hydrocarbon residue or a heterocyclic residue. When such substituents are an oxygen atom or a sulphur atom, Y3 may form a cyclic ketone or a cyclic thioketone. The preferred substituents include an optionally substituted amino group, an alkyl group, an alkoxyl group, an acetyl group, a hydroxyl group, a halogen atom, kethone, thioketone, and more preferably include an optionally substituted amino group, an alkyl group, an alkoxyl group, kethone, thioketone.

Further, when Y3 is a heterocycle or the like, it may be quaternarized and, that time, have an ordinary anion as a counter ion without any limitation. Specific examples thereof include $F^-$, $Cl^-$, $Br^-$, $I^-$, $ClO_4^-$, $BF_4^-$, $PF_6^-$, $OH^-$, $SO_4^{2-}$, $CH_3SO_4^-$, toluene sulfonic acid, and preferably are $Br^-$, $I^-$, $ClO_4^-$, $BF_4^-$, $PF_6^-$, $CH_3SO_4^-$ and a toluene sulfonic acid. Further, instead of a counter ion, the heterocycle may be neutralized by an intramolecular or intermolecular acidic group such as a carboxyl group.

Preferable Y3 includes a cyano group; a group corresponding to Y3 in the general formula (31) shown below; a pyridyl group wherein a nitrogen atom thereof may optionally be quaternarizedby $(C_1$-$C_{10})$ alkyl group; a quinolyl group wherein a nitrogen atom thereof may optionally be quaternarized by $(C_1$-$C_{10})$ alkyl group; a hydroxy group; a benzoquinol group wherein a nitrogen atom thereof may optionally be quaternarized by $(C_1$-$C_{10})$alkyl group; a naphthoquinol group wherein a nitrogen atom thereof may optionally be quaternarized by $(C_1$-$C_{10})$alkyl group; a benzopyrrole group wherein a nitrogen atom thereof may optionally be quaternarized by $(C_1$-$C_{10})$ alkyl group (a pyrrole ring thereof may optionally be substituted with $(C_1$-$C_4)$alkyl group); a naphthopyrrole group wherein a nitrogen atom thereof may optionally be quaternarized by $(C_1$-$C_{10})$ alkyl group (a pyrrole ring thereof may optionally be substituted with $(C_1$-$C_4)$ alkyl group); a coumarino group (which may optionally be substituted with mono- or di $(C_1$-$C_4)$ alkyl-substituted amino group and/or a $(C_1$-$C_4)$alkyl group).

R10 represents a carboxyl group or a hydroxyl group, and when present in plural, each of them may be the same or different. A hydroxyl group is preferably substituted at para position to the methine group attached to a benzene ring. A carboxyl group or a hydroxyl group of R10 is preferred to be placed at meta position to the methine group attached to a benzene ring.

The compounds represented by the general formula (16) and (17) may form salts. Examples of salts include metallic salts of a hydroxyl group or a carboxyl group in the general formulae with the alkaline metals such as lithium, sodium, potassium, magnesium and calcium or the alkaline earth metal; or salts such as quaternary ammonium salts thereof with the organic base such as a tetramethylammonium, a tetrabutylammonium, a pyridinium and an imidazolium.

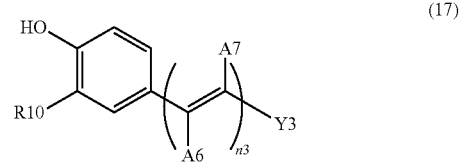

(17)

wherein, A6, A7, n3, Y3 and R10 are the same as mentioned in the general formula (16).

n3 is an integer from 1 to 4, and preferably is 1 to 3.

Preferred compound of the general formula (16) includes the compound represented by the above general formula (17), wherein the compound is represented by the general formula (31) shown below; or the compound of the above general formula (17) wherein, R10 is a carboxyl group or a hydroxyl group;

A6 and A7 are a hydrogen atom or a cyano group;

n3 is an integer from 1 to 4, and preferably is 1;

Y3 is a cyano group, a pyridyl group wherein a nitrogen atom thereof may optionally be quaternarized by $(C_1$-$C_{10})$ alkyl group, a quinolyl group wherein a nitrogen atom thereof may optionally be quaternarized by $(C_1$-$C_{10})$alkyl group, a hydroxy group, a benzoquinol group wherein a nitrogen atom thereof may optionally be quaternarized by $(C_1$-$C_{10})$alkyl group, a naphthoquinol group wherein a nitrogen atom thereof may optionally be quaternarized by $(C_1$-$C_{10})$ alkyl group, a coumarino group (which may optionally be substituted with mono- or di $(C_1$-$C_4)$ alkyl-substituted amino group and/or a $(C_1$-$C_4)$alkyl group), and preferably are a cyano group and a pyridyl group wherein a nitrogen atom thereof may optionally be quaternarized by $(C_1$-$C_{10})$alkyl group.

Further preferred compound of the general formula (16) is the compound represented by the general formula (31) shown below wherein, R10 is a hydroxyl group or a carboxyl group;

n3 is 1;

X8 is an oxygen atom, a sulphur atom, a dimethylethylene group and a vinylene group;

R18 is absent or a $(C_1$-$C_4)$alkyl group;

R19 is a hydrogen atom, a halogen atom or a carboxyl group;

Z2 is absent or a halogen ion or a methylsulfuric acid ion; or the compound of the above general formula (17) wherein, R10 is a carboxyl group or a hydroxyl group;

A6 and A7 are a hydrogen atom or a cyano group;

n3 is 1;

Y3 is a cyano group, a pyridyl group wherein a nitrogen atom thereof may optionally be quaternarized by $(C_1$-$C_{10})$ alkyl group.

Those compounds may include the structural isomers such as cis form and trans form, either of which may favorably be used without any limitation.

The compound represented by the general formula (1) can be obtained by condensing a phenol derivative with a derivative having an active methylene group represented by the general formula (30) in the aprotic polar solvents such as alcohol (methanol, ethanol and isopropanol, etc.) and dimethylfolmamide, or acetic anhydride, if necessary in the presence of a basic catalyst such as sodium ethoxido, piperidine and piperazine, at 20° C. to 120° C., preferably at about 50° C. to 80° C.

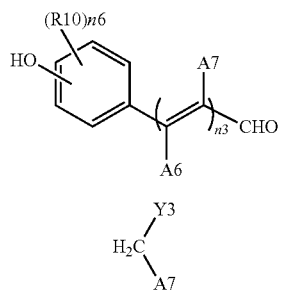

(29)

(30)

Examples of the compound are shown below. As a compound wherein A6 and A7 independently is a hydrogen atom and Y3 is a heterocyclic ring, the examples of the compound represented by the general formula (31) are shown in Table 5. "Carboxylic acid free" means a state that the carboxylic acid group in a salicylic acid is free as a counter ion for quaternary ammonium salt.

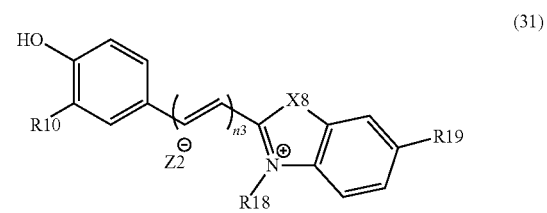

(31)

wherein, R10, n3 are the same as mentioned in the formula (16);

X8 is the same group as mentioned in X7 of the general formula (14);

R18 is absent or a $C_1$-$C_{20}$alkyl group (which may be substituted with a ($C_1$-$C_4$)alkoxyl group, a carboxyl group);

R19 is a hydrogen atom, a halogen atom, a carboxyl group, a ($C_1$-$C_4$)alkoxyl group, mono- or dialkylamino group;

Z2 is absent or the same anion as mentioned in the general formula (14).

TABLE 5

| Compound | n | R10 | X8 | R18 | R19 | Z2 |
|---|---|---|---|---|---|---|
| 402 | 1 | COOH | C(CH3)2 | CH3 | H | I |
| 403 | 1 | COOH | C(CH3)2 | C2H5 | H | ClO4 |
| 404 | 1 | COOH | C(CH3)2 | C8H17 | H | — (Carboxylic acid free) |
| 405 | 1 | COOH | C(CH3)2 | C18H37 | H | I |
| 406 | 1 | COOH | C(CH3)2 | CH3 | COOH | I |
| 407 | 1 | COOH | S | C2H5 | H | PF6 |
| 408 | 1 | COOH | S | CH3 | Cl | CH3SO4 |
| 409 | 1 | COOH | S | CH3 | H | —(Carboxylic acid free) |
| 410 | 1 | COOH | O | CH2COOH | H | SbF6 |
| 411 | 1 | COOH | CH═CH | C2H5 | H | I |
| 412 | 1 | COOH | CH═CH | C2H5 | H | — (Carboxylic acid free) |
| 413 | 1 | COOH | Se | C2H4OCH3 | H | ClO4 |
| 414 | 2 | COOH | C(CH3)2 | CH3 | H | — (Carboxylic acid free) |
| 415 | 2 | COOH | C(CH3)2 | C8H17 | H | I |
| 416 | 2 | COOH | S | C2H5 | H | PF6 |
| 417 | 2 | COOH | S | CH3 | OCH3CH3 | SO4 |
| 418 | 2 | COOH | O | C2H5 | H | SbF6 |
| 419 | 2 | COOH | CH═CH | C2H5 | H | I |
| 420 | 3 | COOH | C(CH3)2 | CH3 | H | I |
| 421 | 3 | COOH | S | C2H5 | H | PF6 |
| 422 | 3 | COOH | O | C2H5 | H | SbF6 |
| 423 | 4 | COOH | C(CH3)2 | CH3 | H | — (Carboxylic acid free) |
| 424 | 4 | COOH | C(CH3)2 | C18H37 | CH3 | I |
| 425 | 4 | COOH | S | C2H5 | H | PF6 |
| 426 | 4 | COOH | O | C2H5 | H | SbF6 |
| 427 | 4 | COOH | CH═CH | C2H5 | H | I |
| 428 | 1 | OH | C(CH3)2 | CH3 | H | I |
| 429 | 1 | OH | C(CH3)2 | C2H5 | H | ClO4 |
| 430 | 1 | OH | C(CH3)2 | C18H37 | H | I |
| 431 | 1 | OH | C(CH3)2 | CH3 | COOH | I |
| 432 | 1 | OH | S | C2H5 | H | PF6 |
| 433 | 1 | OH | S | CH3 | Cl | CH3SO4 |
| 434 | 1 | OH | O | CH2COOH | H | SbF6 |
| 435 | 1 | OH | CH═CH | C2H5 | H | I |
| 436 | 1 | OH | Se | C2H4OCH3 | H | ClO4 |
| 437 | 2 | OH | C(CH3)2 | C8H17 | H | I |
| 438 | 2 | OH | S | C2H5 | H | PF6 |
| 439 | 2 | OH | S | CH3 | OCH3 | CH3SO4 |
| 440 | 2 | OH | O | C2H5 | H | SbF6 |
| 441 | 2 | OH | CH═CH | C2H5 | H | I |
| 442 | 3 | OH | C(CH3)2 | CH3 | H | I |
| 443 | 3 | OH | S | C2H5 | H | PF6 |

TABLE 5-continued
| Compound | n | R10 | X8 | R18 | R19 | Z2 |
|---|---|---|---|---|---|---|
| 444 | 3 | OH | O | C2H5 | H | SbF6 |
| 445 | 4 | OH | C(CH3)2 | C18H37 | CH3 | I |
| 446 | 4 | OH | S | C2H5 | H | PF6 |
| 447 | 4 | OH | O | C2H5 | H | SbF6 |
| 448 | 4 | OH | CH=CH | C2H5 | H | I |
Other examples are shown below.
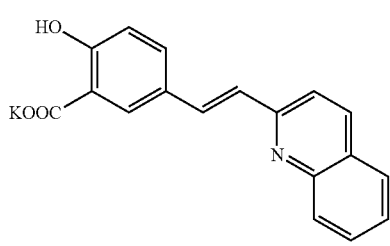
(449)
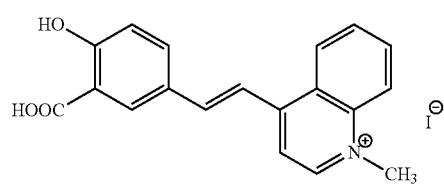
(450)
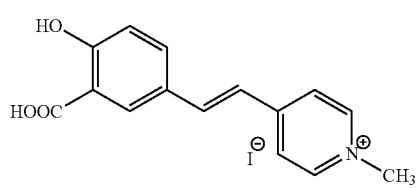
(451)
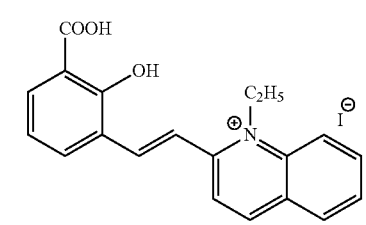
(452)
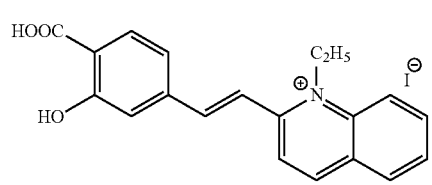
(453)
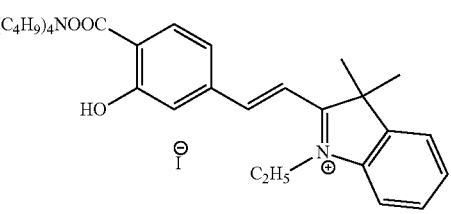
(454)
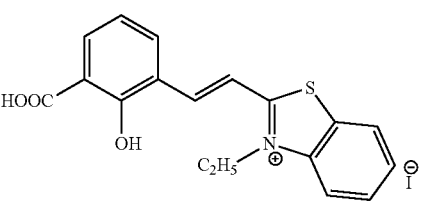
(455)
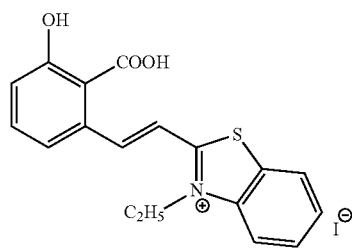
(456)
(457)
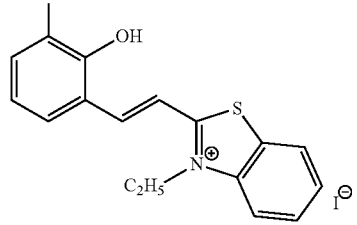
(458)
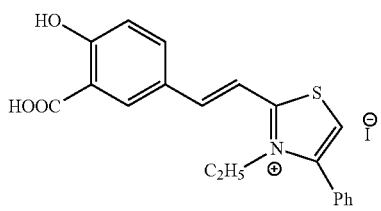
(459)
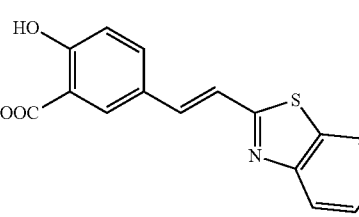
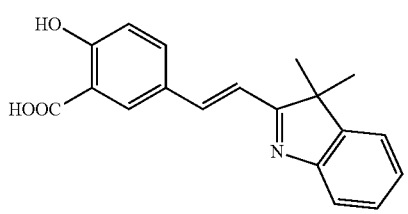
(460)

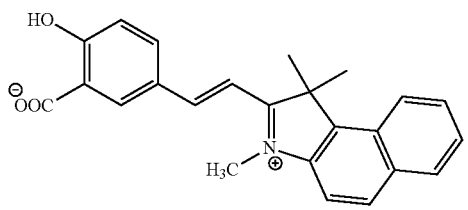
(461)
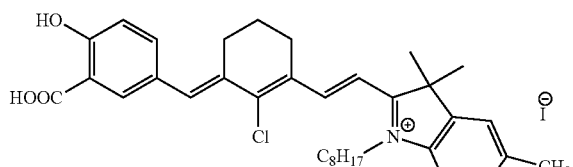
(462)
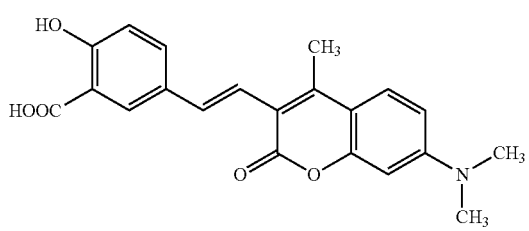
(463)
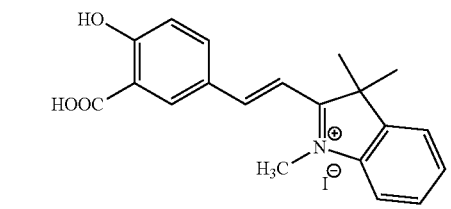
(464)
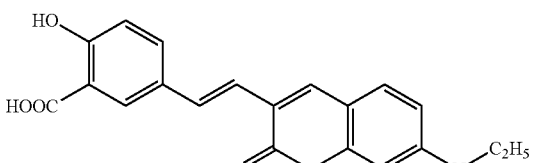
(465)
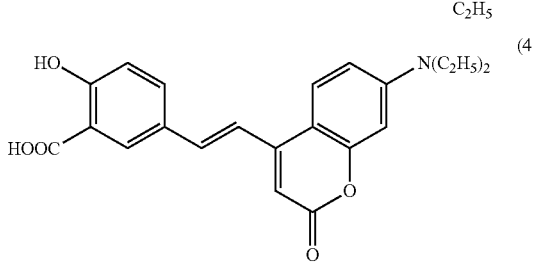
(466)
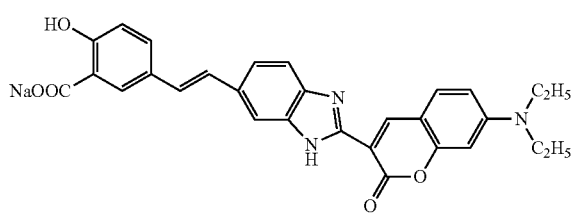
(467)
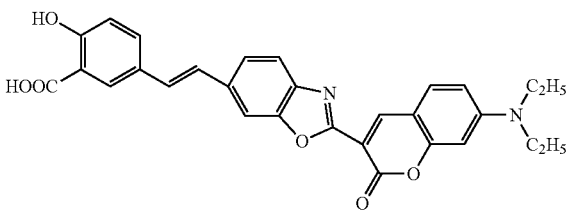
(468)
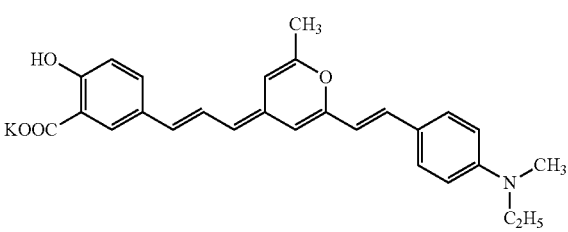
(469)
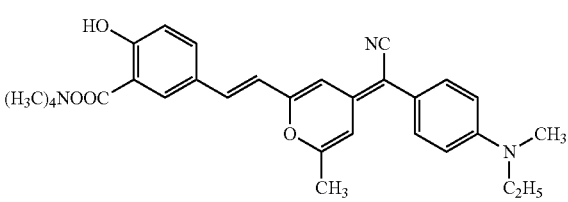
(470)
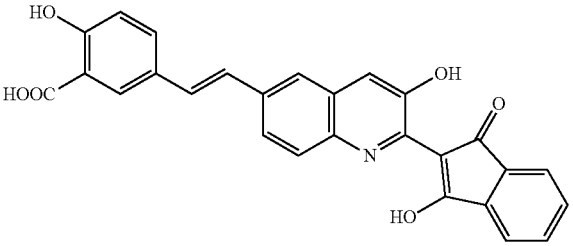
(471)
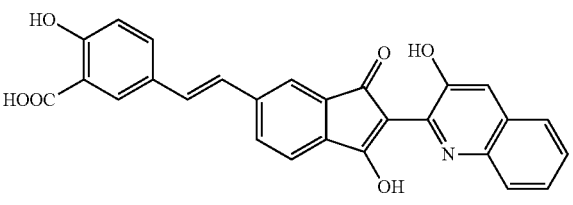
(472)
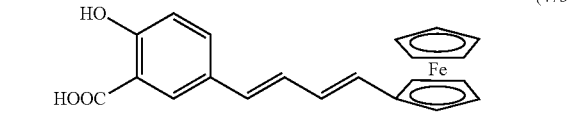
(473)
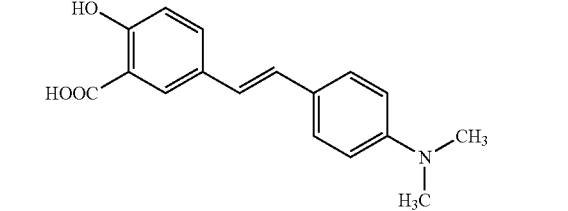
(474)

(475) 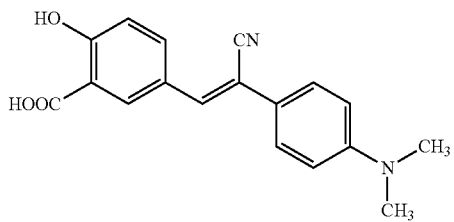
(476) 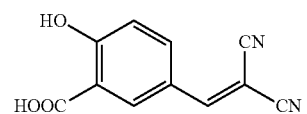
(477) 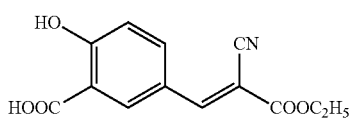
(478) 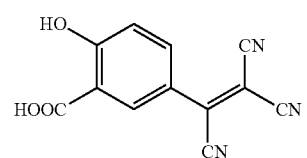
(479) 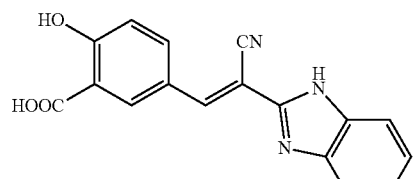
(480) 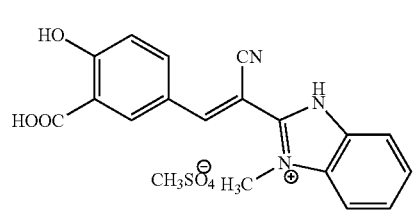
(481) 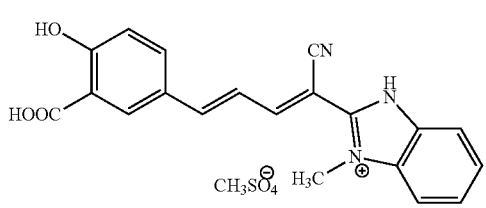
(482) 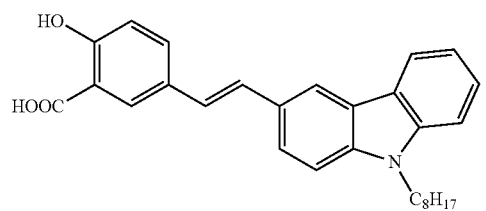
(483) 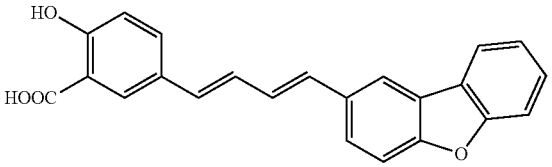
(484) 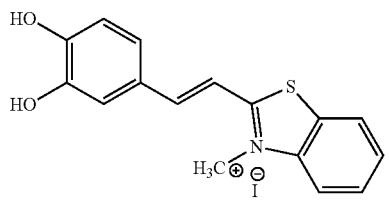
(485) 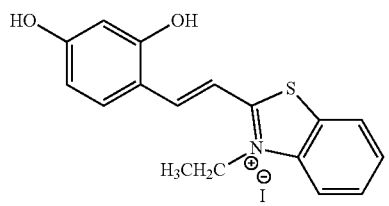
(486) 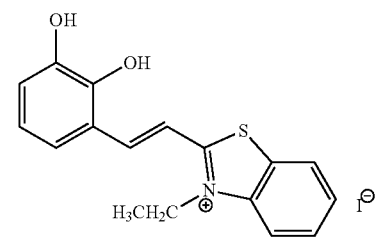
(487) 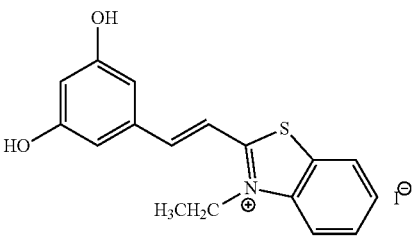
(488) 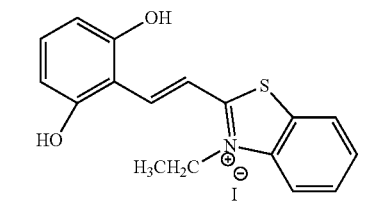
(489) 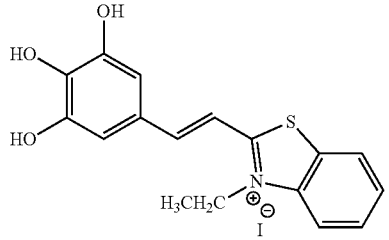

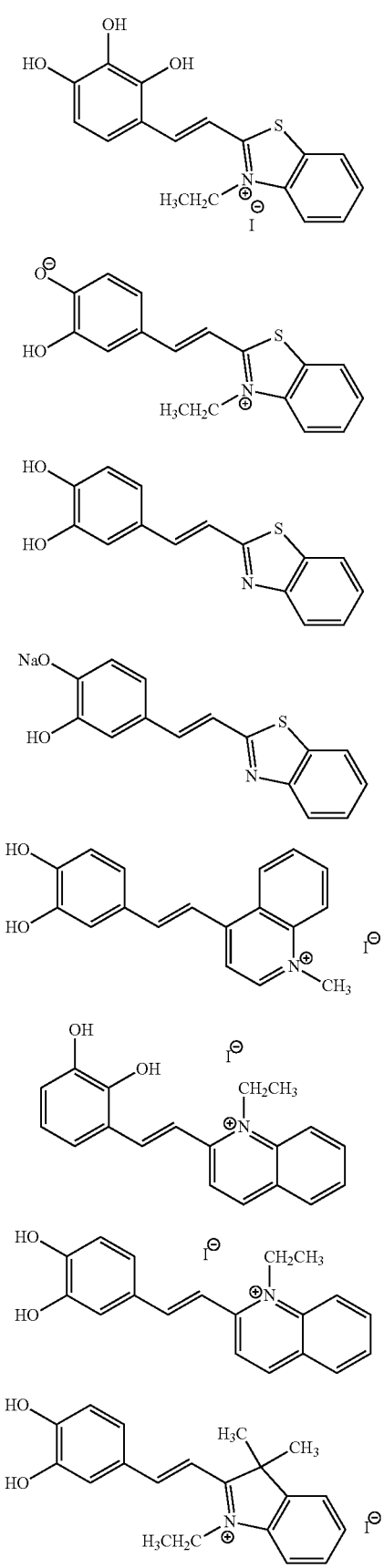
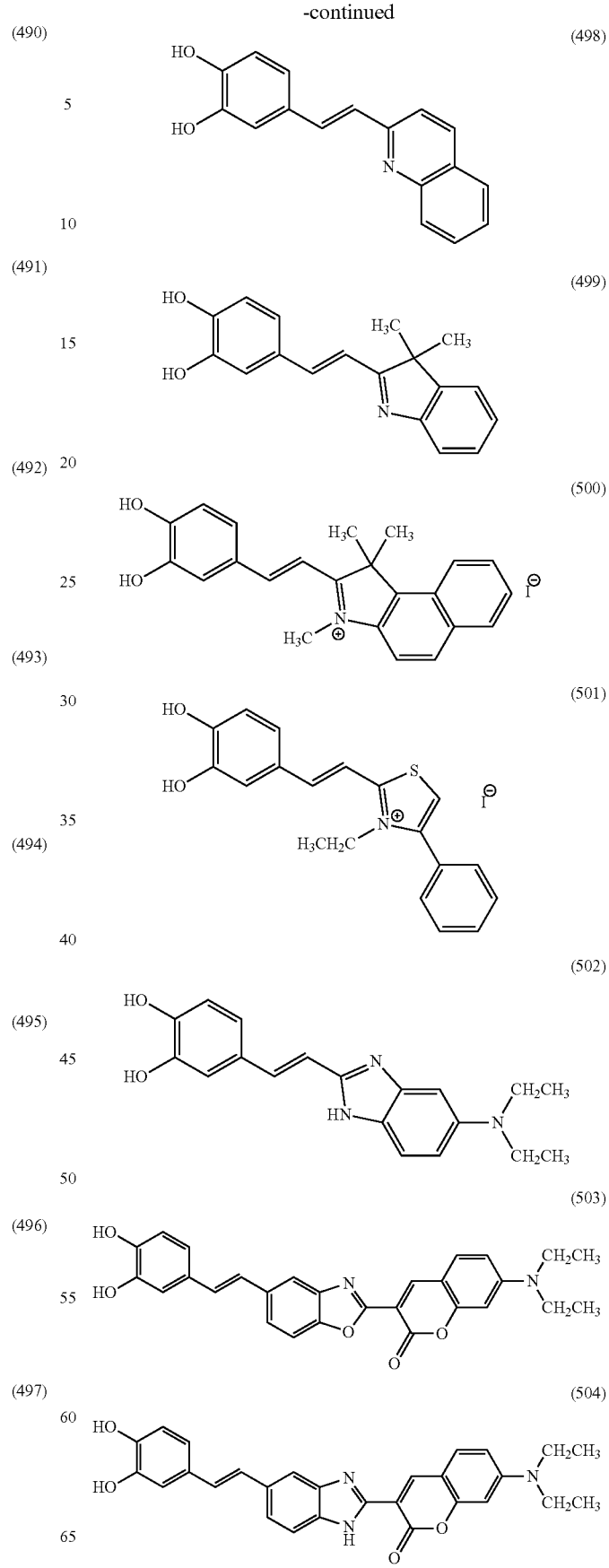

(505)
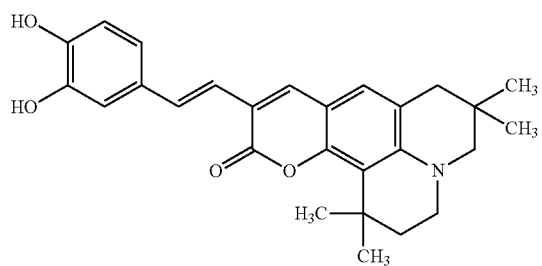
(506)
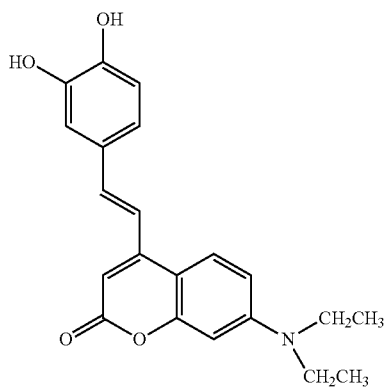
(507)
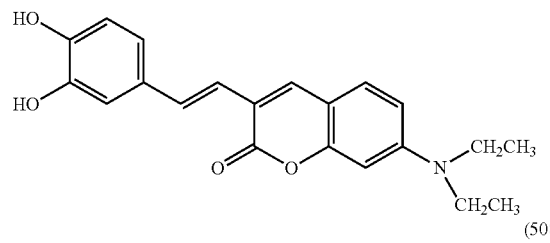
(508)
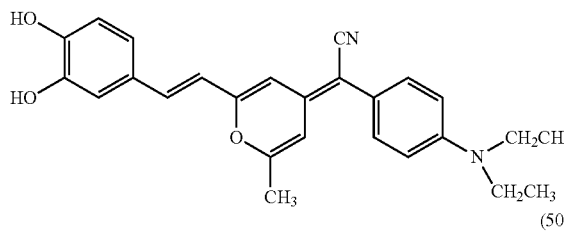
(509)
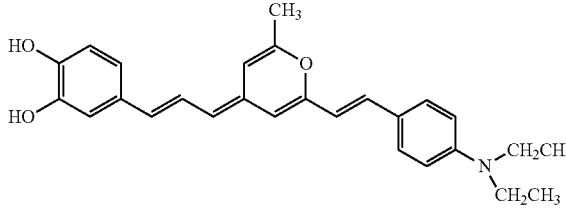
(510)
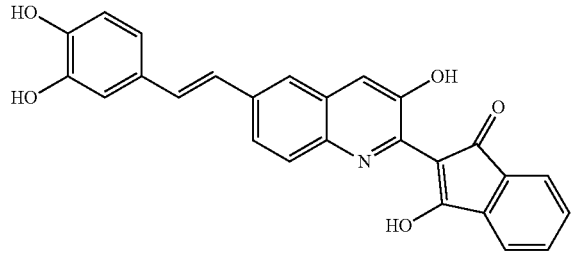
(511)
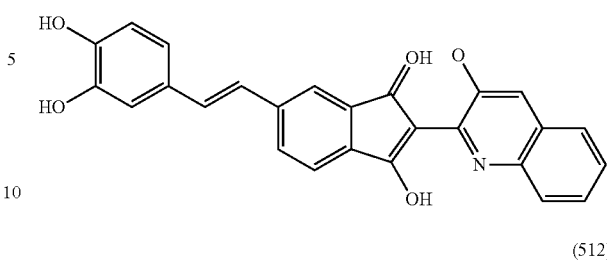
(512)
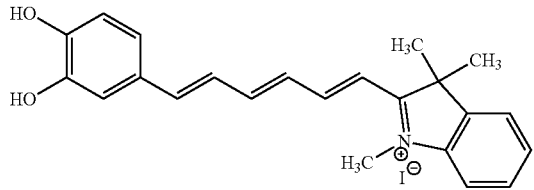
(513)
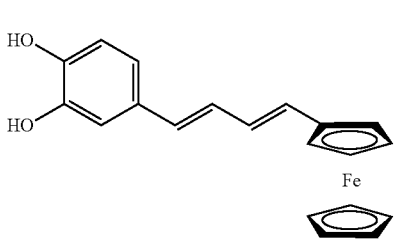
(514)
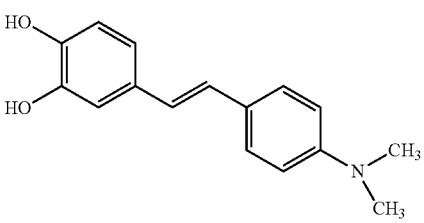
(515)
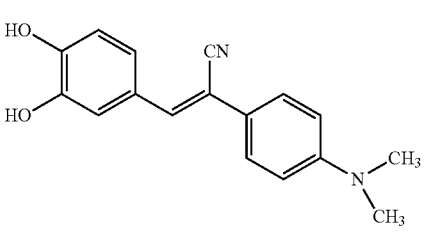
(516)
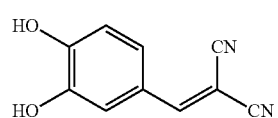
(517)
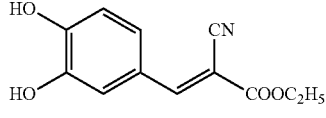
(518)
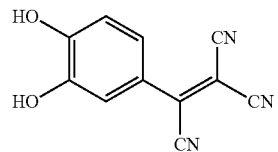

(519) 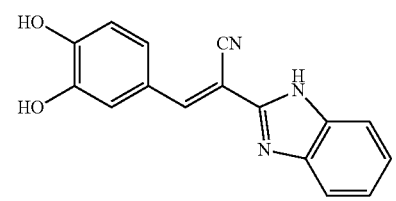

(520) 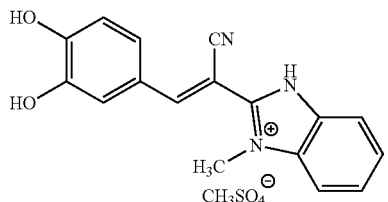

(521) 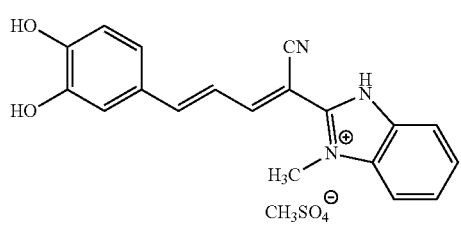

(522) 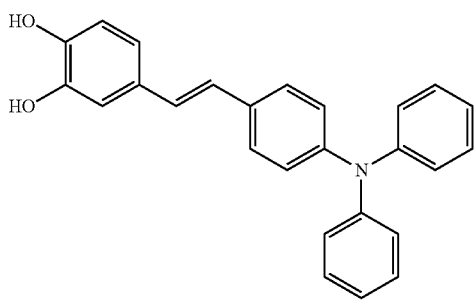

(523) 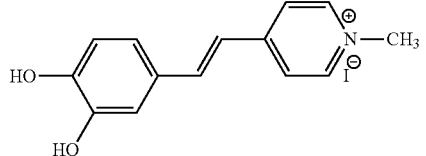

(524) 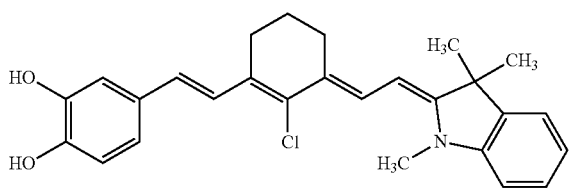

(525) 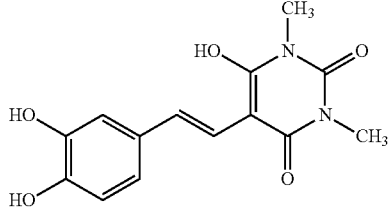

The compound, wherein Rg4 in the general formula (4) is represented by the formula (9), will be described in detail below. This compound is represented by the formula (18):

(18)

wherein, A8, A9 and A10 are independently the same as A1, A2 and A3 mentioned in the general formula (10). The preferred examples thereof are the same as the above, i.e. a hydrogen atom, a halogen atom, an optionally substituted alkyl group, an optionally substituted phenyl group, a cyano group, and more preferably are a hydrogen atom, an optionally substituted alkyl group or a cyano group. Any two of A8, A9 and A10 may be bonded to form an optionally substituted ring. Particularly, when n4 is 2 or more and; A8 and A9 are present in plural, using any A8s, any A9s and any A10s, a ring may be formed. When the ring has substituent(s), the substituent (s) is/are the same as mentioned for A1, A2 and A3 in the general formula (10).

Y4 represents an optionally substituted aromatic hydrocarbon residue, an optionally substituted heterocyclic residue or an optionally substituted organic metal complex residue. The examples of an optionally substituted aromatic hydrocarbon, an optionally substituted heterocyclic residue and an optionally substituted organic metal complex residue are the same as mentioned for Y3 in the general formula (16).

The preferred aromatic hydrocarbon rings or heterocyclic rings in Y4 include a benzene ring, a naphthalene ring, an indene ring, a pyridine ring, a pyrazine ring, a pyrimidine ring, a quinoline ring, a thiophene ring, an indolenine ring, a benzoindolenine ring, a pyrazole ring, a pyrazolidine ring, a thiazole ring, a thiazolidine ring, a benzothiazole ring, an oxazole ring, an oxazolidine ring, a benzoxazole ring, a pyran ring, a chromen(e) ring, a pyrrole ring, an imidazole ring, a benzimidazole ring, an imidazoline ring, an imidazolidine ring, an indole ring, a carbazole ring, a phthalocyanine ring, a porphyrin ring, a ferrocene and each of them may be hydrogenated. More preferably are an indolenine ring, a benzindolenine ring, an imidazole ring, a benzimidazole ring, an oxazole ring, a benzoxazole ring, a thiazole ring, a benzothiazole ring, a coumarine ring, a chromen(e) ring, a pyridine ring, a quinoline ring. At this time Y may be substituted with the substituents on an aliphatic hydrocarbon residue, an aromatic hydrocarbon residue or a heterocyclic residue which are the same as mentioned for A1, A2 and A3 in the general formula (10). The rings in Y4 may form a cyclic ketone or a cyclic thioketone. Preferred substituents on a ring of Y4 include an optionally substituted amino group, an alkyl group, an alkoxyl group, an acetyl group, a hydroxyl group, a halogen atom, kethone, thioketone, and more preferably are an optionally substituted amino group, an alkyl group, an alkoxyl group, kethone, thioketone.

Those substituents may be combined to form a condensed ring such as a hydrocarbon ring or a heterocyclic ring. Examples of those include a rodanine ring, a thioxazolidone ring, a hydantoin ring, a thiohydantoin ring, an indanedione ring, a thianaphthene ring, a pyrazolon ring, a barbituric ring, a thiobarbituric ring, a pyridone ring.

When Y4 is a heterocycle or the like, such a heterocyclic ring may be quaternarized and have an ordinary anion as a counter ion without any limitation. Specific examples thereof include $F^-$, $Cl^-$, $Br^-$, $I^-$, $ClO_4^-$, $BF_4^-$, $PF_6^-$, $OH^-$, $SO_4^{2-}$, $CH_3SO_4^-$, toluene sulfonic acid, and preferably are $Br^-$, $I^-$, $ClO_4^-$, $BF_4^-$, $PF_6^-$, $CH_3SO_4^-$ and a toluene sulfonic acid. Further, instead of a counter ion, the heterocycle may be neutralized by an intramolecular or intermolecular acidic group such as a carboxyl group.

R10 represents a carboxyl group or a hydroxyl group, and when present in plural, it may be the same or different. A hydroxyl group in the general formula (18) is preferred to be substituted at para position to the methine group attached to a benzene ring. Further a carboxyl group or a hydroxyl group of R10 as shown in the general formula (19) shown below is preferred to be placed at meta position to the methine group attached to a benzene ring.

The compounds of formula (18) and (19) may form salts. Examples of salts include metallic salts of a hydroxyl group or a carboxyl group in the formulae with the alkaline metals or the alkaline earth metal such as lithium, sodium, potassium, magnesium and calcium; or salts with the organic base such as quaternary ammonium salts such as a tetramethylammonium, a tetrabutylammonium, a pyridinium and an imidazolium.

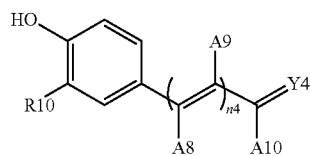

(19)

(wherein, A8, A9, n4, Y4 and R10 are the same as mentioned in the general formula (18))

The representative compounds of the general formula (18) are the compounds represented by the general formulae (33), (34), (35), (36) and (37) shown below and the compounds shown further below.

More preferred compound of the general formula (18) is the compound represented by the general formula (33) or (34).

Even more preferred compound is the compound represented by the general formula (33) wherein,
R10 is a carboxyl group or a hydroxyl group;
n4 is an integer from 0 to 4, and preferably is from 0 to 2;
X9 is an oxygen atom or a sulphur atom, preferably is a sulphur atom;
X10 is an oxygen atom, a sulphur atom or a selenium atom, and preferably is a sulphur atom;
X11 is an oxygen atom or a sulphur atom, and preferably is an oxygen atom;
R20 is a ($C_1$-$C_{20}$) alkyl group, and preferably is a ($C_1$-$C_5$) alkyl group,
or the compound represented by the general formula (34) wherein,
R10 is a hydroxyl group or a carboxyl group, and preferably is a carboxyl group;
n4 is an integer from 0 to 4, preferably is from 0 to 2, and more preferably is 0;
X12 is CO or CS, and preferably represents CO;
X13 is —NH— or —N(($C_1$-$C_4$)alkyl)-;
X14 is CO or CS;
X15 is —NH— or —N(($C_1$-$C_4$)alkyl)-;
X16 is CO or CS, and more preferably is CO.

Those compounds may include the structural isomers such as cis form and trans form, either of which may favorably be used without any limitation.

The compound represented by the general formula (1) can be synthesized by condensing a phenol derivative represented by the general formula (32) with such as a cyclic compound having an active methylene group and the like in the aprotic polar solvents such as alcohol (methanol, ethanol and isopropanol, etc.) and dimethylfolmamide, or acetic anhydride, if necessary in the presence of a basic catalyst such as sodium ethoxido, piperidine and piperazine, at 20° C. to 120° C., preferably at about 50° C. to 80° C.

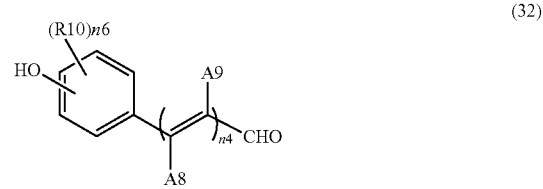

(32)

Examples of the compound are shown below.

Firstly, the examples of the compound represented by the general formula (33) as an example of a compound wherein A8, A9 and A10 are independently a hydrogen atom and Y4 is a 6-membered ring, are shown in Table 6.

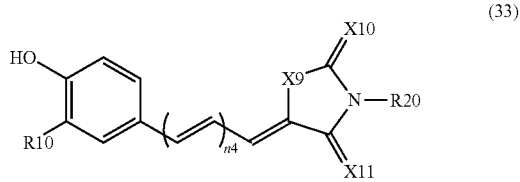

(33)

wherein, R10, n4 are the same as mentioned above;
X9 is an oxygen atom or a sulphur atom;
X10 is an oxygen atom, a sulphur atom or a selenium atom;
X11 is an oxygen atom or a sulphur atom;
R20 is an optionally substituted ($C_1$-$C_4$)alkyl group, wherein substituents are a halogen atom, a hydroxyl group, a cyano group, a carboxyl group, a($C_1$-$C_4$)alkoxyl group, a ($C_1$-$C_4$)alkoxycarbonyl group.)

TABLE 6

| Compound | n4 | R10 | X9 | X10 | X11 | R20 |
|---|---|---|---|---|---|---|
| 526 | 0 | COOH | S | S | O | C2H5 |
| 527 | 0 | COOH | S | S | O | C18H37 |
| 528 | 0 | COOH | S | S | O | CH2COOH |
| 529 | 0 | COOH | S | S | O | Ph |
| 530 | 0 | COOH | NH | S | O | C2H5 |
| 531 | 0 | COOH | O | S | O | C2H5 |
| 532 | 0 | COOH | S | S | S | C8H17 |
| 533 | 0 | COOH | O | S | S | C2H5 |
| 534 | 0 | COOH | S | O | O | C4H9 |
| 535 | 1 | COOH | S | S | O | C2H5 |
| 536 | 1 | COOH | S | Se | O | C2H5 |
| 537 | 1 | COOH | NC2H5 | S | O | C2H5 |
| 538 | 1 | COOH | O | S | O | C2H5 |
| 539 | 2 | COOH | S | S | O | C5H11 |
| 540 | 2 | COOH | NC2H5 | S | O | C2H5 |
| 541 | 2 | COOH | O | S | O | C2H4OCH3 |
| 542 | 3 | COOH | S | S | O | C2H5 |
| 543 | 3 | COOH | NC2H5 | S | O | C2H4OH |
| 544 | 4 | COOH | S | S | O | C2H5 |
| 545 | 4 | COOH | O | S | O | C2H5 |
| 546 | 0 | OH | S | S | O | H |
| 547 | 0 | OH | S | S | O | CH3 |
| 548 | 0 | OH | S | S | O | C2H5 |
| 549 | 0 | OH | S | S | O | C2H4CN |
| 550 | 0 | OH | S | S | O | C2H4Cl |

TABLE 6-continued

| Compound | n4 | R10 | X9 | X10 | X11 | R20 |
|---|---|---|---|---|---|---|
| 551 | 0 | OH | S | S | O | C2H4OH |
| 552 | 0 | OH | S | S | O | C3H8 |
| 553 | 0 | OH | S | S | O | C4H10 |
| 554 | 0 | OH | S | S | O | C12H26 |
| 555 | 0 | OH | S | S | O | C18H37 |
| 556 | 0 | OH | S | S | O | CH2COOH |
| 557 | 0 | OH | S | S | O | CH2COOCH3 |
| 558 | 0 | OH | S | S | O | CH2COONa |
| 559 | 0 | OH | S | S | O | Ph |
| 560 | 0 | OH | NH | S | O | C2H5 |
| 561 | 0 | OH | NH | O | O | H |
| 562 | 0 | OH | NCH3 | O | O | CH3 |
| 563 | 0 | OH | NC3H8 | O | O | C3H8 |
| 564 | 0 | OH | O | S | O | C2H5 |
| 565 | 0 | OH | S | S | S | C8H17 |
| 566 | 0 | OH | O | S | S | C2H5 |
| 567 | 0 | OH | S | O | O | C4H9 |
| 568 | 1 | OH | S | S | O | C2H5 |
| 569 | 1 | OH | S | Se | O | C2H5 |
| 570 | 1 | OH | NC2H5 | S | O | C2H5 |
| 571 | 1 | OH | O | S | O | C2H5 |
| 572 | 2 | OH | S | S | O | C5H11 |
| 573 | 2 | OH | NC2H5 | S | O | C2H5 |
| 574 | 2 | OH | O | S | O | C2H4OCH3 |
| 575 | 3 | OH | S | S | O | C2H5 |
| 576 | 3 | OH | NC2H5 | S | O | C2H4OH |
| 577 | 4 | OH | S | S | O | C2H5 |
| 578 | 4 | OH | O | S | O | C2H5 |

The examples of the compound represented by the general formula (34) as an example of a compound wherein A8, A9 and A10 are independently a hydrogen atom and Y4 is a 6-membered ring, are shown below in Table 7.

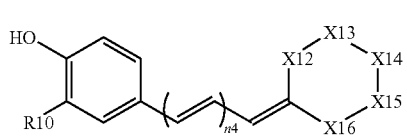

(34)

wherein, R10, n4 are the same as mentioned above;
X9 represents an oxygen atom or a sulphur atom;
X12 represents CO or CS;
X13 represents —NH— or —N(C$_1$-C$_{20}$ alkyl)-, and said a (C$_1$-C$_{20}$) alkyl may be substituted with a phenyl group;
X14 represents CO or CS;
X15 represents —NH— or —N(C$_1$-C$_{20}$ alkyl)-, wherein a (C$_1$-C$_{20}$)alkyl may be substituted with a phenyl group;
X16 represents CO or CS.

TABLE 7

| Compound | n4 | R10 | X12 | X13 | X14 | X15 | X16 |
|---|---|---|---|---|---|---|---|
| 579 | 0 | COOH | CO | NH | CO | NH | CO |
| 580 | 0 | COOH | CO | NH | CS | NH | CO |
| 581 | 0 | COOH | CO | NCH3 | CO | NCH3 | CO |
| 582 | 0 | COOH | CO | NCH3 | CS | NCH3 | CO |
| 583 | 0 | COOH | CO | NH | CO | NCH3 | CO |
| 584 | 0 | COOH | CS | NH | CS | NH | CS |
| 585 | 0 | COOH | CS | NCH3 | CS | NCH3 | CS |
| 586 | 0 | COOH | CO | NPh | CO | NPh | CO |
| 587 | 0 | COOH | CO | NPh | CS | NPh | CO |
| 588 | 0 | COOH | CO | NC8H17 | CO | NC8H17 | CO |
| 589 | 0 | COOH | CO | NC18H37 | CO | NC18H37 | CO |
| 590 | 0 | COOH | CO | NC2H4Ph | CO | NC2H4Ph | CO |
| 591 | 1 | COOH | CO | NH | CO | NH | CO |
| 592 | 1 | COOH | CO | NCH3 | CO | NCH3 | CO |
| 593 | 1 | COOH | CO | NCH3 | CS | NCH3 | CO |

TABLE 7-continued

| Compound | n4 | R10 | X12 | X13 | X14 | X15 | X16 |
|---|---|---|---|---|---|---|---|
| 594 | 1 | COOH | CO | NC18H37 | CO | NC18H37 | CO |
| 595 | 2 | COOH | CO | NH | CO | NCH3 | CO |
| 596 | 2 | COOH | CO | NCH3 | CO | NH3 | CO |
| 597 | 3 | COOH | CO | NCH3 | CO | NCH3 | CO |
| 598 | 4 | COOH | CO | NCH3 | CO | NCH3 | CO |
| 599 | 0 | OH | CO | NH | CO | NH | CO |
| 600 | 0 | OH | CO | NH | CS | NH | CO |
| 601 | 0 | OH | CO | NCH3 | CO | NCH3 | CO |
| 602 | 0 | OH | CO | NCH3 | CS | NCH3 | CO |
| 603 | 0 | OH | CO | NH | CO | NCH3 | CO |
| 604 | 0 | OH | CS | NH | CS | NH | CS |
| 605 | 0 | OH | CS | NCH3 | CS | NCH3 | CS |
| 606 | 0 | OH | CO | NPh | CO | NPh | CO |
| 607 | 0 | OH | CO | NPh | CS | NPh | CO |
| 608 | 0 | OH | CO | NC8H17 | CO | NC8H17 | CO |
| 609 | 0 | OH | CO | NC18H37 | CO | NC18H37 | CO |
| 610 | 0 | OH | CO | NC2H4Ph | CO | NC2H4Ph | CO |
| 611 | 1 | OH | CO | NH | CO | NH | CO |
| 612 | 1 | OH | CO | NCH3 | CO | NCH3 | CO |
| 613 | 1 | OH | CO | NCH3 | CS | NCH3 | CO |
| 614 | 1 | OH | CO | NC18H37 | CO | NC18H37 | CO |
| 615 | 2 | OH | CO | NH | CO | NCH3 | CO |
| 616 | 2 | OH | CO | NCH3 | CO | NH3 | CO |
| 617 | 3 | OH | CO | NCH3 | CO | NCH3 | CO |
| 618 | 4 | OH | CO | NCH3 | CO | NCH3 | CO |

The examples of the compound represented by the general formula (35) as an example of a compound wherein A8, A9 and A10 are independently a hydrogen atom and Y4 is a 5-membered ring, are shown below in Table 8. Rh—Cl represents a 4-chlorophenyl group.

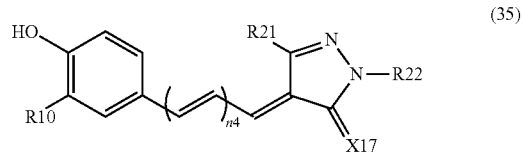

(35)

wherein, R10, n4 are the same as mentioned above;
X17 represents an oxygen atom or a —NH—;
R21 represents a cyano group, a carboxyl group, a (C$_1$-C$_4$) alkyl group and a (C$_1$-C$_4$)alkoxycarbonyl group;
R22 represents a (C$_1$-C$_6$)alkyl group, an optionally halogen substituted phenyl group.

TABLE 8

| Compound | n4 | R10 | X17 | R21 | R22 |
|---|---|---|---|---|---|
| 619 | 0 | COOH | O | CH3 | Ph |
| 620 | 0 | COOH | O | CN | C2H5 |
| 621 | 0 | COOH | O | COOC2H5 | Ph |
| 622 | 0 | COOH | S | COOH | C5H11 |
| 623 | 1 | COOH | NH | CH3 | Ph |
| 624 | 1 | COOH | O | COOCH3 | Ph-Cl |
| 625 | 2 | COOH | O | CH3 | CH3 |
| 626 | 2 | COOH | O | CH3 | Ph |
| 627 | 3 | COOH | O | CH3 | CH3 |
| 628 | 4 | COOH | O | CN | C2H5 |
| 629 | 0 | OH | O | CH3 | Ph |
| 630 | 0 | OH | O | CN | C2H5 |
| 631 | 0 | OH | O | COOH | Ph |
| 632 | 0 | OH | S | COOH | C5H11 |
| 633 | 1 | OH | NH | CH3 | Ph |
| 634 | 1 | OH | O | COOCH3 | Ph-Cl |
| 635 | 2 | OH | O | CH3 | CH3 |
| 636 | 2 | OH | O | CH3 | Ph |
| 637 | 3 | OH | O | CH3 | CH3 |
| 638 | 4 | OH | O | CN | C2H5 |

The examples of the compound represented by the general formula (36) as an example of a compound wherein A8, A9 and A10 are independently a hydrogen atom and Y4 is a compound of a 6-membered ring, are shown below in Table 9.

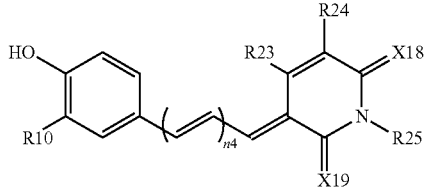
(36)

wherein, R10, n4 are the same as mentioned above;
X18 and X19 are independently an oxygen atom or a sulphur atom;
R23 represents a $(C_1-C_6)$alkyl group;
R24 represents a cyano group, a carboxyl group, and a $(C_1-C_4)$alkoxycarbonyl group;
R25 represents a phenyl group, an optionally substituted $(C_1-C_{20})$ alkyl group, wherein suitable substituents are a halogen atom, a hydroxy group, a cyano group, a carboxyl group, a $(C_1-C_4)$alkoxyl group, a $(C_1-C_4)$alkoxycarbonyl group.)

TABLE 9

| Compound | n4 | R10 | X18 | X19 | R23 | R24 | R25 |
|---|---|---|---|---|---|---|---|
| 639 | 0 | COOH | O | O | CH3 | CN | C2H5 |
| 640 | 0 | COOH | O | O | CH3 | CN | C18H37 |
| 641 | 0 | COOH | O | O | CH3 | COOCH3 | Ph |
| 642 | 0 | COOH | O | O | C2H5 | COOH | C2H4COOH |
| 643 | 0 | COOH | S | S | CH3 | COOC2H5 | C2H5OH |
| 644 | 1 | COOH | O | O | CH3 | CN | C2H5 |
| 645 | 1 | COOH | O | O | C4H9 | CN | Ph |
| 646 | 2 | COOH | O | O | CH3 | CN | C4H9 |
| 647 | 3 | COOH | O | O | CH3 | COOCH3 | Ph |
| 648 | 4 | COOH | O | O | CH3 | COOH | C4H8CN |
| 649 | 0 | OH | O | O | CH3 | CN | C2H5 |
| 650 | 0 | OH | O | O | CH3 | CN | C18H37 |
| 651 | 0 | OH | O | O | CH3 | COOCH3 | Ph |
| 652 | 0 | OH | O | O | C2H5 | COOH | C2H4COOH |
| 653 | 0 | OH | O | O | CH3 | CN | CH2COOH |
| 654 | 0 | OH | S | S | CH3 | COOC2H5 | C2H5OH |
| 655 | 1 | OH | O | O | CH3 | CN | C2H5 |
| 656 | 1 | OH | O | O | C4H9 | CN | Ph |
| 657 | 2 | OH | O | O | CH3 | CN | C4H9 |
| 658 | 3 | OH | O | O | CH3 | COOCH3 | Ph |
| 659 | 4 | OH | O | O | CH3 | COOH | C4H8CN |

The examples of the compound represented by the general formula (37) as an example of a compound wherein A8, A9 and A10 are independently a hydrogen atom and Y4 is two rings, are shown below in Table 10.

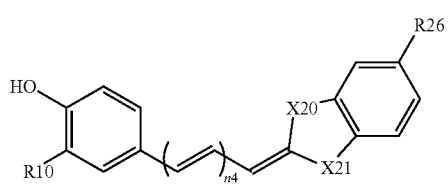
(37)

wherein, R10, n4 are the same as mentioned above;
X20 and X21 independently represents CO, CS, a vinylen group substituted with a cyano group;
R26 represents a hydrogen atom, a $(C_1-C_4)$ alkyl group, mono- or di$(C_1-C_4)$alkylamino group.

TABLE 10

| Compound | n4 | R10 | X20 | X21 | R26 |
|---|---|---|---|---|---|
| 660 | 0 | COOH | CO | CO | H |
| 661 | 0 | COOH | S | CO | H |
| 662 | 0 | COOH | C=C(CN)2 | SO2 | H |
| 663 | 1 | COOH | S | CO | CH3 |
| 664 | 1 | COOH | CO | CO | H |
| 665 | 2 | COOH | S | CO | H |
| 666 | 2 | COOH | CS | CS | H |
| 667 | 3 | COOH | CO | CO | N(CH3)2 |
| 668 | 4 | COOH | S | S | CH3 |
| 669 | 0 | OH | CO | CO | H |
| 670 | 0 | OH | S | CO | H |
| 671 | 0 | OH | NCH3 | S | N(CH3)2 |
| 672 | 0 | OH | S | NCH3 | N(CH3)2 |
| 673 | 0 | OH | CO | SO2 | H |
| 674 | 0 | OH | CO | SO2 | N(CH3)2 |
| 675 | 0 | OH | C=C(CN)2 | SO2 | H |
| 676 | 1 | OH | S | CO | CH3 |
| 677 | 1 | OH | CO | CO | H |
| 678 | 2 | OH | S | CO | H |
| 679 | 2 | OH | CS | CS | H |
| 680 | 3 | OH | CO | CO | N(CH3)2 |
| 681 | 4 | OH | S | S | CH3 |

Other examples include dyes having a structure as shown below.

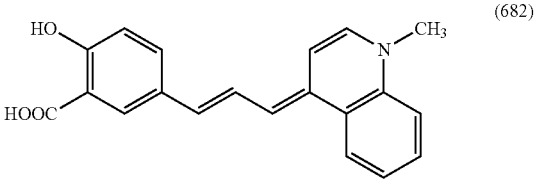
(682)

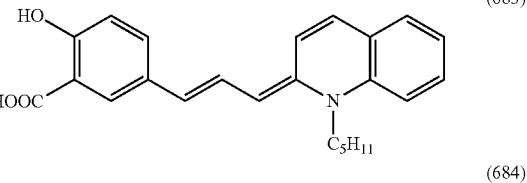
(683)

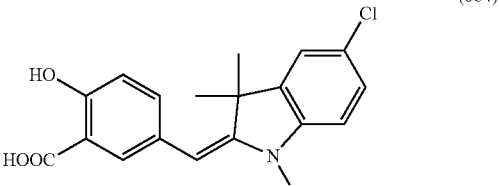
(684)

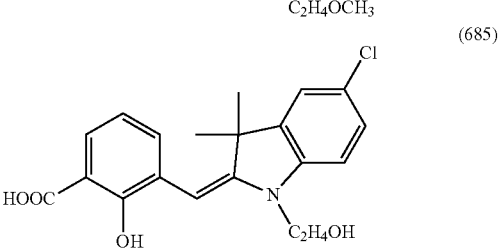
(685)

-continued
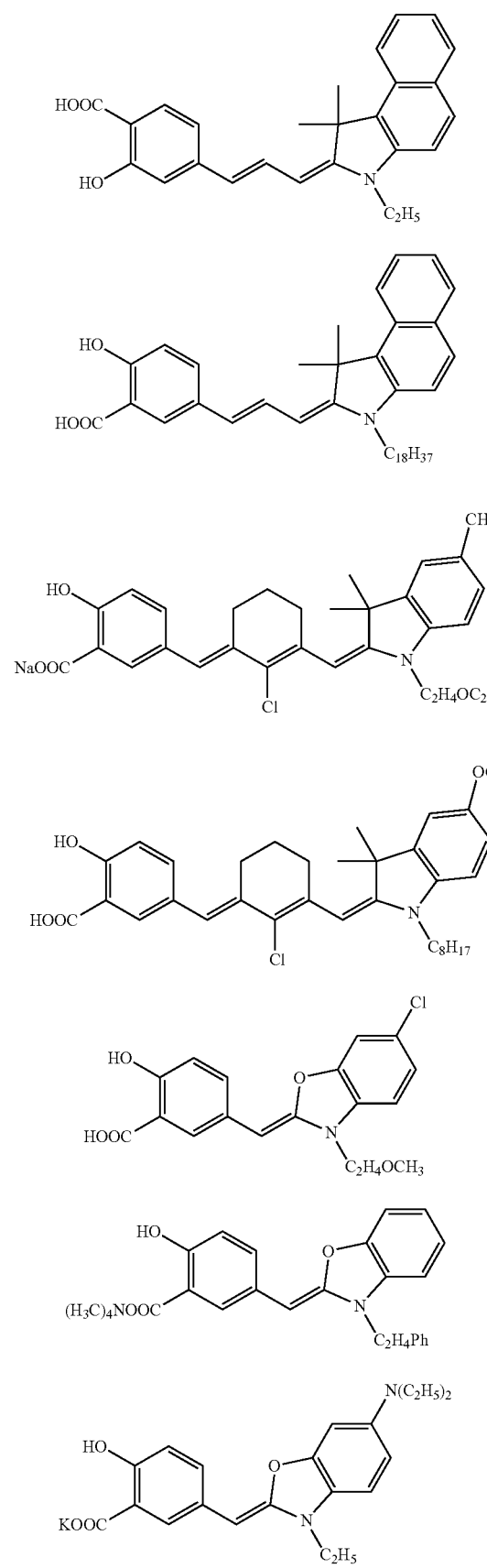
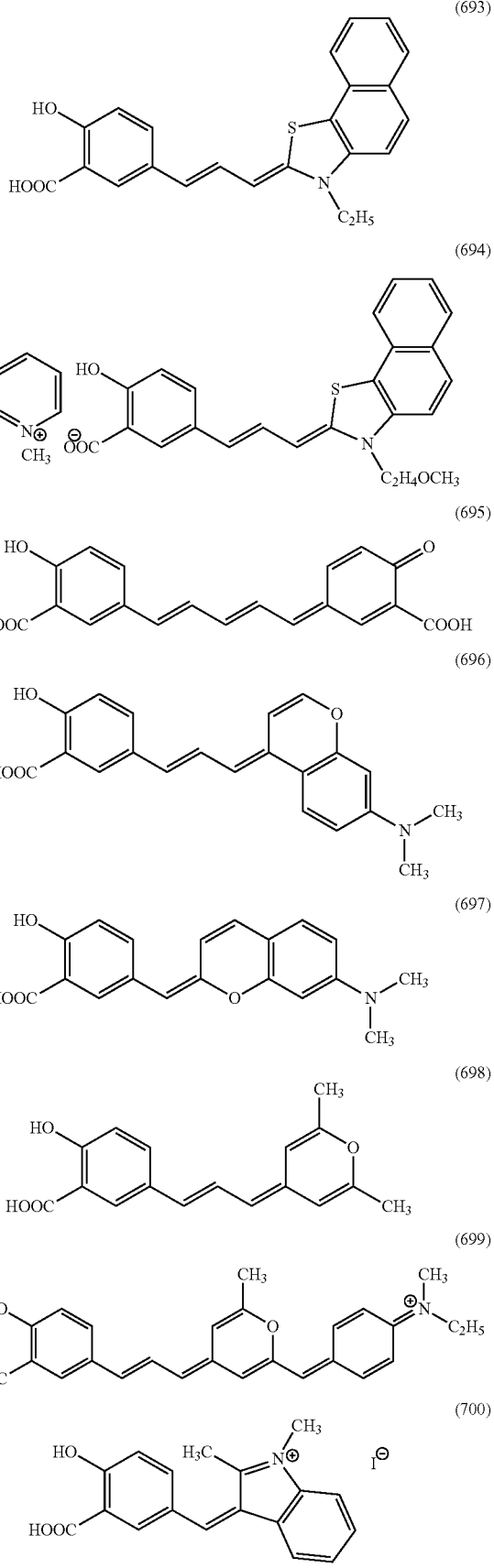

(701) 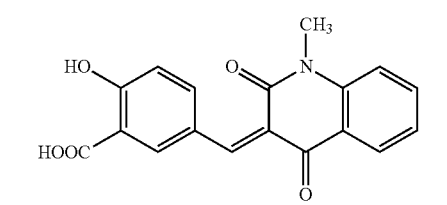
(702) 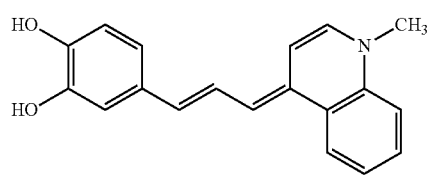
(703) 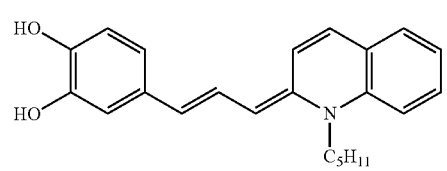
(704) 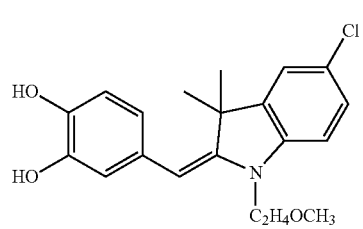
(705) 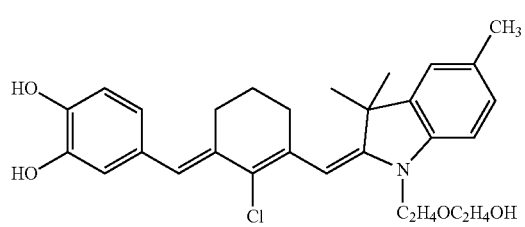
(706) 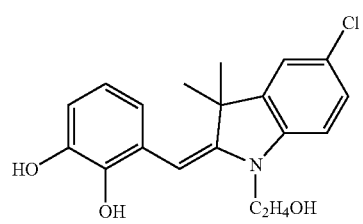
(707) 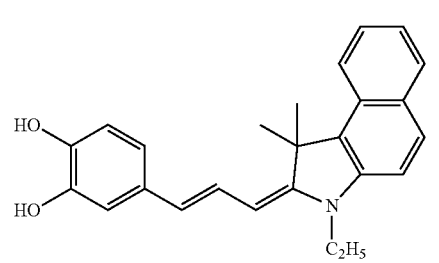
(708) 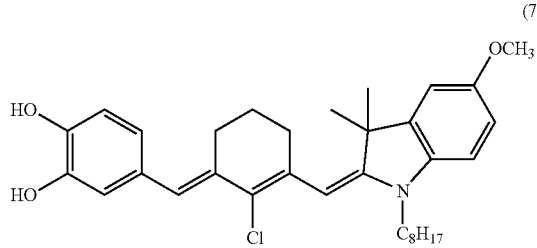
(709) 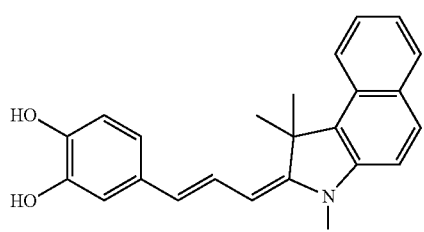
(710) 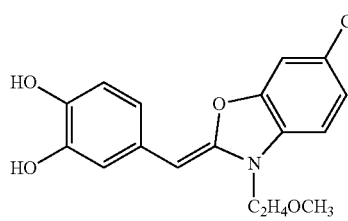
(711) 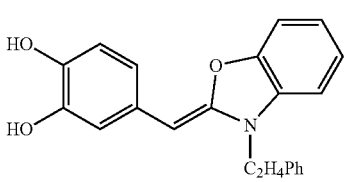
(712) 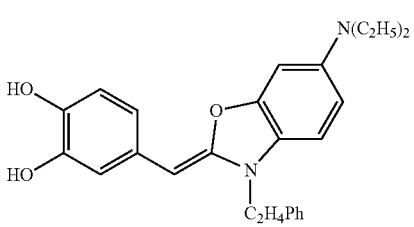
(713) 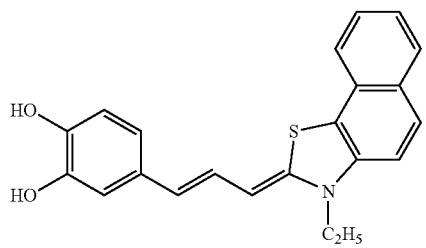
(714) 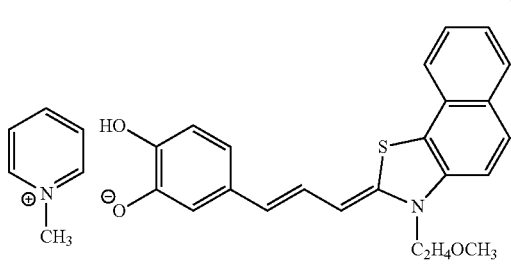

(715) 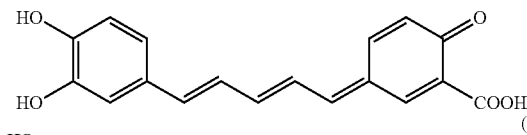
(716) 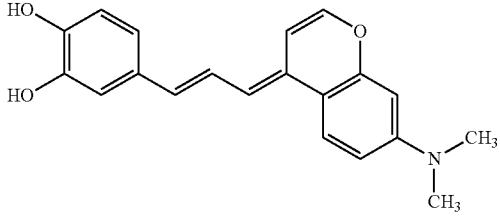
(717) 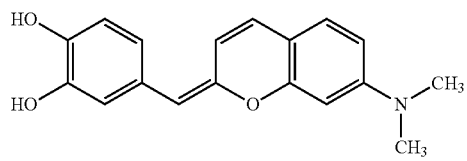
(718) 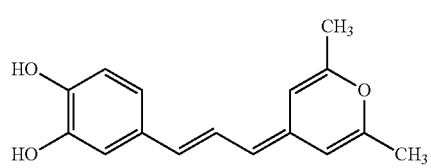
(719) 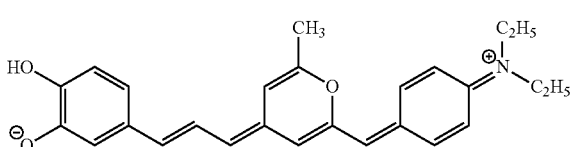
(720) 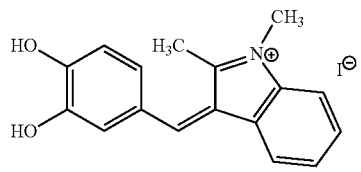
(721) 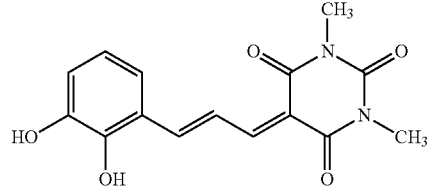
(722) 
(723) 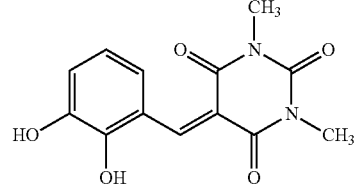

(724) 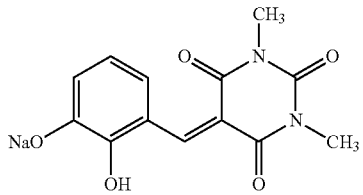
(725) 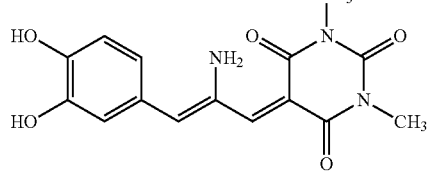
(726) 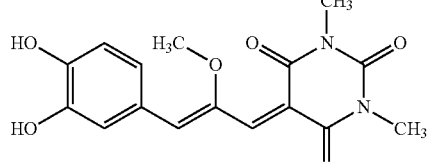
(727) 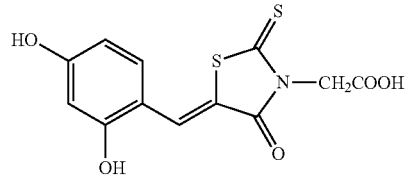

A dye-sensitized photoelectric conversion device of the present invention, for example, is produced by forming a thin film using the oxide semiconductor fine materials on the substrate, and subsequently a dye being adsorbed thereon.

Preferred substrate of the present invention to form the oxide semiconductor thin film thereon has an electrically conductive surface, which is available in the market. More specifically preferred is the substrate wherein a thin film of electrically conductive metal oxide such as tin oxide being doped with indium, fluorine or antimony or thin film of metal such as gold, silver or copper is formed on the surface of glass or a transparent high-molecular material such as polyethylene terephthalate or polyether sulfone. The sufficient conductivity thereof is usually 1,000Ω or less, and is preferably 100Ω or less.

As for oxide semiconductor fine materials, particularly for oxide semiconductor fine particles, metal oxides are preferable. Specific examples of those include oxides of titanium, tin, zinc, tungsten, zirconium, gallium, indium, yttrium, niobium, tantalum, vanadium and the like, preferably include oxides of titanium, tin, zinc, niobium, tungsten and the like, and most preferably include oxides of titanium. The oxide semiconductors may be used either alone or mixed. An average particle diameter of the fine particles of the oxide semiconductor is generally from 1 nm to 500 nm, and preferably is from 5 nm to 100 nm. The larger particles and the smaller particles may be used by mixing together. Further, the oxide semiconductor fine crystalline such as nanowhisker, nanotube and nanowire may also be used.

An oxide semiconductor thin film can be produced by those methods such that the oxide semiconductor fine particles are directly vapor-deposited on a substrate to form a thin film; an oxide semiconductor thin film is electrically precipitated by using a substrate as an electrode; or a slurry of semiconductor fine particles is applied on a substrate, and then dried, cured or sintered to form a thin film. In view of the performance of an oxide semiconductor electrode, the preferred is the method of using the slurry. In this method, the slurry can be obtained by a conventional method wherein an oxide semiconductor fine particle of a secondary agglomeration state is dispersed in a dispersion medium as to form an oxide semiconductor fine particle of which average primary particle diameter is from 1 nm to 200 nm.

Any dispersion medium of the slurry can be used as far as it disperses the semiconductor fine particles. Water or an organic solvent i.e. an alcohol such as ethanol; a ketone such as acetone, acetylacetone; or a hydrocarbon such as hexane and the mixture thereof may be used. Moreover, the use of water is preferable as to reduce the viscosity changes.

Sintering temperature of a slurry-coated substrate is generally 300° C. or higher, preferably 400° C. or higher. The maximum allowable upper limit of sintering temperature thereof is approximately not greater than a melting point (softening point) of a substrate, generally is 900° C. and preferably is 600° C. or lower. The total sintering time is preferably, but is not particularly limited to, within about 4 hours. Thickness of the thin film on the substrate is generally from 1 μm to 200 μm, and preferably is from 5 μm to 50 μm.

The oxide semiconductor thin film may be subjected to a secondary treatment. Namely, for example, the thin film can directly be immersed together with the substrate in a solution of an alkoxide, a chloride, or a nitride, a sulfide or the like of the same metal as the semiconductor and then dried or sintered again to enhance performance of the semiconductor thin film. Examples of such metal alkoxides include titanium ethoxide, titanium isopropoxide, titanium t-butoxide, n-dibutyl-diacetyl tin and the like, and an alcoholic solution thereof is used. Examples of such chlorides include titanium tetrachloride, tin tetrachloride, zinc chloride and the like, and an aqueous solution thereof is used.

Next, a method to adsorb a dye on the oxide semiconductor thin film is explained. As the above-described method for adsorbing the dye thereon, mentioned is a method wherein a substrate on which the above-described oxide semiconductor thin film has been formed is immersed in a solution obtained by dissolving a dye in a solvent capable of dissolving the dye or in a dispersion liquid obtained by dispersing a dye with a low solubility. A concentration of the dye dissolved in the solution or the dispersion liquid is determined depending on the dyes. The semiconductor thin film formed on the substrate is immersed in the solution for about 1 to 48 hours at the temperature of the solvent from the normal temperature to boiling point. Specific examples of solvents to be used for dissolving the dye include methanol, ethanol, acetonitrile, dimethylsulfoxide, dimethylformamide and the like. A concentration of the dye in the solution is generally from $1\times10^{-6}$ M to 1 M, and preferably is from $1\times10^{-4}$M to $1\times10^{-1}$M. Consequently, a photoelectric conversion device of the oxide semiconductor thin film sensitized with the dye can be obtained.

The dye to be adsorbed may be composed of one type of die or the mixture of two or more types. When the dyes are mixed, the dyes of the present invention may be mixed thereamong, or mixed with other dyes (including metal complex dyes) having no partial structure (1).

Particularly, by mixing dyes having different absorption wavelengths from one another, a wider absorption wavelength can be utilized and, as a result, a solar cell having high conversion efficiency can be obtained. The combined use of three or more types of dyes enables to obtain a further optimal solar cell.

Examples of the metal complex dyes for combined use include, but are not limited to, a ruthenium bipyridyl complex disclosed in J. Am. Chem. Soc., 115, 6382 (1993) or JP-A-2000-26487, phthalocyanine, porphyrin and the like. Examples of organic dyes for combined use include, dyes such as metal-free phthalocyanine, metal-free porphyrin, or methine-type dyes such as cyanine, merocyanine, oxonol, a triphenyl methane type, or a xanthene type, an azo type, an anthraquinone type and the like, and preferably include the ruthenium complex and methine-type dyes such as merocyanine. A mixing ratio of the dyes is not particularly limited but is optimized depending on the respective dyes. However, the dyes are generally preferred to be mixed at from equivalent molar ratios to a ratio of about 10 mol % or more per dye. When adsorbing the dyes on the thin film of the oxide semiconductor fine particles by using a solution dissolving or dispersing those mixed dyes, a concentration of entire dyes in the solution may be the same as in the case of adsorbing only one type of dye.

It effectively prevents dyes from associating with one another if the adsorption procedure is carried out in the presence of an inclusion compound when adsorbing the dyes on the thin film of the oxide semiconductor fine particles. Examples of the inclusion compounds include steroid-type compounds such as cholic acid, crown ethers, cyclodextrin, calixarene, polyethylene oxide, and preferably include cholic acid and polyethylene oxide. Further, after the dye is adsorbed thereon, a surface of a semiconductor electrode may be treated with an amine compound such as 4-t-butylpyridine. The employed method for such a treatment is e.g. the method wherein a substrate having a thin film of the semiconductor fine particles on which the dye is adsorbed is immersed in an ethanol solution of an amine, or the like.

The solar cell of the present invention comprises a photoelectric conversion device electrode wherein the dye is adsorbed on the above-described oxide semiconductor thin film, a counter electrode and a redox electrolyte or a hole transfer material. The redox electrolyte may be a solution wherein a redox pair is dissolved in a solvent, a gel electrolyte wherein a polymer matrix is impregnated with a redox pair or a solid electrolyte such as a fused salt. Examples of hole transfer materials include an amine derivative, an electrically conductive polymer such as polyacetylene, polyaniline, polythiophene or the like, a material using a discotic liquid crystal phase such as polyphenylene and the like. The preferred counter electrode to be used has electric conductivity and works as a catalyst during a reduction reaction of the redox electrolyte such as a glass or a polymer film on which platinum, carbon, rhodium, ruthenium or the like are vapor-deposited, or electrically conductive fine particles are applied.

Examples of redox electrolytes used in solar cells of the present invention include a halogen redox electrolyte comprising a halogen compound and halogen molecule having a halogen ion as a counter ion, a metal redox electrolyte of a metal complex or the like such as ferrocyanate-ferricyanate, ferrocene-ferricinium ion and an aromatic redox electrolyte such as alkylthiol-alkyldisulfide, a viologen dye, hydroquinone-quinone, and preferably include the halogen redox electrolyte. The halogen molecule in the halogen redox electrolyte comprising halogen compound-halogen molecule includes, for example, an iodine molecule, a bromine molecule or the like, and preferably includes the iodine molecule. Further, examples of the halogen compounds having a halogen ion as a counter ion include a halogenated metal salt such as LiI, NaI, KI, CsI and CaI$_2$, or an organic quaternary ammonium salt of halogen such as tetraalkylammonium iodide, imidazolium iodide, pyridinium iodide, and preferably includes a salt-type compound having the iodine ion as a counter ion. Examples of salt-type compounds having the iodine ion as a counter ion include lithium iodide, sodium iodide, a trimethyl iodide ammonium salt and the like.

Further, when the redox electrolyte is a solution comprising thereof, the preferred solvent is an electrochemically inert solvent. Examples of such solvents include acetonitrile, propylene carbonate, ethylene carbonate, 3-methoxypropionitrile, methoxyacetonitrile, ethylene glycol, propylene glycol, diethylene glycol, triethylene glycol, γ-butyrolactone, dimethoxyethane, diethyl carbonate, diethyl ether, diethyl carbonate, dimethyl carbonate, 1,2-dimethoxy ethane, dimethylformamide, dimethylsulfoxide, 1,3-dioxolane, methyl formate, 2-methyl tetrahydrofuran, 3-methoxy-oxaziridine-2-one, sulfolane, tetrahydrofuran, water and the like. Partiularly preferred are acetonitrile, propylene carbonate, ethylene carbonate, 3-methoxypropionitrile, methoxyacetonitrile, ethylene glycol, 3-methoxyoxaziridine-2-one and the like. Those solvents may be used either alone or in combination of two or more. When it is the gel electrolyte, a polyacrylate or polymethacrylate resin, and the like are used as a matrix. A concentration of the redox electrolyte is generally from 0.01% by weight to 99% by weight, and preferably from about 0.1% by weight to about 90% by weight.

The solar cell of the present invention can be obtained by allocating the counter electrode against an electrode of the photoelectric conversion device adsorbed the dye on the oxide semiconductor thin film on the substrate such that a sandwich of two electrodes and filling with a solution containing the redox electrolyte in between.

EXAMPLES

The present invention is now more specifically described with reference to Examples. However, it should be noted that these Examples should not be interpreted as limiting the present invention. Unless stated otherwise, all parts and percentages in these Examples are given by mass.

Synthesis Example 1

Two parts of 1-phenyl-3-carboxy-5-pyrazolone and 1.7 parts of 4-(dimethylamino) benzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.2 parts of compound (I).
Absorption maximum (ethanol): 506 nm Synthesis Example 2

Two parts of 1-phenyl-3-carboxy-5-pyrazolone and 2 parts of 4-(dimethylamino) cinnamaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.3 parts of compound (35).
Absorption maximum (ethanol): 556 nm Synthesis Example 3

One part of 1-phenyl-3-carboxy-5-pyrazolone and 1.5 parts of 4-(diphenylamino) cinnamaldehyde were mixed in 10 parts of ethanol. The reaction was carried out under reflux for 2 hours. The solid obtained after cooling was filtered, washed, dried, then recrystallized from ethanol and consecutively filtered, washed and dried to give 1.8 parts of compound (36).
Absorption maximum (ethanol): 506 nm Synthesis Example 4

1-carboxymethyl-3-cyano-6-hydroxyl-4-methyl-2-pyridone (2.4 parts) and 1.1 parts of 4-(diethylamino) benzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.9 parts of compound (100).
Absorption maximum (ethanol): 538 nm Synthesis Example 5

1-carboxymethyl-3-cyano-6-hydroxy-4-methyl-2-pyridone (2.4 parts) and 1.4 parts of 4-(dimethylamino) cinnamaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.8 parts of compound (103).
Absorption maximum (ethanol): 556 nm Synthesis Example 6

Two parts of rhodanine and 2 parts of 4-(dimethylamino) benzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 3 parts of compound (213).
Absorption maximum (ethanol): 457 nm
Luminescence maximum (ethanol): 547 nm Synthesis Example 7

Two parts of rhodanine and 2.5 parts of 4-(dimethylamino) cinnamaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 3.3 parts of compound (234).
Absorption maximum (ethanol): 481 nm Synthesis Example 8

Rhodanine-3-acetic acid (1.2 part) and one part of 4-(dimethylamino)benzaldehyde were mixed in 10 parts of ethanol and 0.1 parts of piperazine anhydride were added thereto. The reaction was carried out under reflux for 2 hours. The solid obtained after cooling was filtered, washed, dried, then recrystallized from ethanol and consecutively filtered, washed and dried to give 1.3 parts of compound (199).
Absorption maximum (ethanol): 465 nm
Luminescence maximum (ethanol): 549 nm 1H-NMR (ppm:d6-DMSO): 3.05 (s, CH3, 6H), 4.60 (s, —CH2—, 2H), 6.86 (d, arom, 2H), 7.52 (d, arom, 2H), 7.73 (s, =CH—, 1H)

Synthesis Example 9

Two parts of rhodanine-3-acetic acid and 1.7 parts of 4-(diethylamino) benzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.5 parts of compound (200).
Absorption maximum (ethanol): 472 nm
Luminescence maximum (ethanol): 544 nm
1H-NMR (ppm: d6-DMSO):1.13 (t, CH3, 6H), 3.43 (t, (CH2), 4H), 4.49 (S, —CH2—, 2H), 6.83 (d, arom, 2H), 7.48 (d, arom, 2H), 7.68 (s, =CH—, 1H)

Synthesis Example 10

One part of rhodanine-3-acetic acid and 0.96 parts of 4-(dimethylamino) cinnamaldehyde were mixed in 10 parts of ethanol and 0.1 parts of piperazine anhydride were added thereto. The reaction was carried out under reflux for 2 hours. The solid obtained after cooling was filtered, washed, dried, then recrystallized from ethanol and consecutively filtered, washed and dried to give 1.1 parts of compound (225).
Absorption maximum (ethanol): 488 nm

Synthesis Example 11

Five parts of rhodanine-3-acetic acid and 4.8 parts of 4-(diethylamino) salicylaldehyde were mixed in 20 parts of ethanol and 0.8 parts of piperazine anhydride were added thereto. The reaction was carried out under reflux for 2 hours. The solid obtained after cooling was filtered, washed, dried, then recrystallized from ethanol and consecutively filtered, washed and dried to give 7.1 parts of compound (207).
Absorption maximum (ethanol): 479 nm
Luminescence maximum (ethanol): 544 nm
1H-NMR (ppm:d6-DMSO):1.13 (t, CH3, 6H), 3.40 (t,(CH$_2$), 4H), 4.50 (S, —CH2—,2H), 6.22 (s, arom, 1H), 6.42 (d, arom, 1H), 7.18 (d, arom, 1H), 7.95 (s,=CH—, 1H)

Synthesis Example 12

Rhodanine-3-acetic acid (2.4 parts) and 2 parts of 4-molpholinobenzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 3.2 parts of compound (270).
Absorption maximum (ethanol): 440 nm
Luminescence maximum (ethanol): 537 nm

Synthesis Example 13

Rhodanine-3-acetic acid (2.3 parts) and 2 parts of 2,4,6-trimethoxybenzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 3.4 parts of compound (260).
Absorption maximum (ethanol): 410 nm
Luminescence maximum (ethanol): 469 nm

Synthesis Example 14

Rhodanine-3-acetic acid (1.5 parts) and 2 parts of 9-formyl-8-hydroxy-1,1,7,7-tetramethyljulolidine were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 3.1 parts of compound (257).
Absorption maximum (ethanol): 502 nm
Luminescence maximum (ethanol): 569 nm

Synthesis Example 15

Three parts of rhodanine-3-acetic acid and 2 parts of 4-(dimethylamino)naphthaldehyde were mixed in 20 parts of ethanol and 0.2 parts of piperazine anhydride were added thereto. The reaction was carried out under reflux for 2 hours. The solid obtained after cooling was filtered, washed, dried, and then recrystallized from ethanol, filtered, washed and dried to give 3.4 parts of compound (274).
Absorption maximum (ethanol): 445 nm
Luminescence maximum (ethanol): 574 nm

Synthesis Example 16

One part of rhodanine-3-acetic acid and 1.2 parts of 4-(di-n-butylamino) benzaldehyde were mixed in 10 parts of ethanol and 0.1 parts of piperazine anhydride were added thereto. The reaction was carried out under reflux for 2 hours. The solid obtained after cooling was filtered, washed, dried, then recrystallized from ethanol and consecutively filtered, washed and dried to give 2.3 parts of compound (210).
Absorption maximum (ethanol): 466 nm

Synthesis Example 17

Rhodanine-3-acetic acid (1.3 parts) and 2 parts of 4-(dibenzylamino)benzaldehyde were mixed in 20 parts of ethanol and 0.2 parts of piperazine anhydride were added thereto. The reaction was carried out under reflux for 2 hours. The solid obtained after cooling was filtered, washed, dried, then recrystallized from ethanol and consecutively filtered, washed and dried to give 2.3 parts of compound (268).
Absorption maximum (ethanol): 466 nm
Luminescence maximum (ethanol): 540 nm

Synthesis Example 18

Rhodanine-3-acetic acid (1.3 parts) and 2 parts of 4-(dioctylamino) benzaldehyde were mixed in 15 parts of n-butanol and 0.1 parts of piperazine anhydride were added thereto. The reaction was carried out under reflux for 2 hours. The solid obtained after cooling was filtered, washed, dried, then recrystallized from ethanol-butanol mixed solvent and consecutively filtered, washed and dried to give 1.8 parts of compound (203).
Absorption maximum (ethanol): 470 nm
Luminescence maximum (ethanol): 541 nm
1H-NMR (ppm:CDCl3: 0.90 (t, CH$_3$, 6H), 1.2-1.7 (m, (CH$_2$) 6, 24H), 3.30 (t, N—CH2—, 4H), 4.70 (S, —CH2—, 2H), 6.63 (d, arom, 2H), 7.50 (d, arom, 2H), 8.62 (s, =CH—, 1H)

Synthesis Example 19

Three parts of the following compound (728) and 1.5 parts of 4-(dimethylamino)benzaldehyde were mixed in 20 parts of ethanol. The reaction was carried out under reflux for 2 hours. The solid obtained after cooling was filtered and washed. This material was then dissolved in 30 parts of ethanol and 4 parts of 55% hydroiodic acid aqueous solution were added thereto. The solution was allowed to stand for one hour. The resulting predipitate was filtered, washed, dried, then recrystallized from ethanol and consecutively filtered, washed and dried to give 3.2 parts of compound (296).
Absorption maximum (ethanol): 559 nm
Luminescence maximum (ethanol): 603 nm
1H-NMR (ppm:d6-DMSO):1.79 (s, C(CH3)2,6H), 3.20 (S,N(CH3)2,6H), 3.95 (S, N—CH3,3H), 6.92 (d, arom, 2H), 7.26 (d,═CH—, 1H), 7.76 (s, arom, 1H), 8.08-8.18(m, arom, 3H), 8.31 (s, arom, 1H), 8.40 (d, ═CH—, 1H)

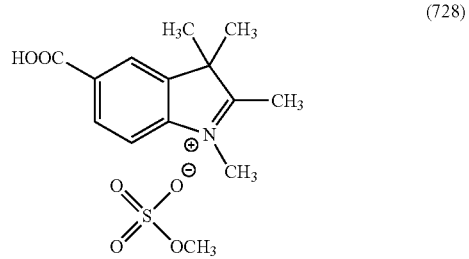

(728)

Synthesis Example 20

One part of compound (728) and 1.5 parts of 4-(diethylamino) benzaldehyde were mixed in 20 parts of ethanol. The reaction was carried out under reflux for 2 hours. The solid obtained after cooling was filtered and washed. This material was then dissolved in 30 parts of ethanol and 3 parts of 55% hydroiodic acid aqueous solution were added thereto. The solution was allowed to stand for one hour. The resulting predipitate was filtered, washed, dried, then recrystallized from ethanol and consecutively filtered, washed and dried to give 1.9 parts of compound (295).
Absorption maximum (ethanol): 572 nm Synthesis Example 21

One part of compound (728) and 0.9 parts of 4-(dimethylamino)cinnamaldehyde were mixed in 20 parts of ethanol. The reaction was carried out under reflux for 2 hours. The solid obtained after cooling was filtered and washed. This material was then dissolved in 30 parts of ethanol and 3 parts of 55% hydroiodic acid aqueous solution were added thereto. The solution was allowed to stand for one hour. The resulting predipitate was filtered, washed, dried, then recrystallized from ethanol and consecutively filtered, washed and dried to give 1.1 parts of compound (333).
Absorption maximum (ethanol): 639 nm
Luminescence maximum (ethanol): 703 nm
¹H-NMR (ppm:d6-DMSO):1.75 (s, C(CH3)2, 6H), 3.12 (S,N(CH3)2,6H), 3.87 (S, N—CH3,3H), 6.86 (d, arom, 2H), 6.93 (d,═CH—, 1H), 7.31 (dd,═CH—, 1H), 7.62 (d, arom, 2H), 7.79 (d, arom, 1H), 7.84 (d,═CH—, 1H), 8.12 (d, arom, 1H), 8.10 (s, arom, 1H), 8.39 (dd, ═CH—, 1H)

Synthesis Example 22

One part of compound (728) and 0.8 parts of 4-(diphenylamino) cinnamaldehyde were mixed in 20 parts of ethanol. The reaction was carried out under reflux for 2 hours. The solid obtained after cooling was filtered and washed. This material was then dissolved in 30 parts of ethanol and 3 parts of 55% hydroiodic acid aqueous solution were added thereto. The solution was allowed to stand for one hour. The resulting precipitate was filtered, washed, dried, then recrystallized from ethanol and consecutively filtered, washed and dried to give 1.0 part of compound (331).
Absorption maximum (ethanol): 610 nm
Luminescence maximum (ethanol): 727 nm Synthesis Example 23

One part of compound (728) and 0.6 parts of 4-(diethylamino) salicylaldehyde were mixed in 15 parts of ethanol. The reaction was carried out under reflux for 2 hours. The solid obtained after cooling was filtered and washed. This material was then dissolved in 30 g of ethanol and 3 parts of 55% hydroiodic acid aqueous solution were added thereto. The solution was allowed to stand for one hour. The resulting precipitate was filtered, washed, dried, then recrystallized from ethanol and consecutively filtered, washed and dried to give 1.1 parts of compound (312).
Absorption maximum (ethanol): 562 nm
1H-NMR (ppm:d6-DMSO): 1.18 (t, CH3, 6H), 1.72 (s, C(CH3) 2, 6H), 3.53 (q,N—CH2—,4H), 3.81 (S, N—CH3, 3H), 6.23 (S, arom, 1H), 6.58 (d, arom, 1H), 7.15 (d,═CH—, 1H), 7.66 (d, arom, 1H), 8.02 (d, arom, 1H), 8.08 (d, arom, 1H), 8.24 (s, arom, 1H), 8.46 (d, ═CH—, 1H)

Synthesis Example 24

Two parts of compound (728) and one part of 4-molpholinobenzaldehyde were mixed in 20 parts of ethanol. The reaction was carried out under reflux for 2 hours. The solid obtained after cooling was filtered and washed. This material was then dissolved in 30 parts of ethanol and 3 parts of 55% hydroiodic acid aqueous solution were added thereto. The solution was allowed to stand for one hour. The resulting precipitate was filtered, washed, dried, then recrystallized from ethanol and consecutively filtered, washed and dried to give 0.9 parts of compound (363).
Absorption maximum (ethanol): 552 nm
Luminescence maximum (ethanol): 606 nm Synthesis Example 25

One part of compound (728) and one part of 2,4,6-trimethoxybenzaldehyde were mixed in 20 parts of ethanol. The reaction was carried out under reflux for 2 hours. The solid obtained after cooling was filtered and washed. This material was then dissolved in 30 parts of ethanol and 3 parts of 55% hydroiodic acid aqueous solution were added thereto. The solution was allowed to stand for one hour. The resulting precipitate was filtered, washed, dried, then recrystallized from ethanol and consecutively filtered, washed and dried to give 1.3 parts of compound (362).
Absorption maximum (ethanol): 472 nm
Luminescence maximum (ethanol): 526 nm Synthesis Example 26

One part of compound (728) and one part of 9-formyl-8-hydroxy-1,1,7,7-tetramethyljulolidine were mixed in 10 parts of acetic anhydride. The reaction was carried out under reflux for 2 hours. The solid obtained after cooling was filtered and washed. This material was then dissolved in 30 g of ethanol and 3 parts of 55% hydroiodic acid aqueous solution were added thereto. The solution was allowed to stand for one hour. The resulting precipitate was filtered, washed, dried, then recrystallized from ethanol and consecutively filtered, washed and dried to give 1.1 parts of compound (357).
Absorption maximum (ethanol): 592 nm Synthesis Example 27

Compound (728) (3.6 parts) and 2 parts of 4-(dimethylamino) naphthaldehyde were mixed in 30 parts of ethanol. The reaction was carried out under reflux for 2 hours. The solid obtained after cooling was filtered and washed. This material was then dissolved in 50 parts of ethanol and 5 parts of 55% hydroiodic acid aqueous solution were added thereto. The solution was allowed to stand for one hour. The resulting precipitate was filtered, washed, dried, then recrystallized from ethanol and consecutively filtered, washed and dried to give 3.5 parts of compound (364).
Absorption maximum (ethanol): 621 nm Synthesis Example 28

One part of the following compound (729) and 0.9 parts of 4-(dimethylamino)benzaldehyde were mixed in 10 parts of ethanol and 0.1 parts of piperazine anhydride were added thereto. The reaction was carried out under reflux for 2 hours. The solid obtained after cooling was filtered, washed, dried, then recrystallized from ethanol and consecutively filtered, washed and dried to give 0.8 parts of compound (371).
Absorption maximum (ethanol): 537 nm

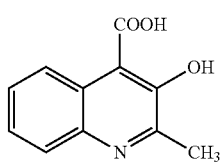

(729)

Synthesis Example 29

One part of compound (729) and 1.5 parts of 4-(diphenylamino)benzaldehyde were mixed in 15 parts of ethanol and 0.1 parts of piperazine anhydride were added thereto. The reaction was carried out under reflux for 4 hours. The solid obtained after cooling was filtered, washed, dried, then recrystallized from ethanol and consecutively filtered, washed and dried to give 1.1 parts of a compound (373).
Absorption maximum (ethanol): 531 nm Synthesis Example 30

5-formylsalicyl acid (1.7 parts) and 3.5 parts of methylsulfuric acid=1,2,3,3-tetramethylindolenium methylsulfate were mixed in 15 parts of ethanol. The reaction was carried out under reflux for 2 hours. The solid obtained after cooling was filtered and washed. This material was then dissolved in 30 parts of ethanol and 5 parts of 55% hydroiodic acid aqueous solution were added thereto. The solution was allowed to stand for one hour. The resulting precipitate was filtered, washed, dried, then recrystallized from ethanol and consecutively filtered, washed and dried to give 3.8 parts of compound (402).
Absorption maximum (ethanol): 450 nm Synthesis Example 31

5-formylsalicyl acid (1.7 parts) and 3.5 parts of 1,2,3,3-tetramethyl-5-carboxylndoleniummethylsulfate were mixed in 15 parts of ethanol. The reaction was carried out under reflux for 2 hours. The solid obtained after cooling was filtered and washed. This material was then dissolved in 30 parts of ethanol and 5 parts of 55% hydroiodic acid aqueous solution were added thereto. The solution was allowed to stand for one hour. The resulting precipitate was filtered, washed, dried, then recrystallized from ethanol and consecutively filtered, washed and dried to give 3.8 parts of compound (406).
Absorption maximum (ethanol): 446 nm Synthesis Example 32

5-formylsalicyl acid (2.5 parts) and 7 parts of 6-chloro-2,3-dimethylbenzothiazole methylsulfate were mixed in 50 parts of ethanol and one part of piperazine anhydride was added thereto. The reaction was carried out under reflux for 2 hours. The solid obtained after cooling was filtered, washed, dried, then recrystallized from ethanol and consecutively filtered, washed and dried to give 1.5 parts of compound (408).
Absorption maximum (ethanol): 441 nm Synthesis Example 33

5-formylsalicyl acid (0.5 parts) and one part of quinaldine etiodide were added in 10 parts of ethanol. The reaction was carried out under reflux for 2 hours. The solid obtained after cooling was filtered, washed, dried, then reprecipitated and recrystallized from ethanol, consecutively filtered, washed and dried to give 0.4 parts of compound (411).
Absorption maximum (ethanol): 434 nm Synthesis Example 34

5-formylsalicyl acid (1.7 parts) and one part of 1,4-dimethylpyridiniumiodide were mixed in 15 parts of ethanol. The reaction was carried out under reflux for 2 hours. The solid obtained after cooling was filtered, washed and dried to give 1.9 parts of compound (451).
Absorption maximum (ethanol): 433 nm Synthesis Example 35

Two parts of 5-formylsalicyl acid and 2.2 parts of 2-methylbenzothiazole were added in 50 parts of ethanol and one part of piperazine anhydride was added thereto. The reaction was carried out under reflux for 2 hours. The solid obtained after cooling was filtered, washed, dried, then reprecipitated and recrystallized from ethanol, consecutively filtered, washed and dried to give 3 parts of compound (458).
Absorption maximum (ethanol): 297 nm Synthesis Example 36

Three parts of 5-formylsalicyl acid and 1.5 parts of malononitrile were added in 70 parts of ethanol and one part of piperazine anhydride was added thereto. The reaction was carried out under reflux for 2 hours. The solid obtained after cooling was filtered, washed, dried, then reprecipitated and recrystallized from ethanol, consecutively filtered, washed and dried to give 2.5 parts of compound (476).
Absorption maximum (ethanol): 416 nm Synthesis Example 37

3,4-dihydroxybenzaldehyde(1.4 parts) and 3.6 parts of compound (728) were mixed in 30 parts of ethanol. The reaction was carried out under reflux for 2 hours. The solid obtained after cooling was filtered and washed. This material was then dissolved in 30 parts of ethanol and 5 parts of 55% hydroiodic acid aqueous solution were added thereto. The solution was allowed to stand for one hour. The resulting precipitate was filtered, washed, dried, then recrystallized from ethanol and consecutively filtered, washed and dried to give 4.3 parts of compound (431).
Absorption maximum (ethanol): 490 nm Synthesis Example 38

3,4-dihydroxybenzaldehyde (1.5 parts) and 3 parts of 1-ethyl-2,3,3-trimethylindoleniumiodide were dissolved in 50 parts of ethanol and 0.1 parts of piperazine anhydride was added thereto. The mixture was refluxed for 1 hour. The obtained solid after cooling was filtered, washed, dried and then recrystallized from ethanol, consecutively filtered, washed and dried to give 3.9 parts of a compound (497).
Absorption maximum (methanol): 468 nm Synthesis Example 39

3,4-dihydroxybenzaldehyde (1.5 parts) and 4 parts of 1,2-dimethylbenzthiazoliumiodide were dissolved in 50 parts of ethanol and 0.1 parts of piperazine anhydride was added thereto. The reaction was carried out under reflux for one hour. The solid obtained after cooling was filtered, washed, dried, then recrystallized from ethanol and consecutively filtered, washed and dried to give 4.5 parts of compound (484).
Absorption maximum (methanol): 450 nm Synthesis Example 40

3,4-dihydroxybenzaldehyde (1.5 parts) and 2.8 parts of 1,4-dimethylpyridiniumiodide were dissolved in 50 parts of ethanol and 0.1 parts of piperazine anhydride was added thereto. The reaction was carried out under reflux for one hour. The solid obtained after cooling was filtered, washed, dried, then recrystallized from ethanol and consecutively filtered, washed and dried to give 3.8 parts of compound (523).
Absorption maximum (methanol): 417 nm Synthesis Example 41

Three parts of 5-formylsalicyl acid and 3.5 parts of 3-ethylrhodanine were dissolved in 100 parts of ethanol and one part of piperazine anhydride was added thereto. The reaction was carried out under reflux for one hour. The solid obtained after cooling was filtered, washed, dried, then recrystallized from ethanol and consecutively filtered, washed and dried to give 2.5 parts of compound (526).
Absorption maximum (methanol): 452 nm Synthesis Example 42

Five parts of 5-formylsalicyl acid and 6.5 parts of thiobarbituric acid were added in 100 parts of ethanol. The reaction was carried out under reflux for 2 hours. The obtained solid after cooling was filtered, washed, dried, then repeatedly recrystallized from ethanol and consecutively filtered, washed and dried to give 5.4 parts of compound (580).
Absorption maximum (methanol): 398 nm Synthesis Example 43

One part of 5-formylsalicyl acid and 1.5 parts of 1,3-dimethylbarbituric acid were added in 100 parts of ethanol. The reaction was carried out under reflux for 2 hours. The solid obtained after cooling was filtered, washed, dried, then repeatedly recrystallized from ethanol and consecutively filtered, washed and dried to give 1.4 parts of compound (581).
Absorption maximum (methanol): 444 nm Synthesis Example 44

5-formylsalicyl acid (1.7 parts) and 3 parts of 1,3-diphenylthiobarbituric acid were dissolved in 20 parts of ethanol and one part of piperazine anhydride was added thereto. The reaction was carried out under reflux for 2 hours. The solid obtained after cooling was filtered, washed and dried to give 3.5 parts of compound (587).
Absorption maximum (ethanol): 450 nm Synthesis Example 45

5-formylsalicyl acid (1.7 parts) and 2.6 parts of the following compound (730) were mixed in 25 parts of ethanol. The reaction was carried out under reflux for 2 hours. The solid obtained after cooling was filtered, washed and dried to give 3.8 parts of compound (662).
Absorption maximum (ethanol): 422 nm

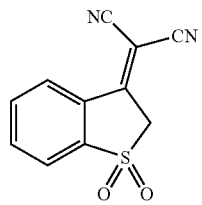

(730)

Synthesis Example 46

3,4-dihydroxybenzaldehyde (6.8 parts) and 5 parts of 1,3-dimethylbarbituric acid were dissolved in 100 parts of ethanol and one part of piperazine anhydride was added thereto. The reaction was carried out under reflux for one hour. The solid obtained after cooling was filtered, washed, dried, then recrystallized from ethanol and consecutively filtered, washed and dried to give 10.5 parts of compound (601).
Absorption maximum (methanol): 404 nm Synthesis Example 47

3,4-dihydroxybenzaldehyde (1.4 parts) and 2.6 parts of compound (730) were mixed in 15 parts of ethanol. The reaction was carried out under reflux for 2 hours. The solid obtained after cooling was filtered, washed and dried to give 1.1 parts of compound (675).
Absorption maximum (ethanol): 496 nm

Synthesis Example 48

2,3-dihydroxybenzaldehyde (6.8 parts) and 5 parts of 1,3-dimethylbarbituric acid were dissolved in 100 parts of ethanol and one part of piperazine anhydride was added thereto. The reaction was carried out under reflux for one hour. The solid obtained after cooling was filtered, washed, dried, then recrystallized from ethanol and consecutively filtered, washed and dried to give 10.1 parts of compound (723). Absorption maximum (methanol): 363 nm

Synthesis Example 49

2,4-dihydroxybenzaldehyde (6.8 parts) and 5 parts of 1,3-dimethylbarbituric acid were dissolved in 100 parts of ethanol and one part of piperazine anhydride was added thereto. The reaction was carried out under reflux for one hour. The solid obtained after cooling was filtered, washed, dried, then recrystallized from ethanol and consecutively filtered, washed and dried to give 9.8 parts of compound (722). Absorption maximum (methanol): 417 nm

Synthesis Example 50

2,4-dihydroxybenzaldehyde (1.4 parts) and 2 parts of rhodanin-3-acetic acid were dissolved in 100 parts of ethanol and one part of piperazine anhydride was added thereto. The reaction was carried out under reflux for one hour. The solid obtained after cooling was filtered, washed, dried, then recrystallized from ethanol and consecutively filtered, washed and dried to give 2.6 parts of compound (727). Absorption maximum (methanol): 425 nm

EXAMPLE

A dye was dissolved in ethanol in a concentration of $3 \times 10^{-4}$ M. In the resultant solutions, a porous substrate (semiconductor thin film electrode prepared by the steps of: dispersing titanium dioxide P-25 available from Nippon Aerosil Co., Ltd. in an aqueous solution of nitric acid, applying the thus-dispersed titanium dioxide on a transparent electrically conductive glass electrode in a thickness of 50 μm; and sintering the resultant electrode at 450° C. for 30 minutes) was immersed overnight at room temperature to adsorbed the dye thereon, washed with a solvent and dried to obtain a photoelectric conversion device of a dye-sensitized semiconductor thin film.

In Examples 1, 3, 9, 10, 29, 30, 34, 35, 38, 39, 40, 44, 49, 52, 54, 56, 57, 59, 60, 67, 69, 70, 71, 75, 79, 82 and 83, one type of dye shown in Table 11 was used and adjusted to give the above-mentioned concentration, whereupon a photoelectric conversion device adsorbing the one type of dye was obtained by the above method.

In Examples 7, 32, 45, 58, 74 and 84, the solutions were prepared by adjusting for two types of dyes as shown in Table 11 to give a concentration of $1.5 \times 10^{-4}$ M respectively, whereupon a photoelectric conversion device adsorbing the two types of dyes was obtained by the above method.

In Examples 2, 5, 6, 12, 16-28, 37, 41, 42, 43, 47, 50, 53, 62, 64, 65, 72, 77, 80 and 81, one type of dye as shown in Table 11 was used and adjusted to give the above-mentioned concentration, whereupon a photoelectric conversion device adsorbing the one type of dye was obtained by the following method. Using the above-mentioned porous substrate, a 0.2 M aqueous solution of titanium tetrachloride was dropped onto an area of thin film of titanium oxide of the semiconductor thin film electrode, allowed to stand at room temperature for 24 hours, then washed with water and sintered at 450° C. again for 30 minutes to give a semiconductor thin film electrode treated with titanium tetrachloride. The dye was adsorbed thereon in the same manner as above using the resulting semiconductor thin film electrode.

In Example 4, 11, 13, 31, 48, 51, 55, 61, 63, 68, 73, 76 and 78, one type of dye as shown in Table 11 was used and the above mentioned dye solution was prepared by adding cholic acid during adsorption procedure as an inclusion compound to give a concentration of $3 \times 10^{-2}$ M, then thus prepared dye solution was adsorbed on the semiconductor thin film to give a cholic acid-treated dye-sensitized semiconductor thin film.

In Example 36, one type of dye as shown in Table 11 was used and the above mentioned dye solution was prepared by adding cholic acid during adsorption procedure as an inclusion compound to give a concentration of $3 \times 10^{-2}$ M, then thus prepared dye solution was adsorbed on the semiconductor thin film treated with titanium tetrachloride to give a titanium tetrachloride- and cholic acid-treated dye-sensitized semiconductor thin film.

In Examples 8, 14, 15, 33, 46 and 66, the solutions were prepared by adjusting for two types of dye as shown in Table 11 to give a concentration of $1.5 \times 10^{-4}$ M respectively, and said two types of dye were adsorbed on the above mentioned semiconductor thin film treated with titanium tetrachloride to give a titanium tetrachloride-treated dye-sensitized semiconductor thin film.

Measurement of short-circuit current, open circuit voltage and conversion efficiency was carried out as follows.

The electrically conductive glass sheets of which surface was sputtered with platinum were fixed such that the above-prepared dye-sensitizing semiconductor thin film was interposed, then a solution containing an electrolyte (electrolyte solution) was poured into the gap. Two types of electrolyte solutions were prepared.

In Example 7, 9, 14, 29, 32, 45, 58, 59, 66, 74, 75-78, 83 and 84, an electrolyte solution A was used, which has been prepared by dissolving iodine, lithium iodide, 1,2-dimethyl-3-n-propyl imidazolium iodide, t-butyl pyridine in 3-methoxypropionitrile to give the concentrations of 0.1 M, 0.1 M, 0.6 M and 1 M, respectively.

In Example 1-6,8,10-13, 15-28, 30, 31, 33-44, 46-57, 59, 60-65, 67-73, 79-81 and 82, an electrolyte solution B was used, which has been prepared by dissolving iodine and tetra-n-propyl ammonium iodide in a solution of ethylene carbonate and acetonitrile (6:4) to give the concentrations of 0.02 M and 0.5 M respectively.

A size of a cell used for measurements was set such that an execution part thereof was 0.25 cm². A light source was set to be 100 mW/cm² through an AM 1.5 filter using a 500 W xenon lamp. Short circuit current, open circuit voltage and conversion efficiency were measured by using a potentiogalvanostat.

Comparative Examples

In Comparative Examples 1, the following Ru complex dyes (731) were used respectively in the same manner as the above Example 1 whereupon photoelectric conversion devices were prepared. In Comparative Examples 2, the following methine type dyes (732) were used respectively in the same manner as the above Example 2 whereupon photoelectric conversion devices were prepared.

TABLE 11

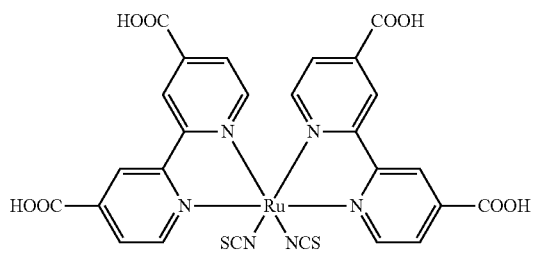

(731)

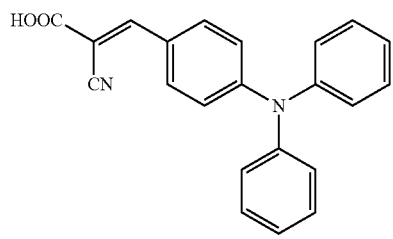

(732)

| Example | Compound No. | Short circuit current (mA/cm2) | Open circuit voltage (V) | Conversion efficiency (%) | TiCl4 treatment of thin film | Cholic acid treatment | Electrolytic solution |
|---|---|---|---|---|---|---|---|
| 1 | 1 | 6.7 | 0.64 | 2.5 | Untreated | Untreated | B |
| 2 | 1 | 7.0 | 0.70 | 2.8 | Treated | Untreated | B |
| 3 | 35 | 7.5 | 0.55 | 2.0 | Untreated | Untreated | B |
| 4 | 35 | 6.4 | 0.57 | 2.0 | Untreated | Treated | B |
| 5 | 35 | 6.3 | 0.57 | 1.9 | Treated | Untreated | B |
| 6 | 36 | 5.7 | 0.49 | 1.2 | Treated | Untreated | B |
| 7 | 1 + 731 | 14.0 | 0.70 | 5.1 | Untreated | Untreated | A |
| 8 | 35 + 732 | 7.7 | 0.57 | 2.2 | Treated | Untreated | B |
| 9 | 100 | 0.48 | 0.55 | 0.2 | Untreated | Untreated | A |
| 10 | 100 | 1.78 | 0.53 | 0.7 | Untreated | Untreated | B |
| 11 | 100 | 1.89 | 0.53 | 0.7 | Untreated | Treated | B |
| 12 | 100 | 2.05 | 0.55 | 0.8 | Treated | Untreated | B |
| 13 | 103 | 0.65 | 0.43 | 0.3 | Untreated | Treated | B |
| 14 | 100 + 731 | 10.8 | 0.63 | 4.8 | Treated | Untreated | A |
| 15 | 100 + 732 | 7.3 | 0.61 | 2.2 | Treated | Untreated | B |
| 16 | 199 | 8.1 | 0.56 | 2.5 | Treated | Untreated | B |
| 17 | 200 | 8.9 | 0.55 | 2.5 | Treated | Untreated | B |
| 18 | 207 | 8.0 | 0.53 | 2.1 | Treated | Untreated | B |
| 19 | 210 | 8.3 | 0.50 | 1.7 | Treated | Untreated | B |
| 20 | 213 | 1.8 | 0.47 | 0.5 | Treated | Untreated | B |
| 21 | 225 | 8.1 | 0.51 | 2.1 | Treated | Untreated | B |
| 22 | 234 | 2.8 | 0.41 | 0.7 | Treated | Untreated | B |
| 23 | 257 | 8.5 | 0.49 | 2.0 | Treated | Untreated | B |
| 24 | 260 | 4.8 | 0.53 | 1.4 | Treated | Untreated | B |
| 25 | 268 | 2.5 | 0.57 | 0.9 | Treated | Untreated | B |
| 26 | 270 | 6.9 | 0.52 | 1.9 | Treated | Untreated | B |
| 27 | 274 | 4.6 | 0.50 | 1.3 | Treated | Untreated | B |
| 28 | 203 | 9.9 | 0.53 | 2.3 | Treated | Untreated | B |
| 29 | 199 | 3.4 | 0.55 | 0.6 | Untreated | Untreated | A |
| 30 | 199 | 7.4 | 0.55 | 2.3 | Untreated | Untreated | B |
| 31 | 199 | 5.1 | 0.53 | 1.3 | Treated | Untreated | B |
| 32 | 199 + 731 | 11.9 | 0.69 | 4.7 | Untreated | Untreated | A |
| 33 | 199 + 732 | 5.4 | 0.57 | 1.8 | Treated | Untreated | B |
| 34 | 295 | 6.9 | 0.49 | 1.7 | Untreated | Untreated | B |
| 35 | 312 | 10.8 | 0.54 | 2.5 | Untreated | Untreated | B |
| 36 | 331 | 6.2 | 0.38 | 1.3 | Treated | Treated | B |
| 37 | 333 | 5.8 | 0.44 | 1.4 | Treated | Untreated | B |
| 38 | 296 | 8.4 | 0.46 | 1.8 | Untreated | Untreated | B |
| 39 | 363 | 7.6 | 0.40 | 1.5 | Untreated | Untreated | B |
| 40 | 357 | 9.0 | 0.43 | 2.1 | Untreated | Untreated | B |
| 41 | 362 | 5.0 | 0.41 | 1.0 | Treated | Untreated | B |
| 42 | 364 | 3.1 | 0.34 | 0.5 | Treated | Untreated | B |
| 43 | 371 | 5.2 | 0.47 | 1.3 | Treated | Untreated | B |
| 44 | 373 | 8.3 | 0.33 | 1.6 | Untreated | Untreated | B |

TABLE 11-continued

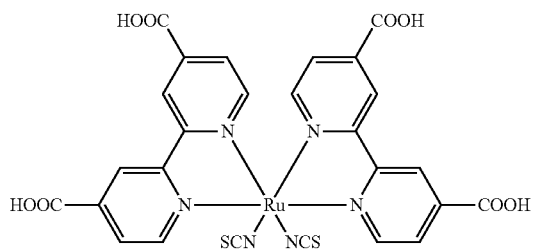

(731)

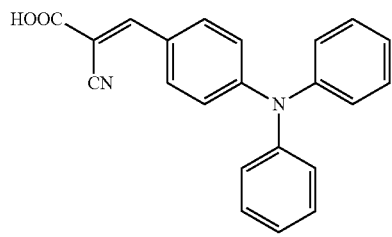

(732)

| Example | Compound No. | Short circuit current (mA/cm2) | Open circuit voltage (V) | Conversion efficiency (%) | TiCl4 treatment of thin film | Cholic acid treatment | Electrolytic solution |
|---|---|---|---|---|---|---|---|
| 45 | 333 + 731 | 11.2 | 0.71 | 4.7 | Untreated | Untreated | A |
| 46 | 333 + 732 | 5.6 | 0.56 | 2.4 | Treated | Untreated | B |
| 47 | 402 | 5.6 | 0.48 | 1.6 | Treated | Untreated | B |
| 48 | 406 | 4.9 | 0.40 | 1.1 | Untreated | Treated | B |
| 49 | 408 | 6.1 | 0.42 | 1.4 | Untreated | Untreated | B |
| 50 | 408 | 6.1 | 0.43 | 1.5 | Treated | Untreated | B |
| 51 | 408 | 6.3 | 0.44 | 1.6 | Untreated | Treated | B |
| 52 | 409 | 6.9 | 0.47 | 1.6 | Untreated | Untreated | B |
| 53 | 409 | 6.6 | 0.49 | 1.9 | Treated | Untreated | B |
| 54 | 411 | 8.4 | 0.50 | 2.4 | Untreated | Untreated | B |
| 55 | 451 | 6.2 | 0.49 | 1.7 | Untreated | Treated | B |
| 56 | 458 | 2.5 | 0.52 | 0.8 | Untreated | Untreated | B |
| 57 | 476 | 4.0 | 0.60 | 1.5 | Untreated | Untreated | B |
| 58 | 458 + 731 | 11.6 | 0.70 | 4.8 | Untreated | Untreated | A |
| 59 | 497 | 4.8 | 0.54 | 1.7 | Untreated | Untreated | A |
| 60 | 497 | 12.3 | 0.49 | 3.1 | Untreated | Untreated | B |
| 61 | 497 | 10.5 | 0.51 | 2.7 | Untreated | Treated | B |
| 62 | 497 | 11.3 | 0.53 | 2.8 | Treated | Untreated | B |
| 63 | 431 | 9.3 | 0.44 | 1.9 | Untreated | Treated | B |
| 64 | 484 | 6.4 | 0.45 | 1.6 | Treated | Untreated | B |
| 65 | 523 | 2.2 | 0.49 | 0.7 | Treated | Untreated | B |
| 66 | 497 + 731 | 10.5 | 0.64 | 4.7 | Treated | Untreated | A |
| 67 | 526 | 6.4 | 0.64 | 2.4 | Untreated | Untreated | B |
| 68 | 526 | 6.4 | 0.67 | 2.5 | Untreated | Treated | B |
| 69 | 579 | 4.4 | 0.59 | 1.7 | Untreated | Untreated | B |
| 70 | 580 | 4.0 | 0.57 | 1.5 | Untreated | Untreated | B |
| 71 | 581 | 7.3 | 0.54 | 2.3 | Untreated | Untreated | B |
| 72 | 581 | 8.8 | 0.56 | 2.9 | Treated | Untreated | B |
| 73 | 587 | 5.9 | 0.48 | 1.5 | Untreated | Treated | B |
| 74 | 579 + 731 | 11.8 | 0.71 | 5.0 | Untreated | Untreated | A |
| 75 | 601 | 5.4 | 0.56 | 1.7 | Untreated | Untreated | A |
| 76 | 601 | 5.4 | 0.58 | 1.9 | Untreated | Treated | A |
| 77 | 601 | 4.8 | 0.60 | 1.6 | Treated | Untreated | A |
| 78 | 601 | 5.4 | 0.59 | 1.8 | Treated | Treated | A |
| 79 | 675 | 7.0 | 0.36 | 1.2 | Untreated | Untreated | B |
| 80 | 722 | 1.8 | 0.59 | 0.6 | Treated | Untreated | B |
| 81 | 723 | 4.7 | 0.51 | 1.2 | Treated | Untreated | B |
| 82 | 727 | 6.8 | 0.37 | 1.1 | Untreated | Untreated | B |
| 83 | 548 | 5.2 | 0.55 | 1.6 | Untreated | Untreated | A |
| 84 | 601 + 731 | 10.8 | 0.72 | 4.6 | Untreated | Untreated | A |

Comparative Example

| 1 | 731 | 11.0 | 0.71 | 4.5 | Untreated | Untreated | A |
| 2 | 732 | 5.2 | 0.57 | 1.6 | Treated | Untreated | B |

Industrial Applicability

In a dye-sensitized photoelectric conversion device according to the present invention, a solar cell having high conversion efficiency as well as high stability has come to be provided by using a methine type dye having the specific partial structure. Further, by using the oxide semiconductor fine particles sensitized with two types of dye, the improvement in the conversion efficiency has been achieved.

The invention claimed is:

1. A photoelectric conversion device comprising an oxide semiconductor fine material sensitized with a methine dye represented by the following formula (16):

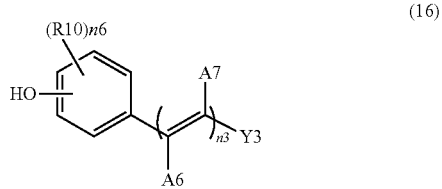

(16)

wherein,

A6 and A7 independently represents an optionally substituted aliphatic hydrocarbon residue, an optionally substituted aromatic hydrocarbon residue, an optionally substituted heterocyclic residue, an optionally substituted amino group, a hydroxyl group, an alkoxyl group, a hydrogen atom, a halogen atom, a cyano group, an alkoxycarbonyl group or an acyl group;

when n3 is 2 or more and A6 and A7 are present in plural, each of which may independently be the same or different;

A6 and A7, present in plural in the same molecular, may be bonded to form an optionally substituted ring;

Y3 represents a cyano group, an optionally substituted aromatic hydrocarbon residue, an optionally substituted heterocyclic residue or an optionally substituted organic metal complex residue;

R10 represents a carboxyl group or hydroxyl group and when R10 is present in plural, each of which may be the same or different;

n3 indicates an integer from 1 to 4; and n6 indicates an integer from 1 to 3.

2. The photoelectric conversion device according to claim 1, wherein the dye is represented by the following formula (17):

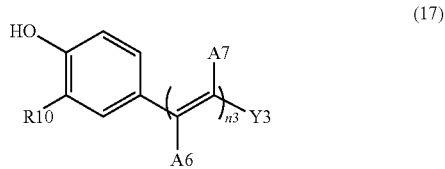

(17)

wherein,

A6, A7, n3, Y3 and R10 represent the same as mentioned for the general formula (16).

3. The photoelectric conversion device according to claim 1 or 2, wherein Y3 represents an optionally substituted heterocyclic residue.

4. The photoelectric conversion device according to claim 1 or 2, wherein n3 represents an integer from 1 to 3.

5. The photoelectric conversion device according to claim 3, wherein n3 represents an integer from 1 to 3.

6. The photoelectric conversion device according to claim 1 comprising oxide semiconductor fine materials sensitized with a combination of:

(i) at least one of the methine type dye represented by the formula (16); and (ii) at least one of the dyes selected from the group consisting of the organic dye and metal complex dye except for those represented by the formula (16).

7. The photoelectric conversion device according to any one of claims 1 or 6, wherein the oxide semiconductor fine materials comprise a titanium dioxide as an essential component.

8. The photoelectric conversion device according to any one of claims 1 or 6, wherein the dye is adsorbed on the oxide semiconductor fine materials in the presence of an inclusion compound.

9. A solar cell characterized by using the photoelectric conversion device according to claim 1 or 6.

10. An oxide semiconductor fine material sensitized by the methine-type dye represented by the general formula (16) according to claim 1.

11. The photoelectric conversion device according to claim 1 or 6 obtained by adsorbing the dye on the thin film of the oxide semiconductor fine materials.

* * * * *